US011233105B2

(12) United States Patent
Yamazaki

(10) Patent No.: US 11,233,105 B2
(45) Date of Patent: Jan. 25, 2022

(54) DISPLAY DEVICE, ELECTRONIC APPARATUS, AND METHOD OF FABRICATING THE DISPLAY DEVICE

(71) Applicant: SEMICONDUCTOR ENERGY LABORATORY CO., LTD., Atsugi (JP)

(72) Inventor: Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/182,880

(22) Filed: Feb. 23, 2021

(65) Prior Publication Data

US 2021/0257425 A1    Aug. 19, 2021

Related U.S. Application Data

(60) Continuation of application No. 16/556,310, filed on Aug. 30, 2019, now Pat. No. 10,937,847, which is a (Continued)

(30) Foreign Application Priority Data

Sep. 29, 2004    (JP) .............................. 2004-284940

(51) Int. Cl.
*H01L 27/32*    (2006.01)
*H01L 51/56*    (2006.01)
(Continued)

(52) U.S. Cl.
CPC ........ *H01L 27/3248* (2013.01); *H01L 27/153* (2013.01); *H01L 27/322* (2013.01);
(Continued)

(58) Field of Classification Search
CPC . H01L 27/3248; H01L 27/153; H01L 27/322; H01L 27/3246; H01L 27/3258;
(Continued)

(56) References Cited

U.S. PATENT DOCUMENTS 4,653,864 A    3/1987 Baron et al.
4,678,282 A    7/1987 Yaniv et al.
(Continued)

FOREIGN PATENT DOCUMENTS

CN    001419197 A    5/2003
CN    001468039 A    1/2004
(Continued)

OTHER PUBLICATIONS

Chinese Office Action (Application No. 201210385676.8) dated Dec. 3, 2014.

*Primary Examiner* — Anne M Hines
(74) *Attorney, Agent, or Firm* — Nixon Peabody LLP; Jeffrey L. Costellia

(57) ABSTRACT

It is an object of the invention to provide a technique to manufacture a display device with high image quality and high reliability at low cost with high yield. The invention has spacers over a pixel electrode layer in a pixel region and over an insulating layer functioning as a partition which covers the periphery of the pixel electrode layer. When forming a light emitting material over a pixel electrode layer, a mask for selective formation is supported by the spacers, thereby preventing the mask from contacting the pixel electrode layer due to a twist and deflection thereof. Accordingly, such damage as a crack by the mask does not occur in the pixel electrode layer. Thus, the pixel electrode layer does not have a defect in shapes, thereby a display device which performs a high resolution display with high reliability can be manufactured.

15 Claims, 35 Drawing Sheets

Related U.S. Application Data continuation of application No. 16/042,120, filed on Jul. 23, 2018, now Pat. No. 10,403,697, which is a continuation of application No. 15/883,354, filed on Jan. 30, 2018, now Pat. No. 10,038,040, which is a continuation of application No. 15/386,938, filed on Dec. 21, 2016, now Pat. No. 9,893,130, which is a continuation of application No. 14/854,857, filed on Sep. 15, 2015, now Pat. No. 9,530,829, which is a continuation of application No. 14/307,768, filed on Jun. 18, 2014, now Pat. No. 9,147,713, which is a continuation of application No. 13/559,634, filed on Jul. 27, 2012, now Pat. No. 8,786,178, which is a continuation of application No. 12/699,942, filed on Feb. 4, 2010, now Pat. No. 8,237,355, which is a division of application No. 11/224,960, filed on Sep. 14, 2005, now Pat. No. 7,753,751.

(51) Int. Cl.
*H01L 27/15* (2006.01)
*H01L 51/00* (2006.01)
*H01L 27/12* (2006.01)
*H01L 29/786* (2006.01)

(52) U.S. Cl.
CPC ...... *H01L 27/3246* (2013.01); *H01L 27/3258* (2013.01); *H01L 27/3262* (2013.01); *H01L 51/001* (2013.01); *H01L 51/0011* (2013.01); *H01L 51/0097* (2013.01); *H01L 51/56* (2013.01); *H01L 27/1222* (2013.01); *H01L 27/1277* (2013.01); *H01L 27/1288* (2013.01); *H01L 29/78675* (2013.01); *H01L 2227/323* (2013.01); *H01L 2251/5338* (2013.01)

(58) Field of Classification Search
CPC ............ H01L 27/3262; H01L 27/1222; H01L 27/1277; H01L 27/1288; H01L 51/001; H01L 51/0011; H01L 51/0097; H01L 51/56; H01L 29/78675; H01L 2227/323; H01L 2251/5338
See application file for complete search history.

(56) References Cited

U.S. PATENT DOCUMENTS

| | | | |
|---|---|---|---|
| 4,759,610 A | 7/1988 | Yanagisawa | |
| 5,119,156 A | 6/1992 | Kawahara et al. | |
| 6,067,134 A | 5/2000 | Akiyama | |
| 6,175,345 B1 | 1/2001 | Kuribayashi et al. | |
| 6,369,495 B2 | 4/2002 | Codama et al. | |
| 6,373,453 B1 | 4/2002 | Yudasaka | |
| 6,392,722 B1 | 5/2002 | Sekime et al. | |
| 6,420,834 B2 | 7/2002 | Yamazaki et al. | |
| 6,465,266 B1 | 10/2002 | Hirakata et al. | |
| 6,469,439 B2 | 10/2002 | Himeshima et al. | |
| 6,555,968 B2 | 4/2003 | Yamazaki et al. | |
| 6,559,594 B2 | 5/2003 | Fukunaga et al. | |
| 6,592,933 B2 | 7/2003 | Himeshima et al. | |
| 6,597,121 B2 | 7/2003 | Imura | |
| 6,614,174 B1 | 9/2003 | Urabe et al. | |
| 6,618,029 B1 | 9/2003 | Ozawa | |
| 6,638,781 B1 | 10/2003 | Hirakata et al. | |
| 6,720,198 B2 | 4/2004 | Yamagata et al. | |
| 6,739,931 B2 | 5/2004 | Yamazaki et al. | |
| 6,743,650 B2 | 6/2004 | Hirakata et al. | |
| 6,750,618 B2 | 6/2004 | Yamazaki et al. | |
| 6,760,004 B2 | 7/2004 | Koyama | |
| 6,768,257 B1 | 7/2004 | Yamada et al. | |
| 6,781,162 B2 | 8/2004 | Yamazaki et al. | |
| 6,787,407 B2 | 9/2004 | Nakamura et al. | |
| 6,798,132 B2 | 9/2004 | Satake | |
| 6,815,723 B2 | 11/2004 | Yamazaki et al. | |
| 6,821,827 B2 | 11/2004 | Nakamura et al. | |
| 6,828,726 B2 | 12/2004 | Sakurai et al. | |
| 6,833,668 B1 * | 12/2004 | Yamada | H01L 51/5259 313/505 |
| 6,836,069 B2 | 12/2004 | Iga | |
| 6,849,877 B2 | 2/2005 | Yamazaki et al. | |
| 6,852,997 B2 | 2/2005 | Yamazaki et al. | |
| 6,861,710 B2 | 3/2005 | Murakami et al. | |
| 6,876,007 B2 | 4/2005 | Yamazaki et al. | |
| 6,882,102 B2 | 4/2005 | Yamazaki | |
| 6,903,377 B2 | 6/2005 | Yamazaki et al. | |
| 6,924,594 B2 | 8/2005 | Ogura et al. | |
| 6,927,833 B2 | 8/2005 | Kim et al. | |
| 6,933,533 B2 | 8/2005 | Yamazaki et al. | |
| 6,952,020 B1 | 10/2005 | Yamazaki et al. | |
| 6,965,124 B2 | 11/2005 | Yamagata | |
| 6,969,291 B2 | 11/2005 | Urabe et al. | |
| 6,991,506 B2 | 1/2006 | Yamada et al. | |
| 6,992,439 B2 | 1/2006 | Yamazaki et al. | |
| 6,995,511 B2 | 2/2006 | Yamazaki et al. | |
| 7,005,671 B2 | 2/2006 | Yamazaki et al. | |
| 7,012,367 B2 | 3/2006 | Seki | |
| 7,015,503 B2 | 3/2006 | Seki et al. | |
| 7,042,024 B2 | 5/2006 | Yamazaki et al. | |
| 7,042,154 B2 | 5/2006 | Kobayashi | |
| 7,053,890 B2 | 5/2006 | Inukai | |
| 7,057,209 B2 | 6/2006 | Yamazaki et al. | |
| 7,094,684 B2 | 8/2006 | Yamazaki et al. | |
| 7,098,602 B2 | 8/2006 | Yamazaki et al. | |
| 7,112,115 B1 | 9/2006 | Yamazaki et al. | |
| 7,169,636 B2 | 1/2007 | Maruyama et al. | |
| 7,199,516 B2 | 4/2007 | Seo et al. | |
| 7,211,828 B2 | 5/2007 | Yamazaki et al. | |
| 7,214,959 B2 | 5/2007 | Seki et al. | |
| 7,221,338 B2 | 5/2007 | Yamazaki et al. | |
| 7,265,391 B2 | 9/2007 | Yamazaki et al. | |
| 7,273,801 B2 | 9/2007 | Seki et al. | |
| 7,282,734 B2 | 10/2007 | Yamazaki et al. | |
| 7,288,420 B1 | 10/2007 | Yamazaki et al. | |
| 7,342,245 B2 | 3/2008 | Tanabe | |
| 7,384,860 B2 | 6/2008 | Nakamura et al. | |
| 7,393,707 B2 | 7/2008 | Yamazaki et al. | |
| 7,402,945 B2 | 7/2008 | Yamazaki et al. | |
| 7,402,948 B2 | 7/2008 | Yamazaki et al. | |
| 7,420,208 B2 | 9/2008 | Yamazaki et al. | |
| 7,420,210 B2 | 9/2008 | Yamazaki et al. | |
| 7,423,293 B2 | 9/2008 | Yamagata et al. | |
| 7,432,529 B2 | 10/2008 | Yamazaki et al. | |
| 7,442,955 B2 | 10/2008 | Seki et al. | |
| 7,442,963 B2 | 10/2008 | Yamazaki et al. | |
| 7,462,501 B2 | 12/2008 | Yamazaki et al. | |
| 7,483,001 B2 | 1/2009 | Matsueda | |
| 7,501,754 B2 | 3/2009 | Funamoto et al. | |
| 7,501,756 B2 | 3/2009 | Kim et al. | |
| 7,569,859 B2 | 8/2009 | Maruyama et al. | |
| 7,572,478 B2 | 8/2009 | Ogura et al. | |
| 7,579,771 B2 | 8/2009 | Yamazaki et al. | |
| 7,585,761 B2 | 9/2009 | Yamazaki et al. | |
| 7,601,236 B2 | 10/2009 | Yamashita et al. | |
| 7,623,098 B2 | 11/2009 | Yamazaki et al. | |
| 7,629,618 B2 | 12/2009 | Yamazaki et al. | |
| 7,662,011 B2 | 2/2010 | Yamazaki et al. | |
| 7,671,369 B2 | 3/2010 | Yamazaki et al. | |
| 7,683,535 B2 | 3/2010 | Fukunaga et al. | |
| 7,692,186 B2 | 4/2010 | Yamazaki et al. | |
| 7,697,106 B2 | 4/2010 | Sawasaki et al. | |
| 7,709,846 B2 | 5/2010 | Yamazaki et al. | |
| 7,719,014 B2 | 5/2010 | Yamazaki et al. | |
| 7,728,326 B2 | 6/2010 | Yamazaki et al. | |
| 7,728,513 B2 | 6/2010 | Seo et al. | |
| 7,742,020 B2 | 6/2010 | Koyama | |
| 7,745,993 B2 | 6/2010 | Fukunaga et al. | |
| 7,759,686 B2 | 7/2010 | Yamazaki et al. | |
| 7,792,489 B2 | 9/2010 | Hirakata et al. | |
| 7,800,099 B2 | 9/2010 | Yamazaki et al. | |
| 7,880,167 B2 | 2/2011 | Yamazaki et al. | |
| 7,932,518 B2 | 4/2011 | Seki et al. | |
| 7,939,835 B2 | 5/2011 | Yamazaki et al. | |

(56) References Cited

U.S. PATENT DOCUMENTS

| | | |
|---|---|---|
| 7,952,101 B2 | 5/2011 | Yamazaki et al. |
| 7,977,876 B2 | 7/2011 | Yamazaki et al. |
| 7,982,206 B2 | 7/2011 | Yamazaki et al. |
| 7,982,692 B2 | 7/2011 | Matsueda |
| 7,990,348 B2 | 8/2011 | Yamazaki et al. |
| 8,004,183 B2 | 8/2011 | Seo et al. |
| 8,008,666 B2 | 8/2011 | Yamazaki et al. |
| 8,013,346 B2 | 9/2011 | Yamazaki et al. |
| 8,021,204 B2 | 9/2011 | Yamazaki et al. |
| 8,044,393 B2 | 10/2011 | Yamazaki et al. |
| 8,044,411 B2 | 10/2011 | Maruyama et al. |
| 8,089,066 B2 | 1/2012 | Yamazaki et al. |
| 8,110,509 B2 | 2/2012 | Yamazaki et al. |
| 8,119,468 B2 | 2/2012 | Miyairi et al. |
| 8,134,149 B2 | 3/2012 | Yamazaki et al. |
| 8,138,032 B2 | 3/2012 | Miyairi et al. |
| 8,174,029 B2 | 5/2012 | Yamazaki et al. |
| 8,194,008 B2 | 6/2012 | Yamazaki et al. |
| 8,237,176 B2 | 8/2012 | Maruyama et al. |
| 8,289,241 B2 | 10/2012 | Koyama |
| 8,294,637 B2 | 10/2012 | Matsueda |
| 8,415,660 B2 | 4/2013 | Yamazaki et al. |
| 8,415,669 B2 | 4/2013 | Yamazaki et al. |
| 8,450,925 B2 | 5/2013 | Seo et al. |
| 8,471,273 B2 | 6/2013 | Yamazaki et al. |
| 8,482,011 B2 | 7/2013 | Maruyama et al. |
| 8,519,619 B2 | 8/2013 | Yamazaki et al. |
| 8,525,760 B2 | 9/2013 | Matsueda |
| 8,659,516 B2 | 2/2014 | Koyama |
| 8,735,909 B2 | 5/2014 | Yamazaki et al. |
| 8,785,949 B2 | 7/2014 | Yamazaki et al. |
| 8,822,982 B2 | 9/2014 | Yamazaki et al. |
| 9,166,180 B2 | 10/2015 | Yamazaki et al. |
| 9,178,168 B2 | 11/2015 | Yamazaki et al. |
| 9,231,044 B2 | 1/2016 | Yamazaki et al. |
| 9,287,330 B2 | 3/2016 | Yamazaki et al. |
| 9,793,335 B2 | 10/2017 | Yamazaki et al. |
| 9,978,811 B2 | 5/2018 | Yamazaki et al. |
| 2001/0004469 A1 | 6/2001 | Himeshima et al. |
| 2001/0011686 A1 | 8/2001 | Kuzuyama |
| 2001/0017517 A1 | 8/2001 | Yamazaki |
| 2002/0047514 A1 | 4/2002 | Sakurai et al. |
| 2002/0093286 A1 | 7/2002 | Ohshita et al. |
| 2002/0151252 A1 | 10/2002 | Kawase et al. |
| 2002/0158570 A1 | 10/2002 | Yamada et al. |
| 2002/0180371 A1 | 12/2002 | Yamazaki et al. |
| 2003/0014648 A1 | 1/2003 | Miyashita |
| 2003/0094612 A1 | 5/2003 | Yamazaki et al. |
| 2003/0122140 A1 | 7/2003 | Yamazaki et al. |
| 2003/0143794 A1 | 7/2003 | Nakamura et al. |
| 2003/0146439 A1 | 8/2003 | Yamazaki et al. |
| 2003/0146695 A1 | 8/2003 | Seki |
| 2003/0173567 A1 | 9/2003 | Kokubo |
| 2003/0173891 A1 | 9/2003 | Chiba et al. |
| 2003/0189400 A1 | 10/2003 | Nishio et al. |
| 2003/0194484 A1 | 10/2003 | Yamazaki et al. |
| 2003/0201708 A1 | 10/2003 | Yamada et al. |
| 2003/0201716 A1 | 10/2003 | Yamazaki et al. |
| 2003/0230764 A1 | 12/2003 | Yamazaki et al. |
| 2004/0012329 A1 | 1/2004 | Kobayashi |
| 2004/0035360 A1 | 2/2004 | Yamazaki et al. |
| 2004/0061118 A1 | 4/2004 | Yamazaki et al. |
| 2004/0084673 A1 | 5/2004 | Hirakata et al. |
| 2004/0089900 A1 | 5/2004 | Ishikawa et al. |
| 2004/0090175 A1 | 5/2004 | Urabe et al. |
| 2004/0135501 A1 | 7/2004 | Nishikawa |
| 2004/0207789 A1 | 10/2004 | Hirakata et al. |
| 2004/0218112 A1 | 11/2004 | Hirakata et al. |
| 2005/0057151 A1 | 3/2005 | Kuwabara |
| 2005/0067617 A1 | 3/2005 | Yamazaki et al. |
| 2005/0140291 A1 | 6/2005 | Hirakata et al. |
| 2005/0162080 A1 | 7/2005 | Yaegashi |
| 2005/0200273 A1 | 9/2005 | Nozawa |
| 2005/0218396 A1 | 10/2005 | Tsuchiya et al. |
| 2006/0081844 A1 | 4/2006 | Hirosue et al. |
| 2006/0199461 A1 | 9/2006 | Yamazaki et al. |
| 2006/0202615 A1 | 9/2006 | Murakami et al. |
| 2007/0015430 A1 | 1/2007 | Nishio et al. |
| 2007/0085475 A1 | 4/2007 | Kuwabara et al. |
| 2007/0114921 A1 | 5/2007 | Yamazaki et al. |
| 2008/0018229 A1 | 1/2008 | Yamazaki |
| 2008/0252207 A1 | 10/2008 | Yamazaki et al. |
| 2009/0020751 A1 | 1/2009 | Seki et al. |
| 2009/0061551 A1 | 3/2009 | Yamazaki et al. |
| 2010/0295052 A1 | 11/2010 | Yamazaki et al. |
| 2010/0320484 A1 | 12/2010 | Hirakata et al. |
| 2011/0108863 A1 | 5/2011 | Yamazaki et al. |
| 2011/0132260 A1 | 6/2011 | Yamazaki et al. |
| 2011/0266548 A1 | 11/2011 | Yamazaki et al. |
| 2012/0097994 A1 | 4/2012 | Yamazaki et al. |
| 2013/0273802 A1 | 10/2013 | Seo et al. |
| 2014/0077199 A1 | 3/2014 | Yamazaki et al. |
| 2014/0326974 A1 | 11/2014 | Yamazaki et al. |
| 2015/0008439 A1 | 1/2015 | Yamazaki et al. |

FOREIGN PATENT DOCUMENTS

| | | |
|---|---|---|
| EP | 0989778 A | 3/2000 |
| EP | 1058314 A | 12/2000 |
| EP | 1096568 A | 5/2001 |
| EP | 1102317 A | 5/2001 |
| EP | 1178462 A | 2/2002 |
| EP | 1315208 A | 5/2003 |
| EP | 1331666 A | 7/2003 |
| EP | 1331667 A | 7/2003 |
| EP | 1343206 A | 9/2003 |
| EP | 1369924 A | 12/2003 |
| EP | 1396836 A | 3/2004 |
| EP | 1437777 A | 7/2004 |
| EP | 2270858 A | 1/2011 |
| EP | 2509109 A | 10/2012 |
| JP | 10-134959 A | 5/1998 |
| JP | 11-339958 A | 12/1999 |
| JP | 2000-129419 A | 5/2000 |
| JP | 2000-195675 A | 7/2000 |
| JP | 2000-353594 A | 12/2000 |
| JP | 2001-052864 A | 2/2001 |
| JP | 2001-148291 A | 5/2001 |
| JP | 2001-195008 A | 7/2001 |
| JP | 2001-201750 A | 7/2001 |
| JP | 2001-250777 A | 9/2001 |
| JP | 2002-062845 A | 2/2002 |
| JP | 2002-082651 A | 3/2002 |
| JP | 2002-101252 A | 4/2002 |
| JP | 2002-151252 A | 5/2002 |
| JP | 2002-164181 A | 6/2002 |
| JP | 2002-184569 A | 6/2002 |
| JP | 2002-208484 A | 7/2002 |
| JP | 2002-318555 A | 10/2002 |
| JP | 2002-324666 A | 11/2002 |
| JP | 2002-372928 A | 12/2002 |
| JP | 2003-059671 A | 2/2003 |
| JP | 2003-086356 A | 3/2003 |
| JP | 2003-115388 A | 4/2003 |
| JP | 2003-123969 A | 4/2003 |
| JP | 2003-157983 A | 5/2003 |
| JP | 2003-207788 A | 7/2003 |
| JP | 2003-243171 A | 8/2003 |
| JP | 2003-257650 A | 9/2003 |
| JP | 2003-288994 A | 10/2003 |
| JP | 2003-332073 A | 11/2003 |
| JP | 2004-006327 A | 1/2004 |
| JP | 2004-014366 A | 1/2004 |
| JP | 2004-047410 A | 2/2004 |
| JP | 2004-047411 A | 2/2004 |
| JP | 2004-047452 A | 2/2004 |
| JP | 2004-083650 A | 3/2004 |
| JP | 2004-111166 A | 4/2004 |
| JP | 2004-127606 A | 4/2004 |
| JP | 2004-127933 A | 4/2004 |
| JP | 2004-145244 A | 5/2004 |
| JP | 2004-152958 A | 5/2004 |
| JP | 2004-165067 A | 6/2004 |
| JP | 2004-192813 A | 7/2004 |

(56) References Cited

FOREIGN PATENT DOCUMENTS

| | | |
|---|---|---|
| JP | 2004-207234 A | 7/2004 |
| JP | 2004-227792 A | 8/2004 |
| JP | 2005-276803 A | 10/2005 |
| JP | 2005-322564 A | 11/2005 |
| JP | 2009-278081 A | 11/2009 |
| JP | 2009-278082 A | 11/2009 |
| KR | 10-0530992 | 11/2005 |
| TW | 471237 | 1/2002 |
| TW | 200405749 | 4/2004 |

* cited by examiner

[Fig. 1]
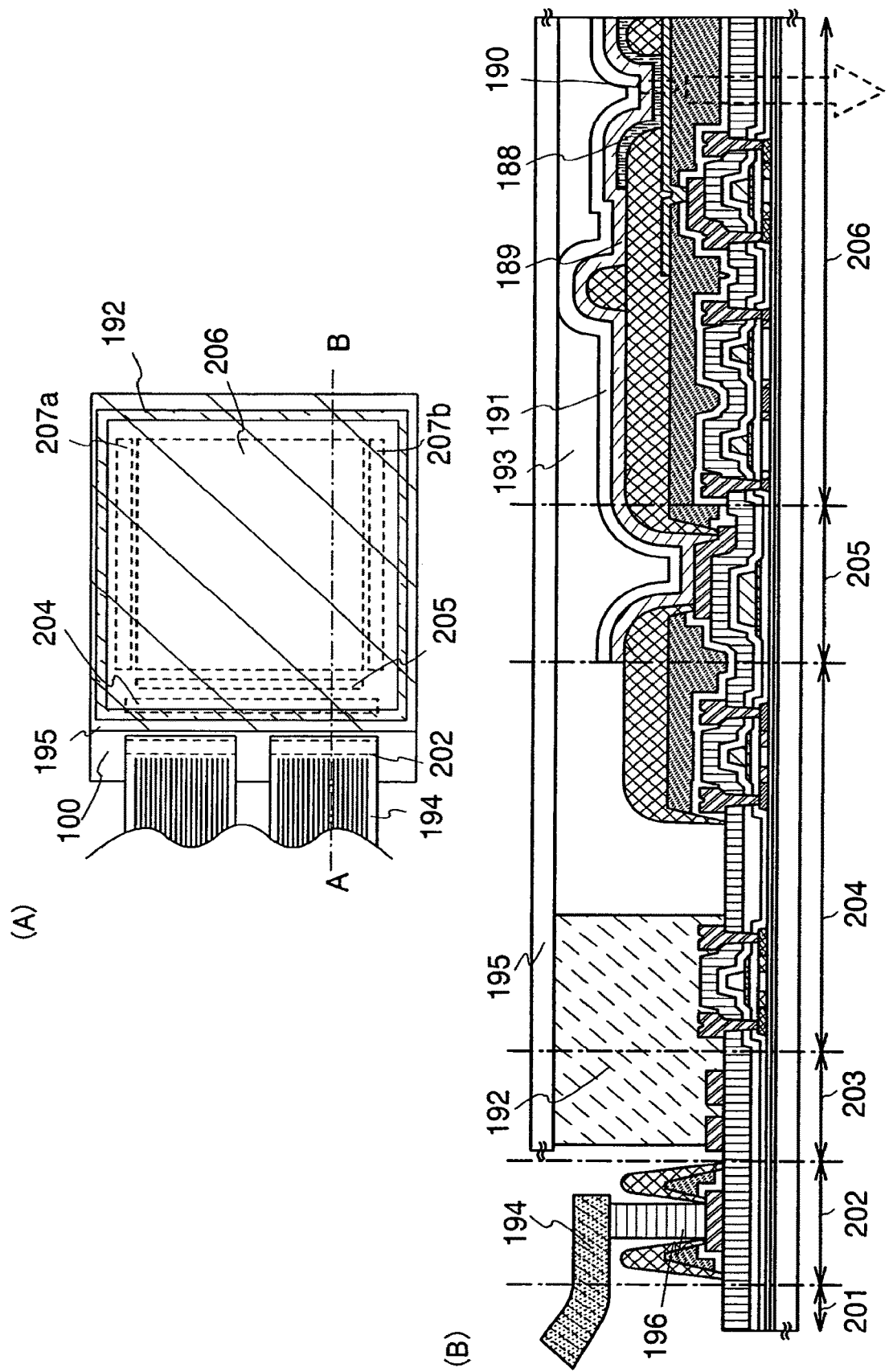

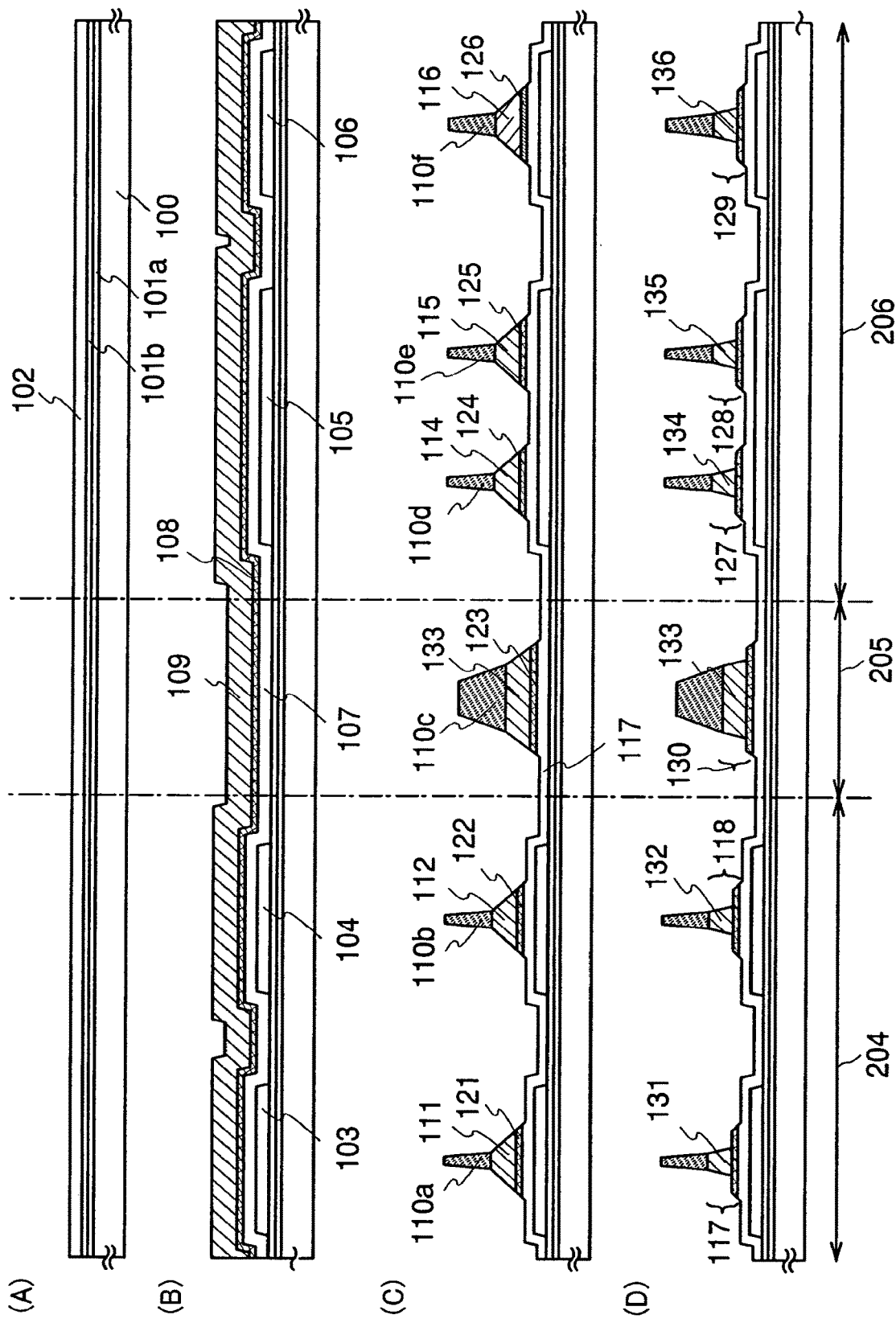

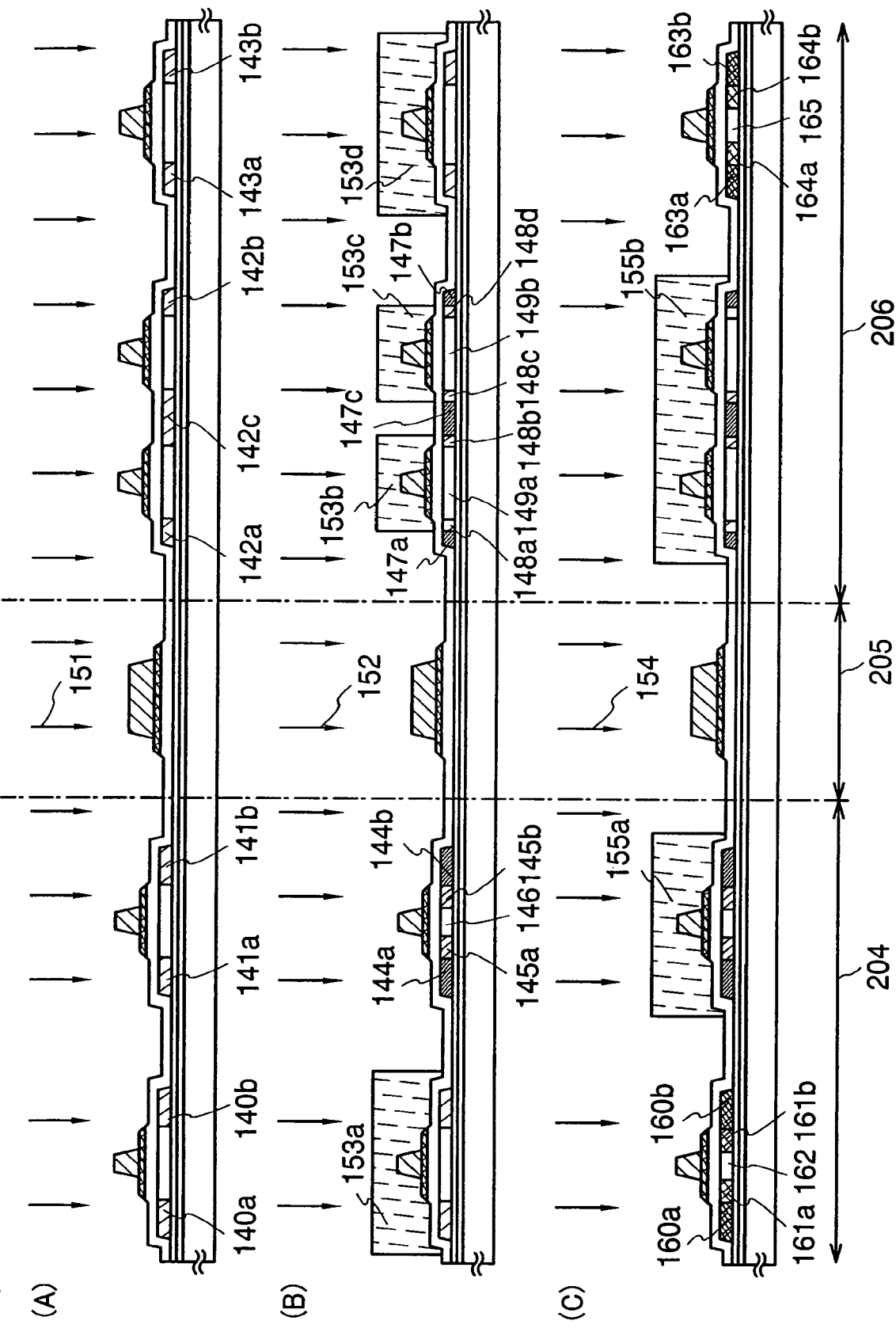

[Fig. 4]
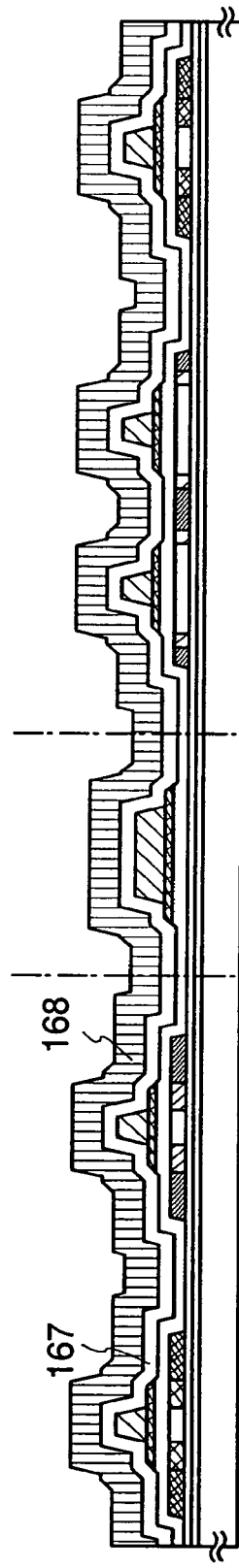
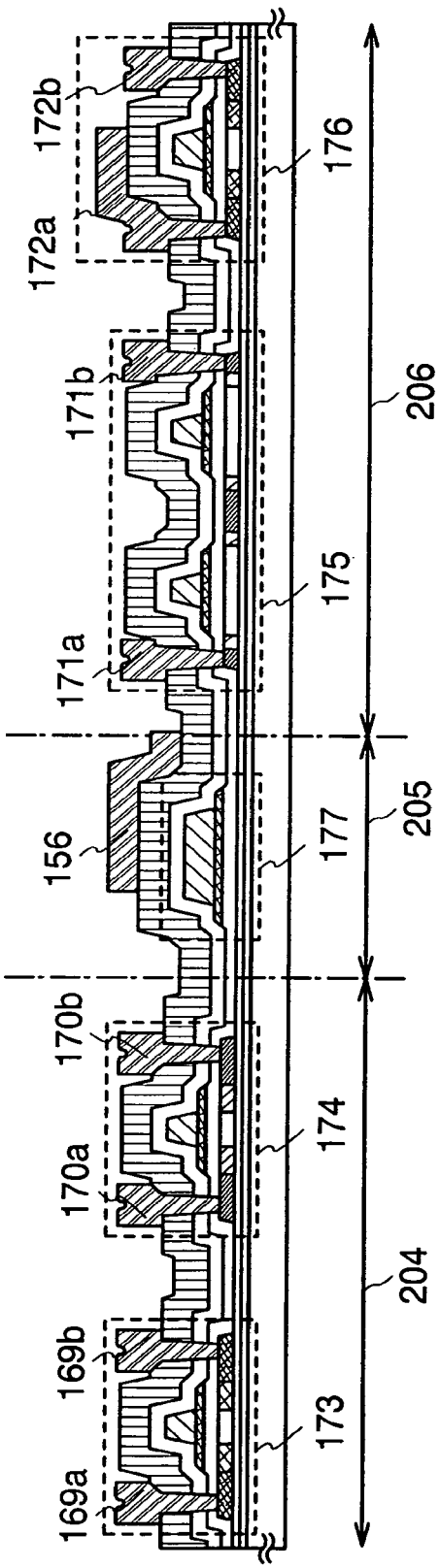

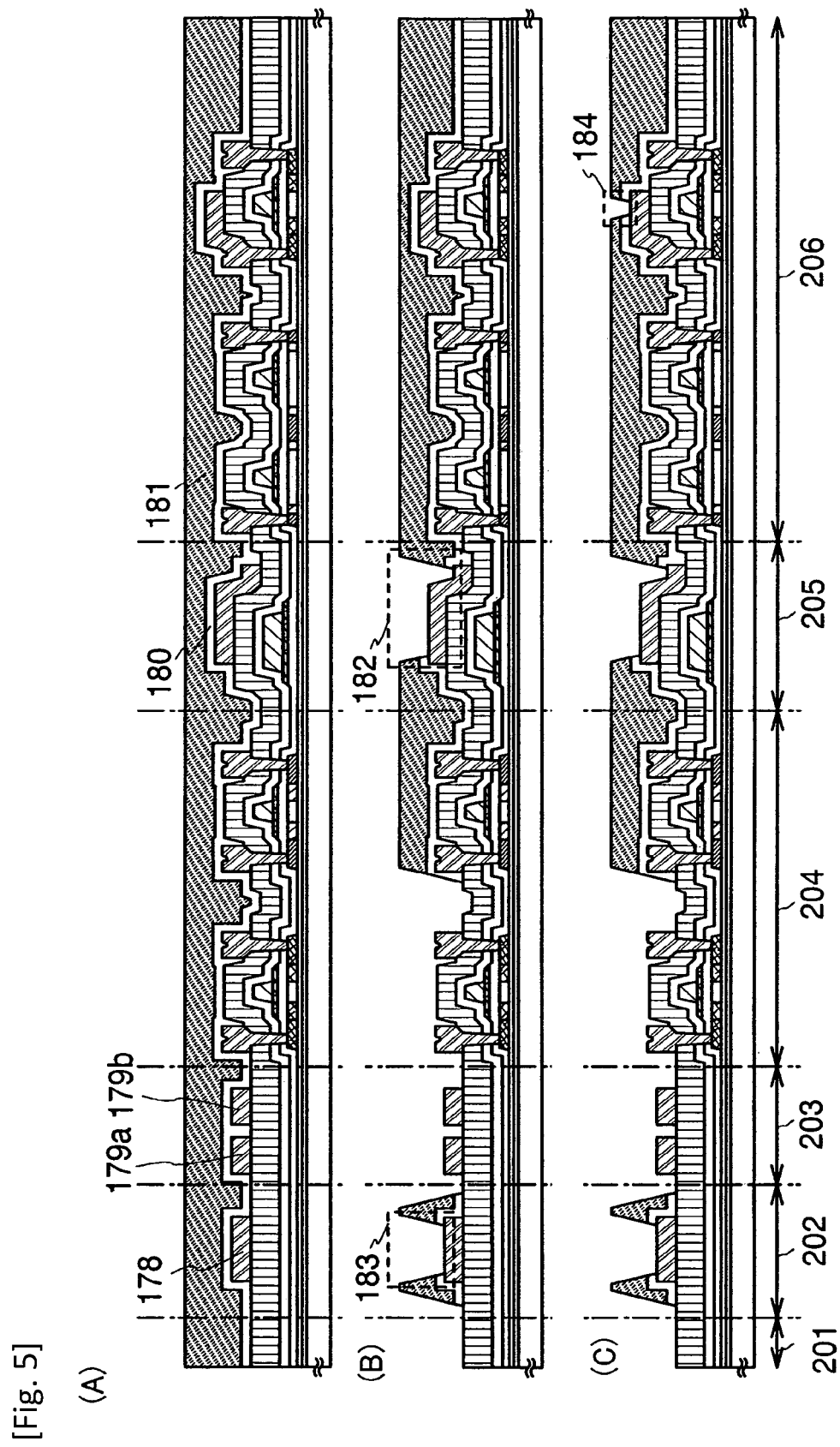
[Fig. 5]

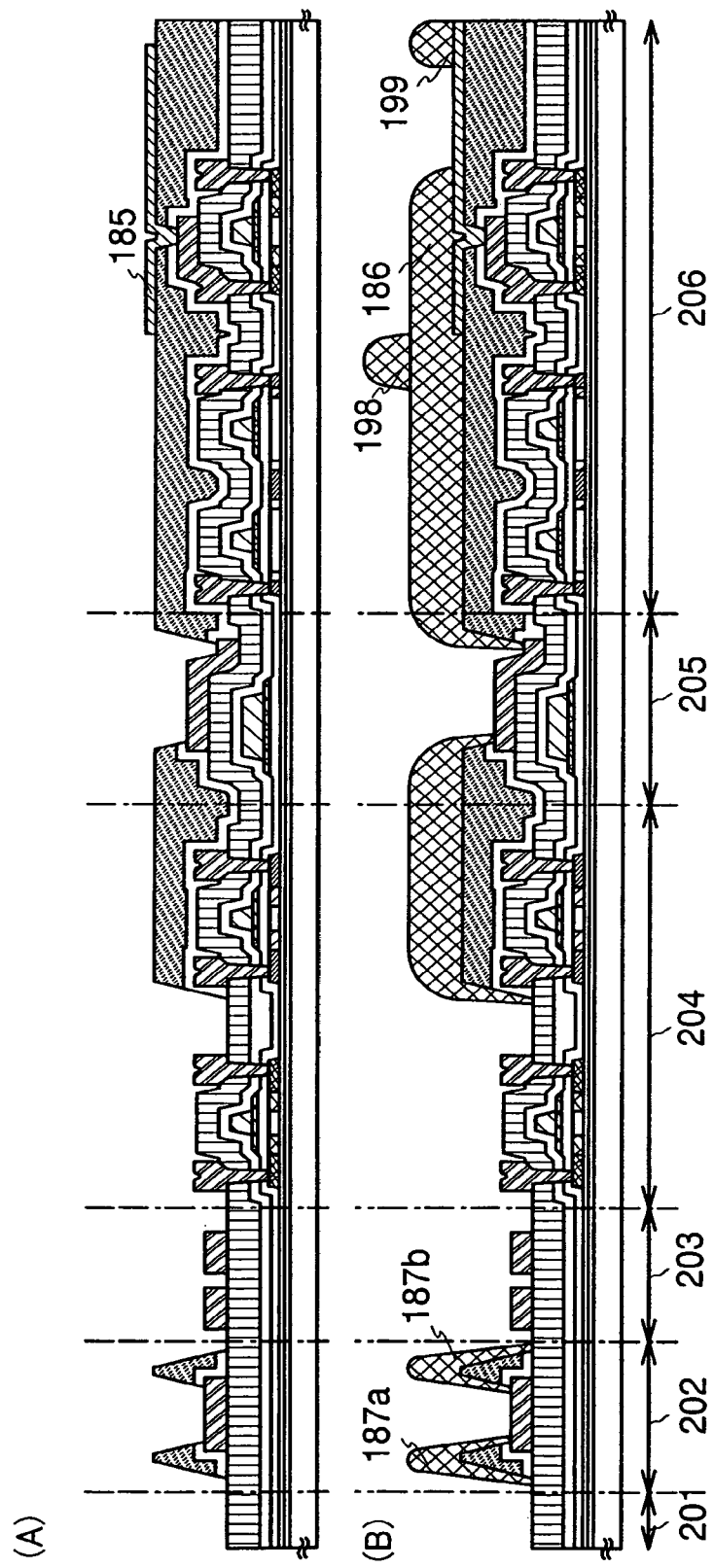

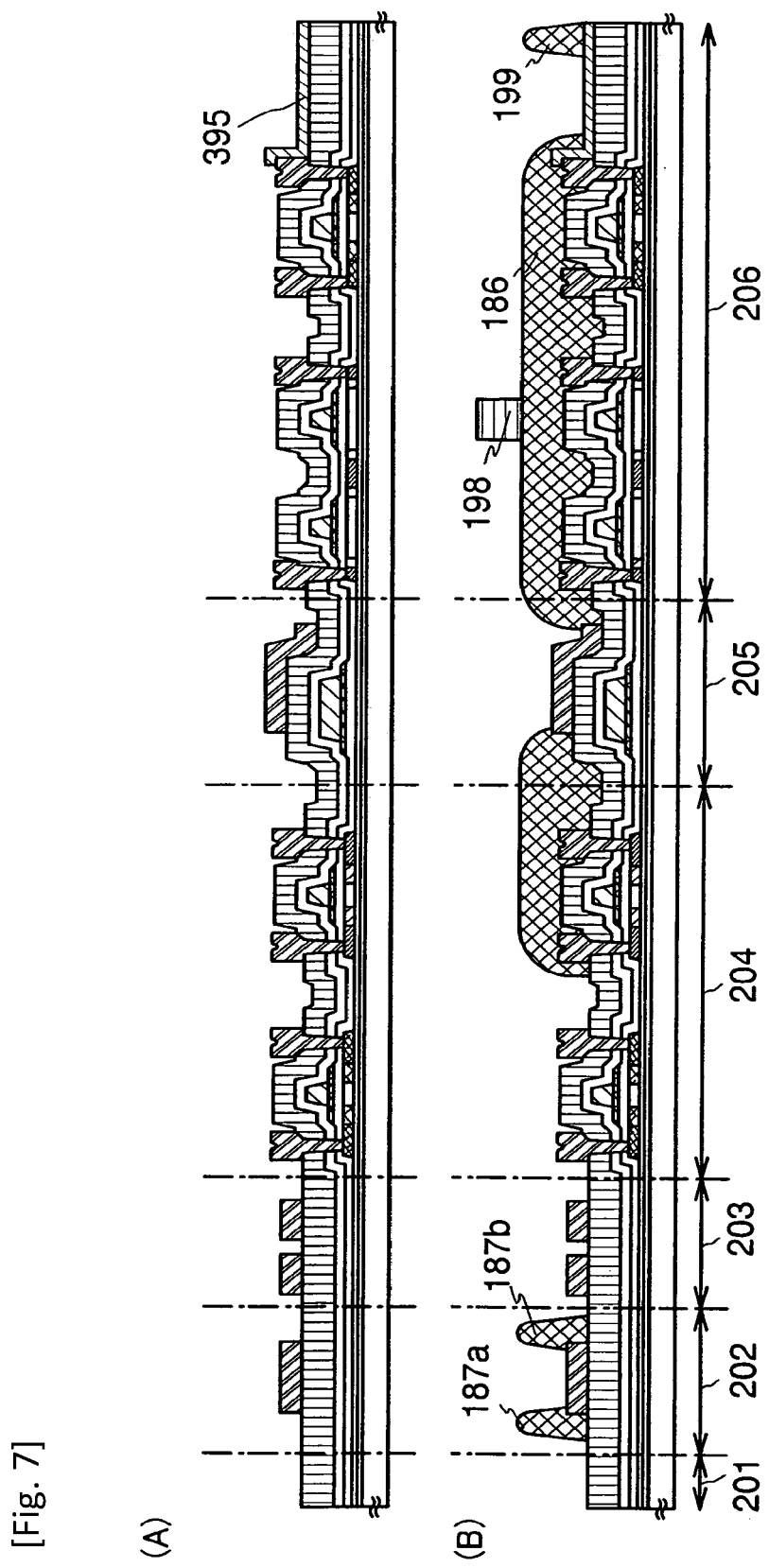

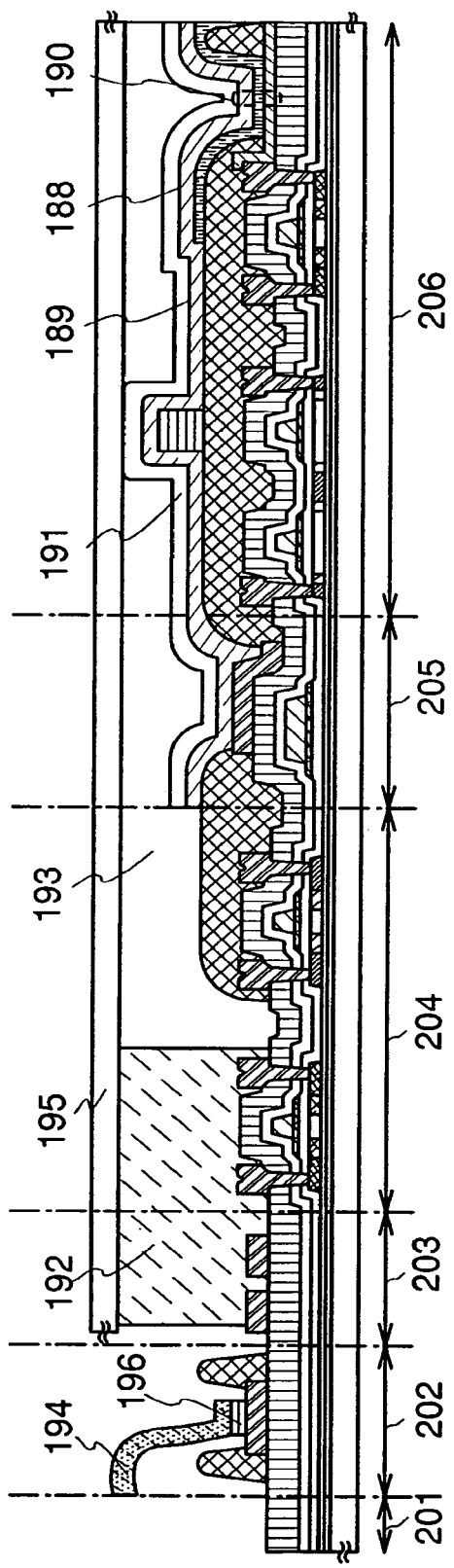
[Fig. 8]

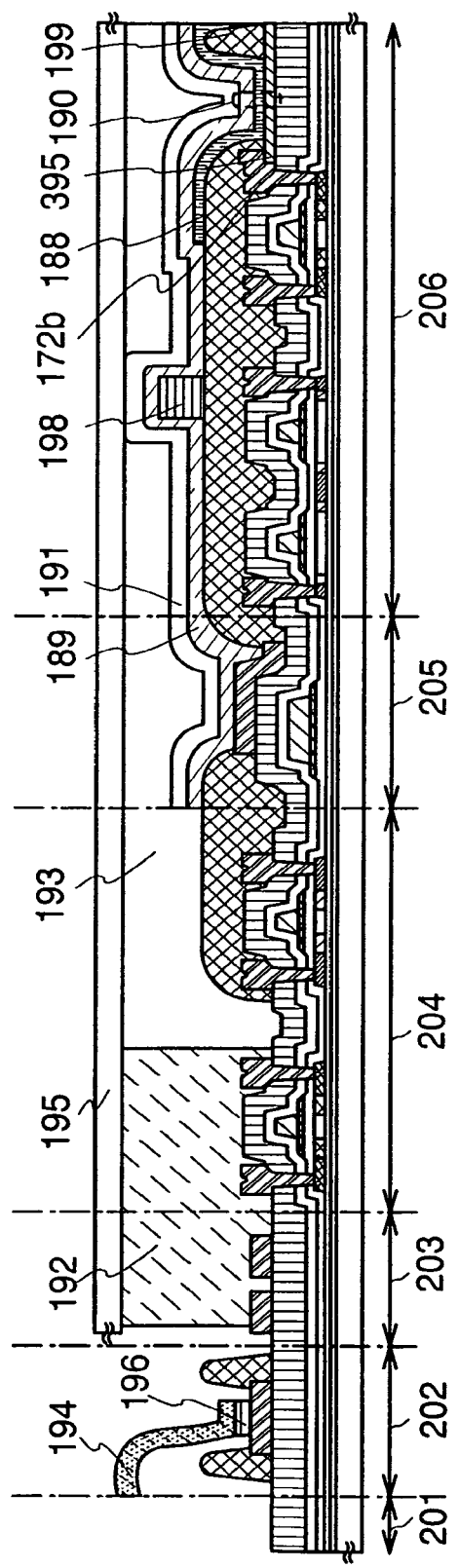
[Fig. 9]

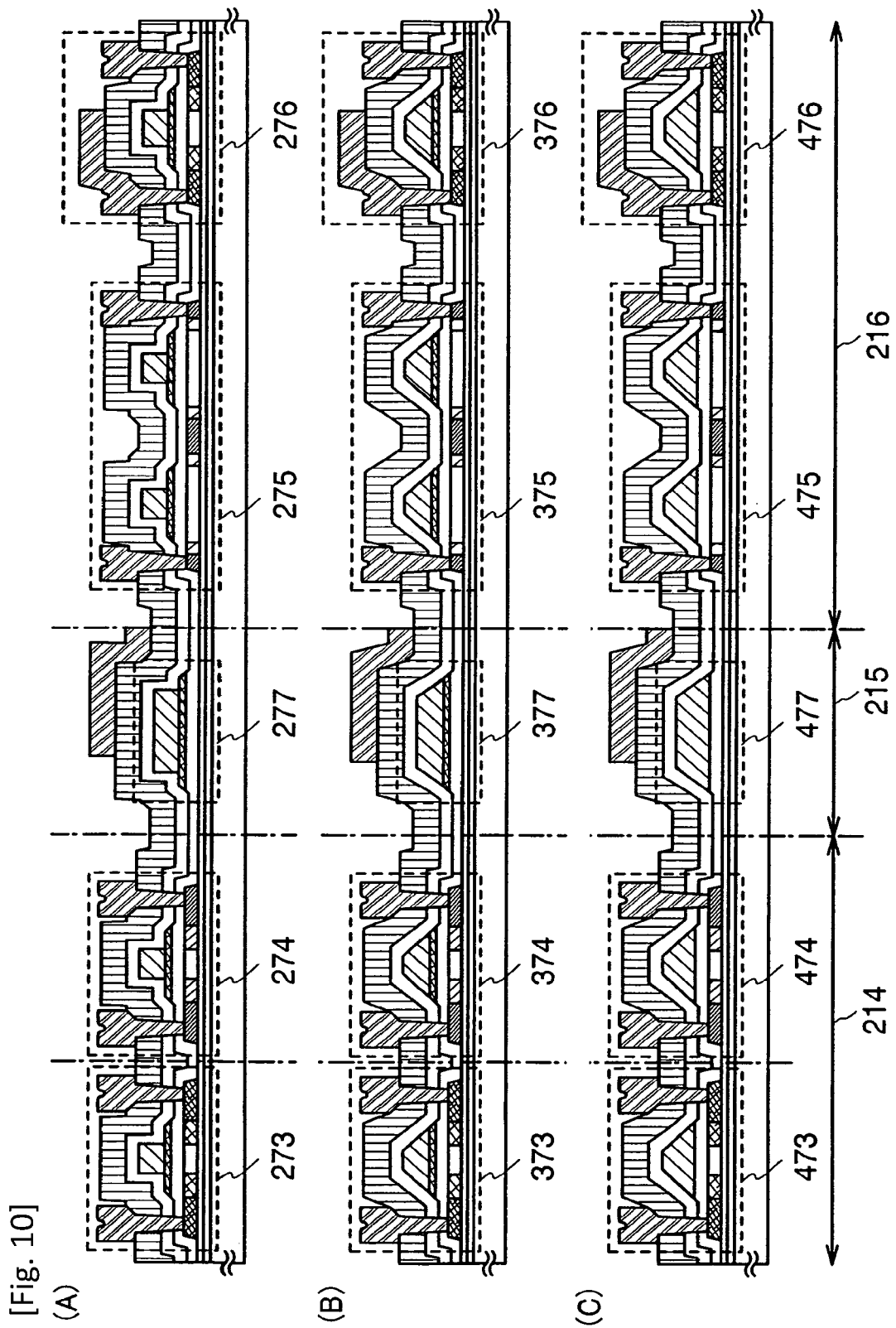
[Fig. 10]

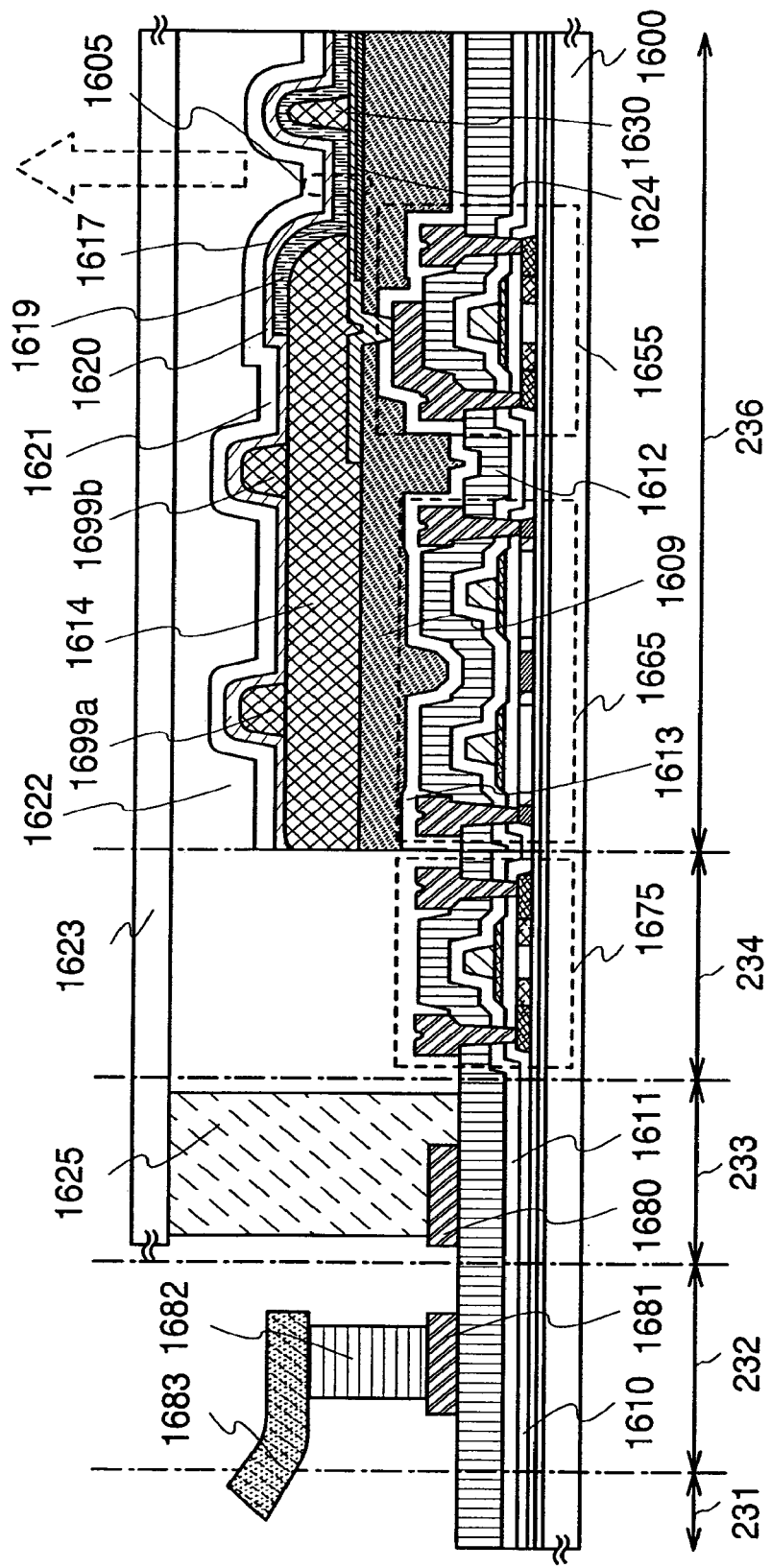
[Fig. 11]

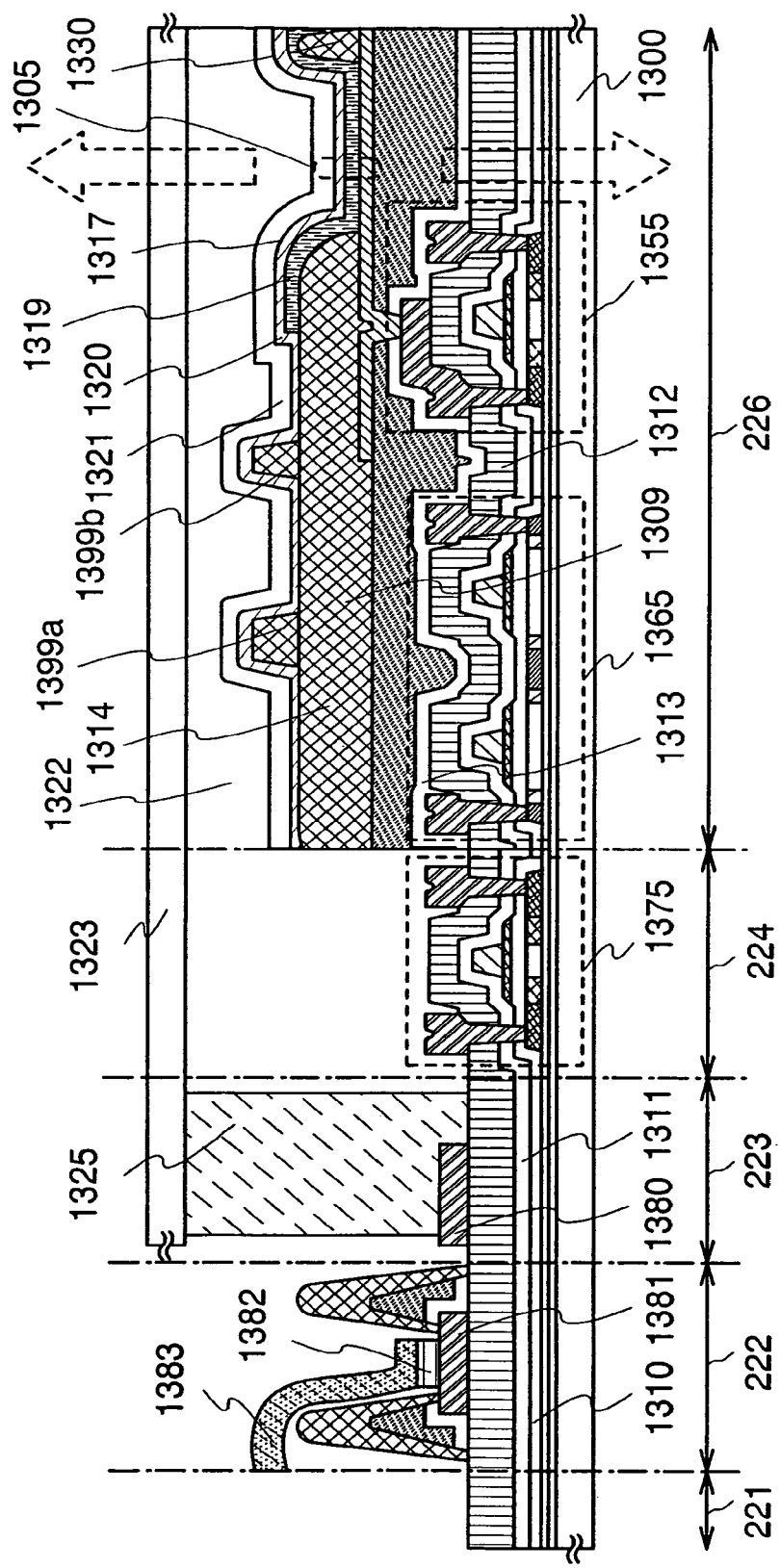
[Fig. 12]

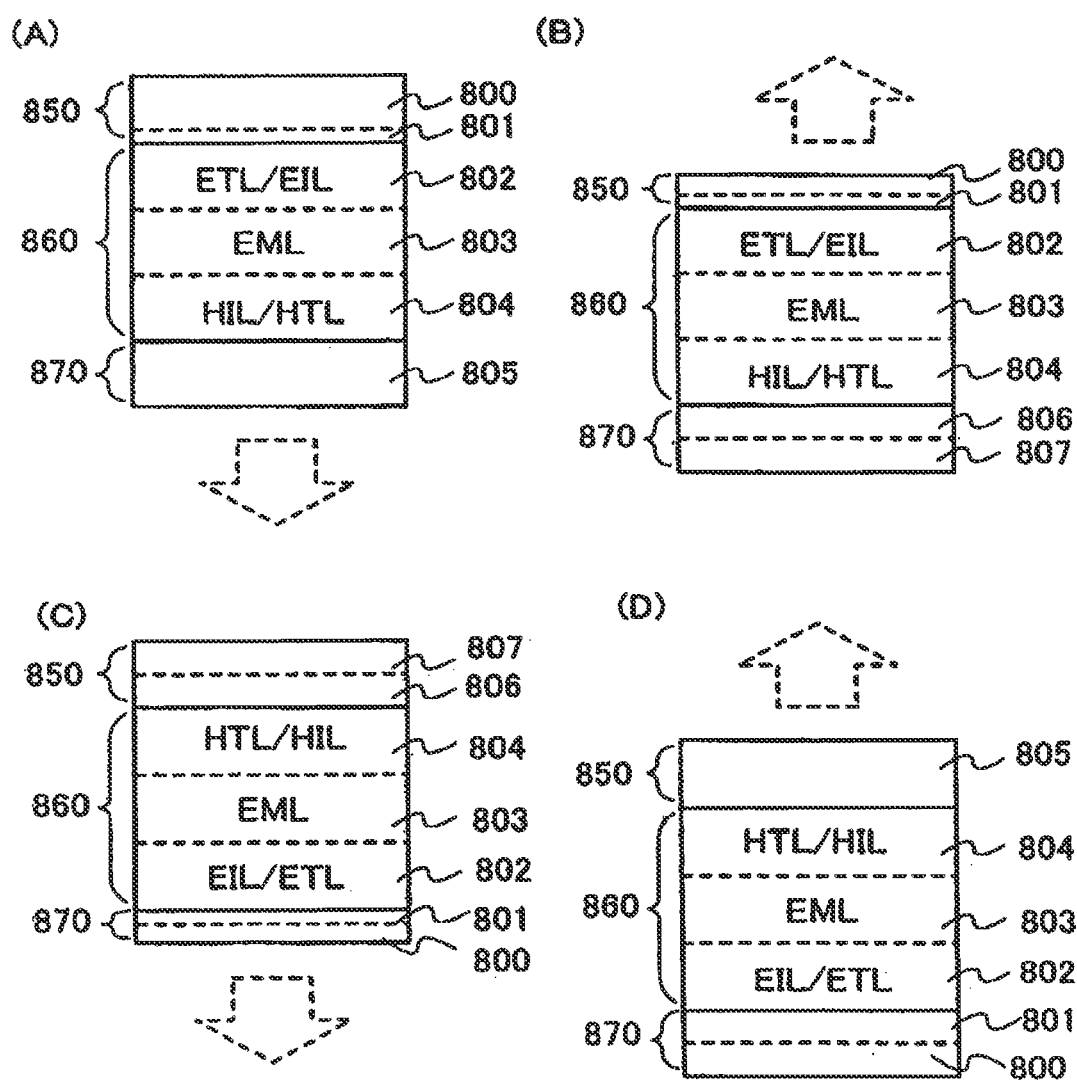
[FIG. 13]

[FIG. 14]
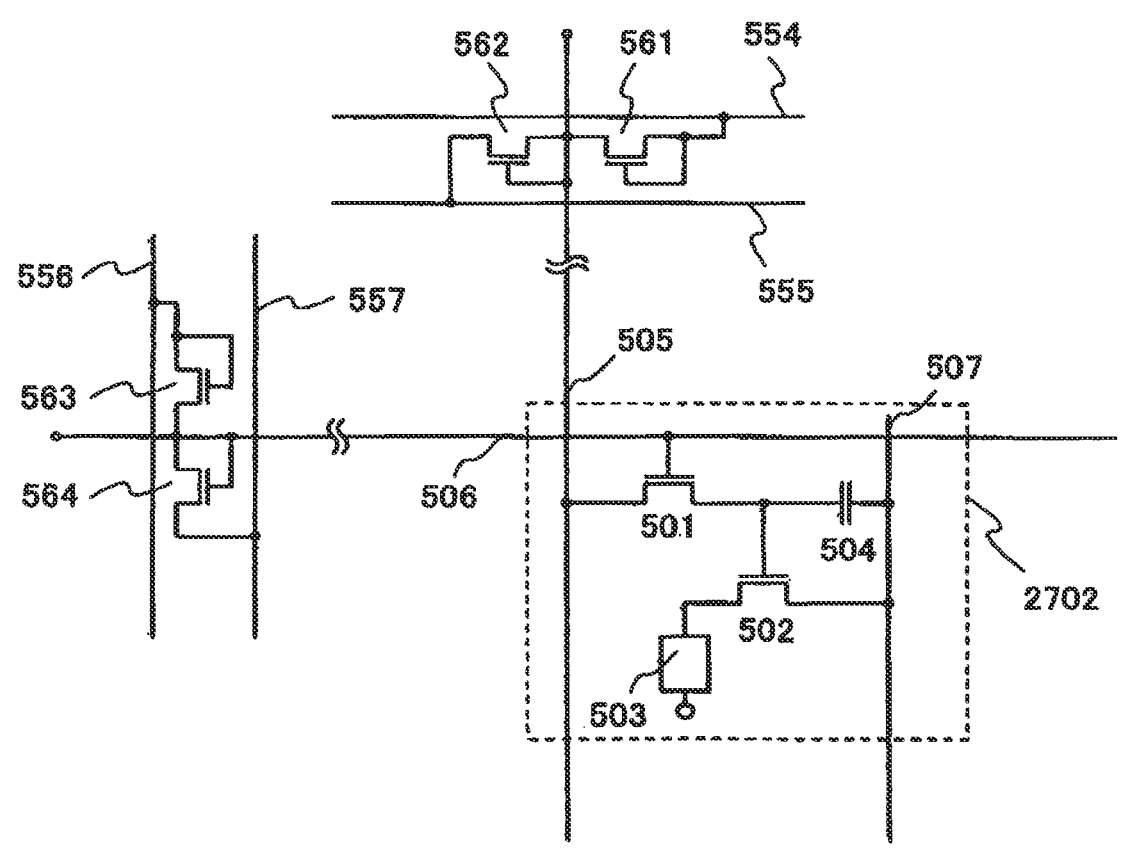

[FIG. 15]
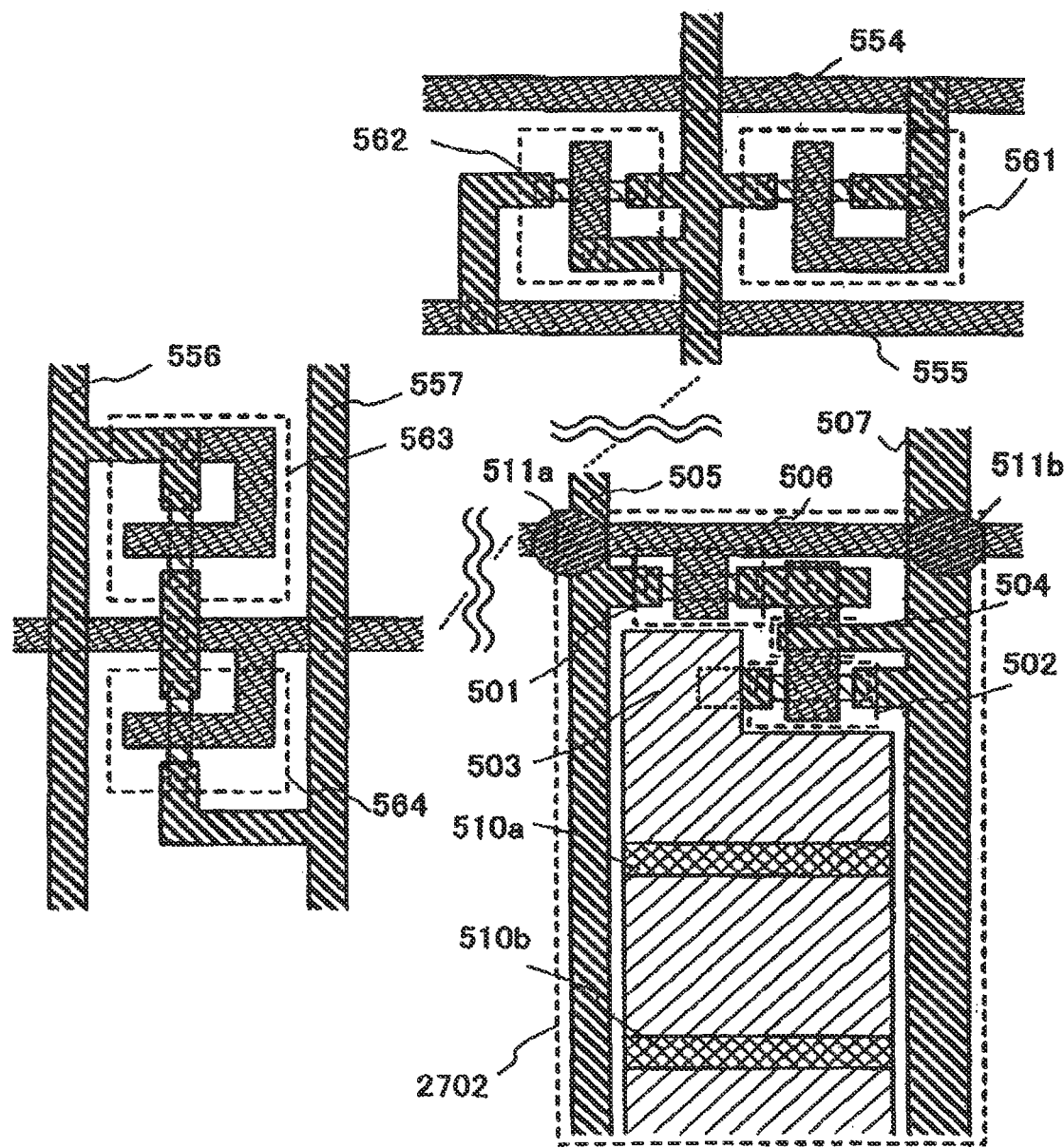

[FIG. 16]
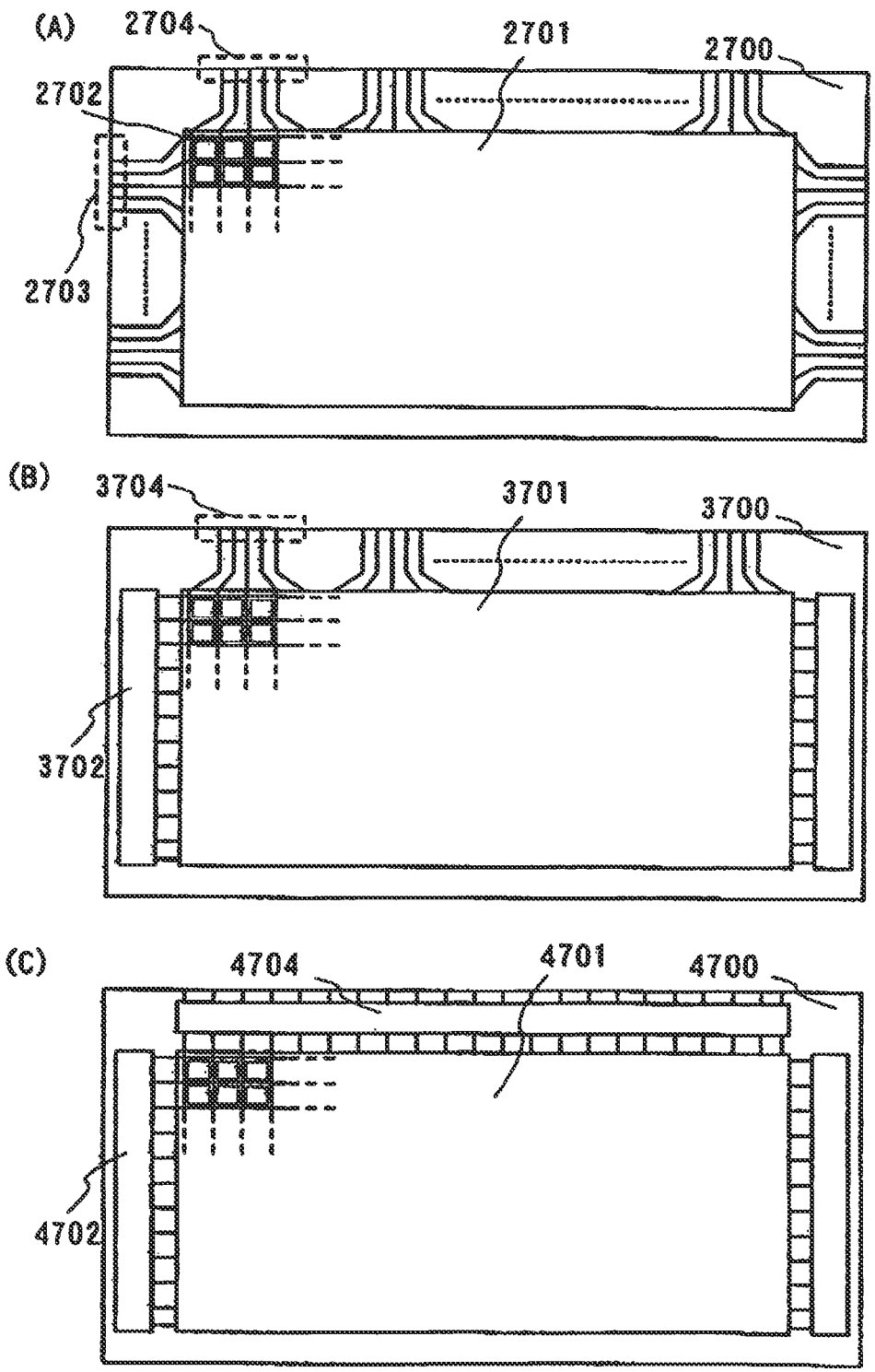

[FIG. 17]
(A)
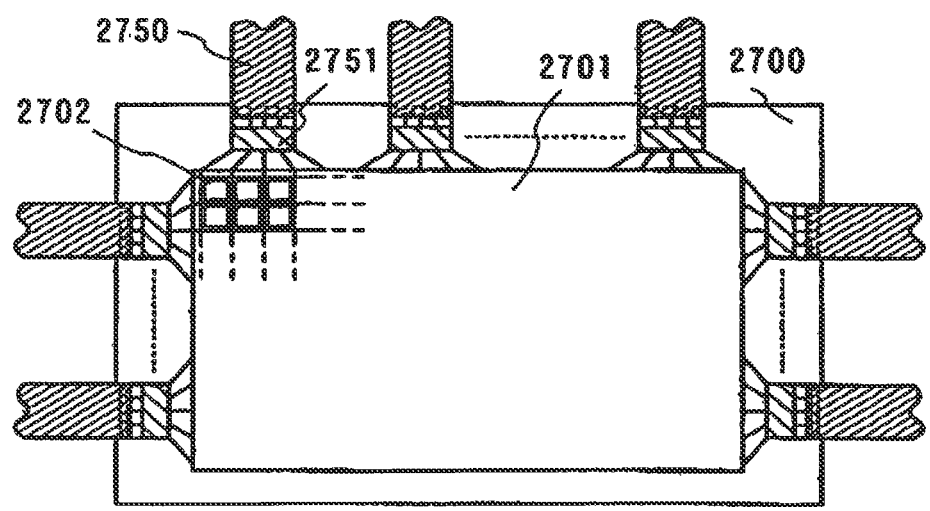
(B)
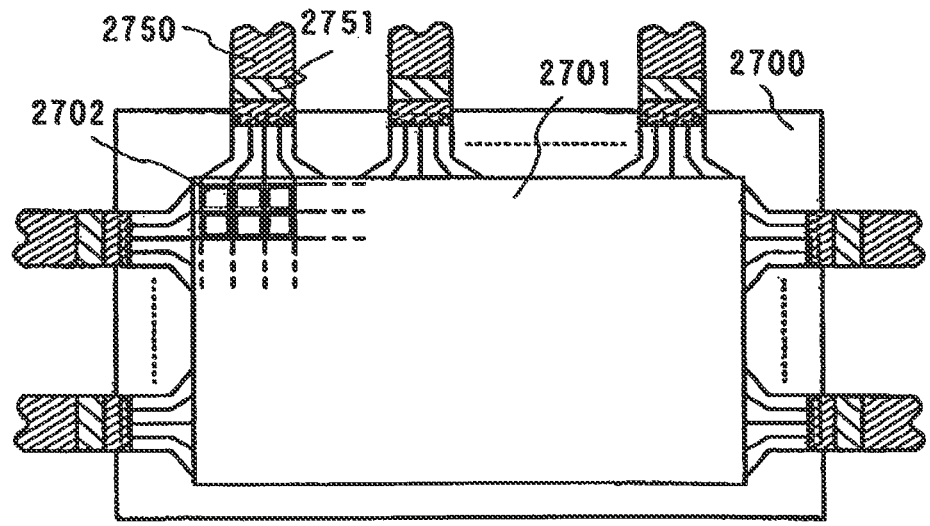

[FIG. 18]
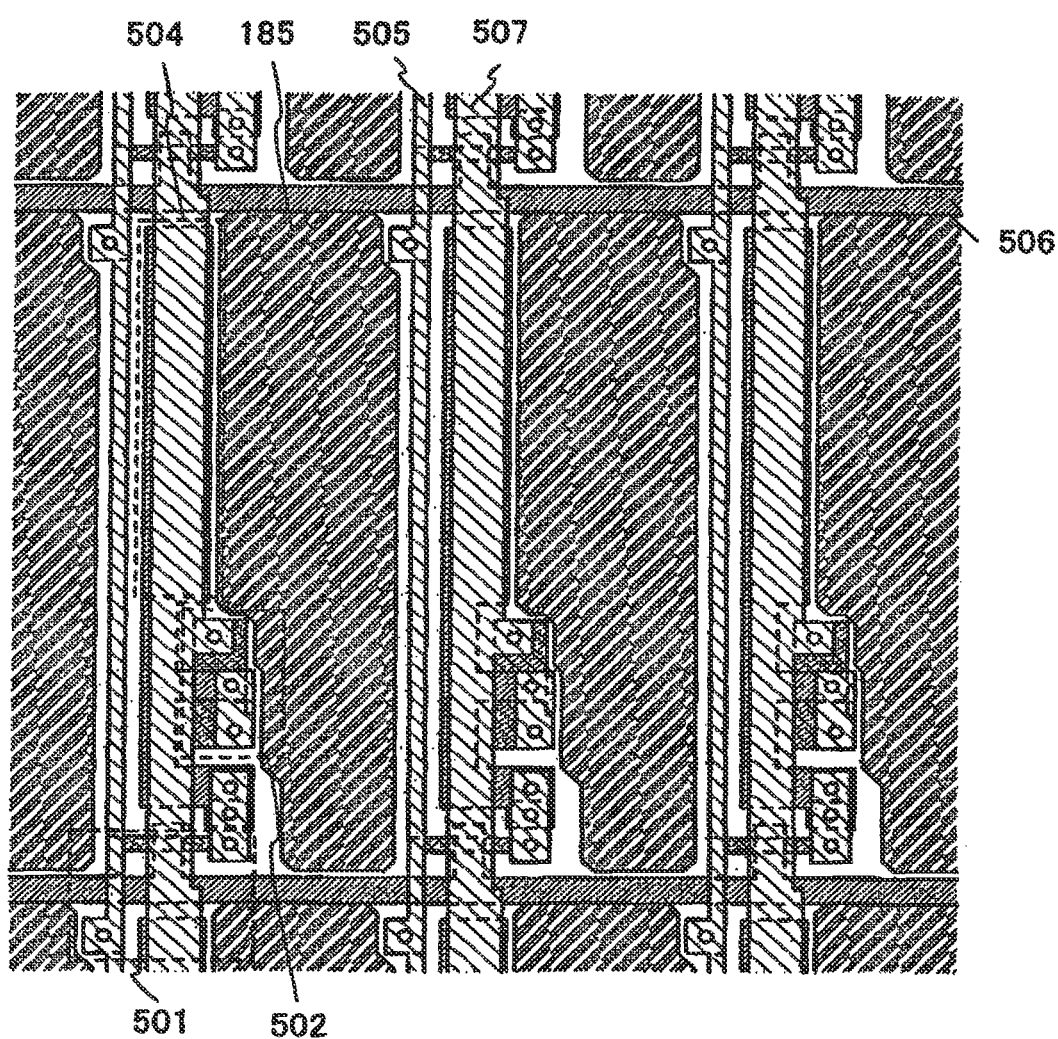

[FIG. 19]
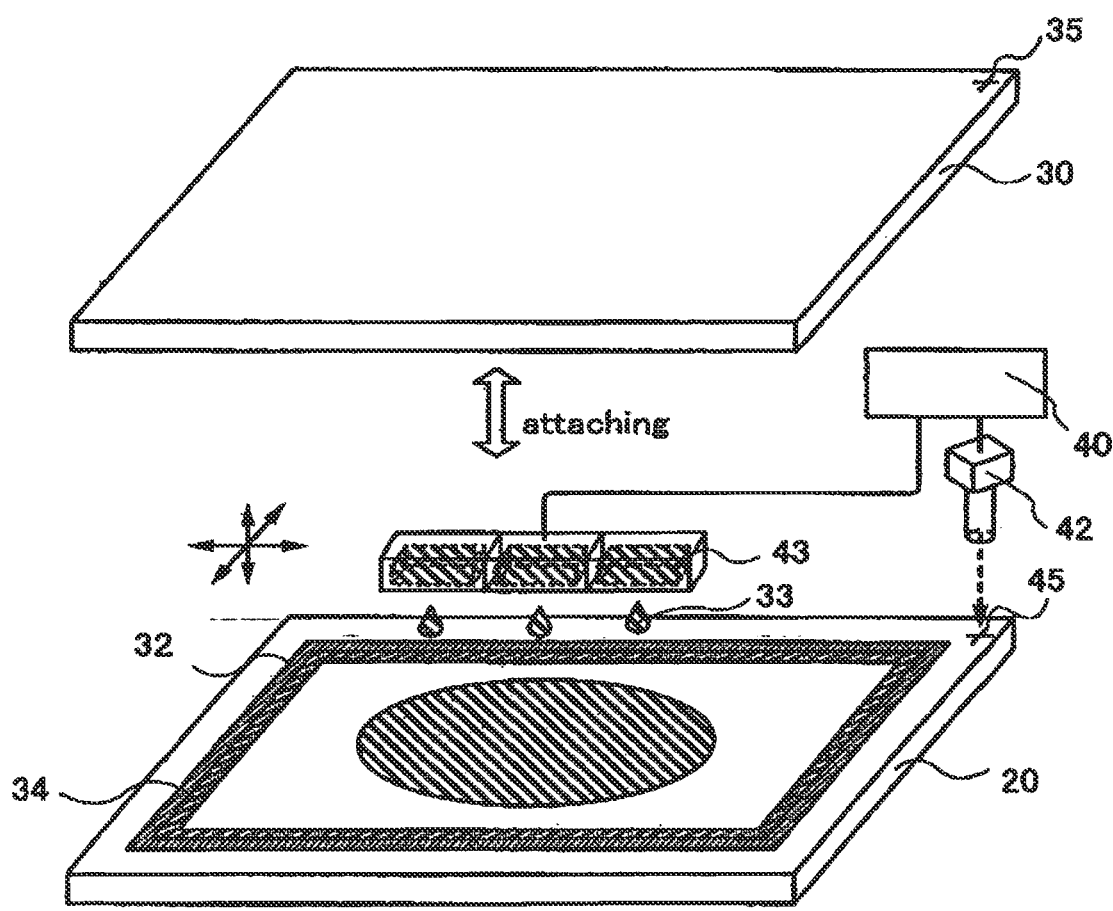

[FIG. 20]
(A)
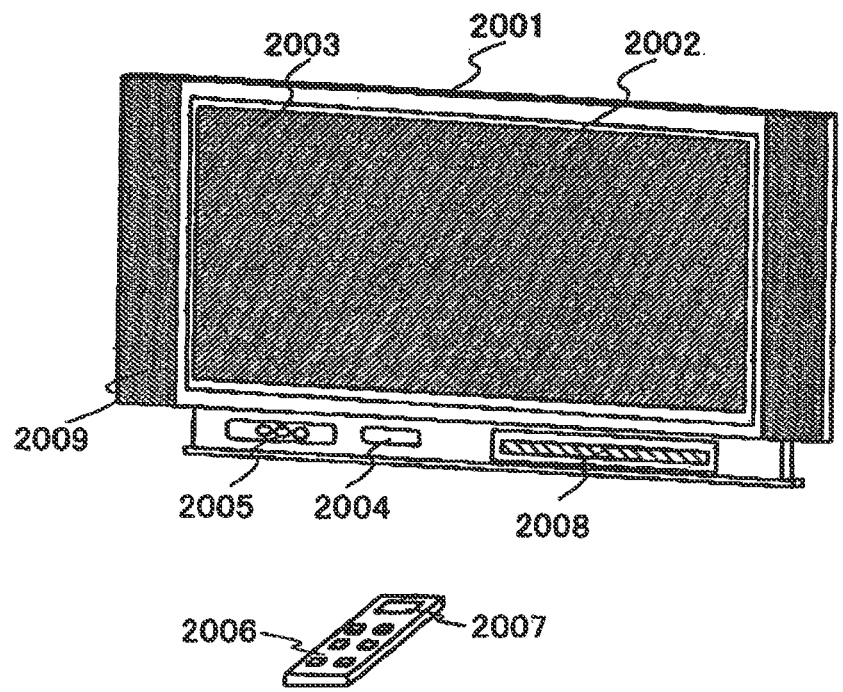
(B)
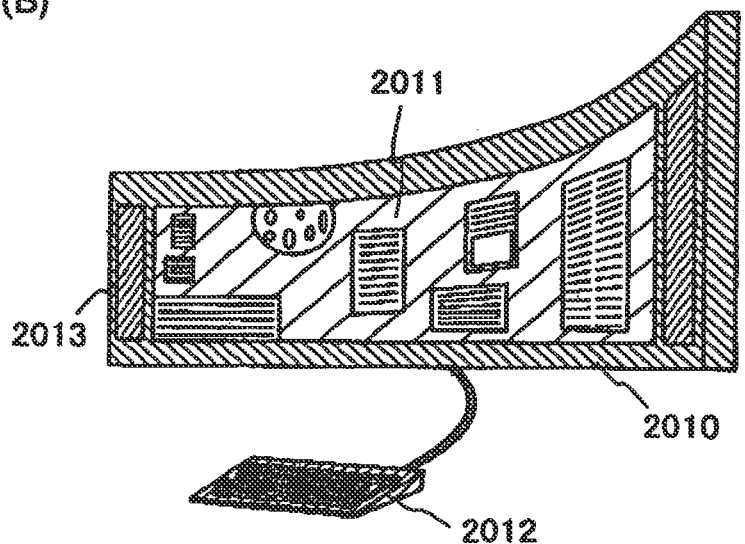

[Fig. 21]
(A)
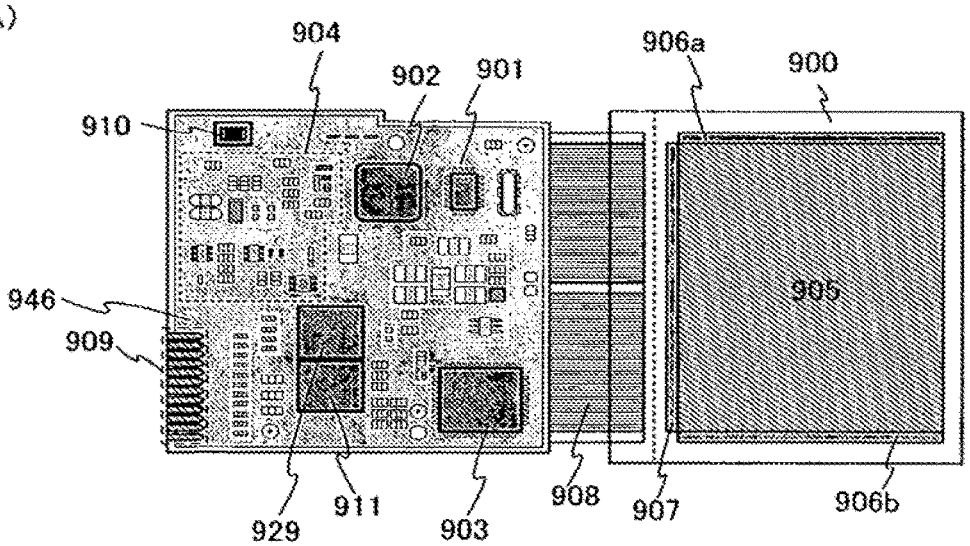
(B)
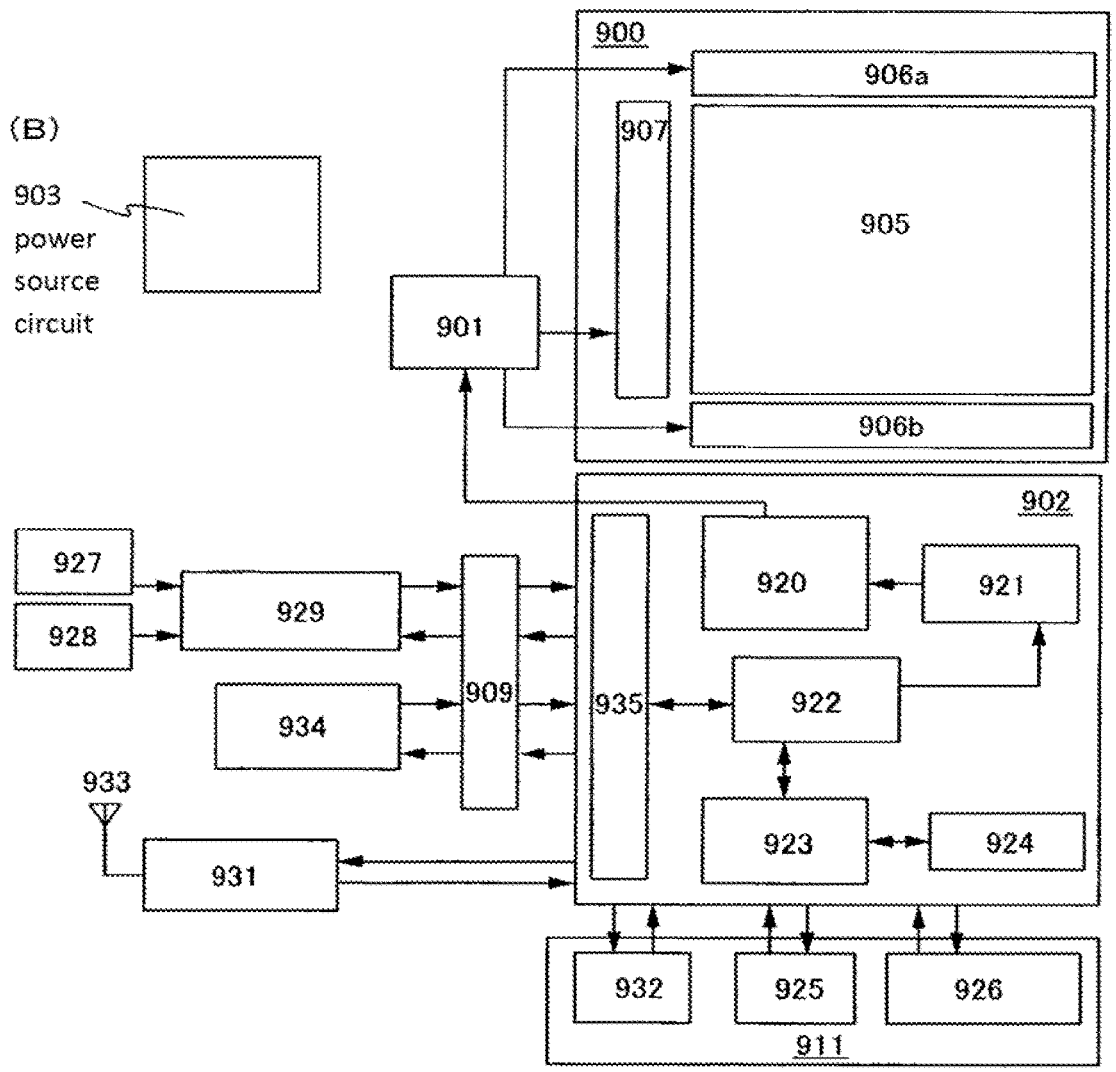

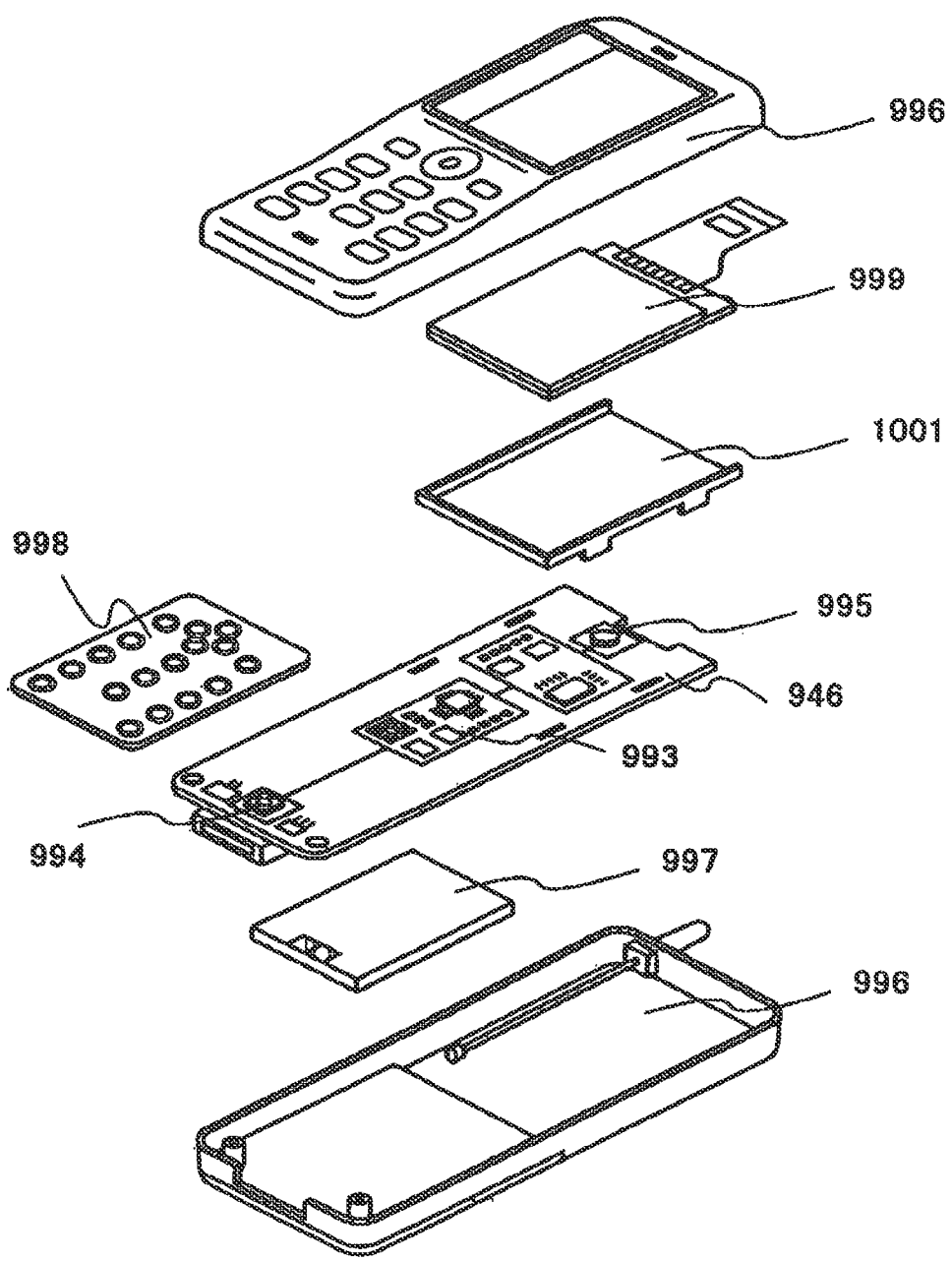
[FIG 22]

[FIG. 23]
(A)
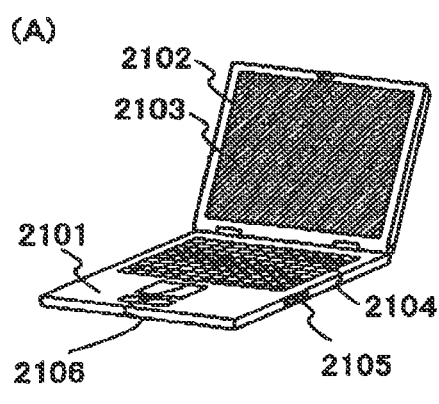
(B)
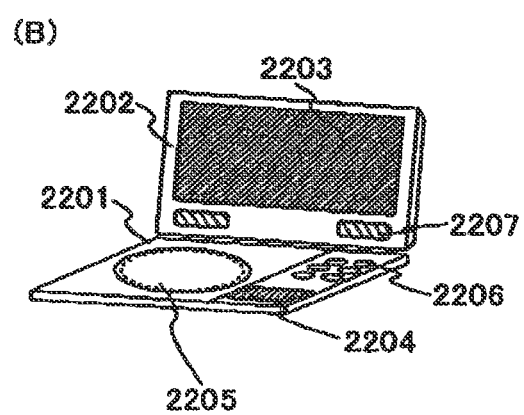
(C)
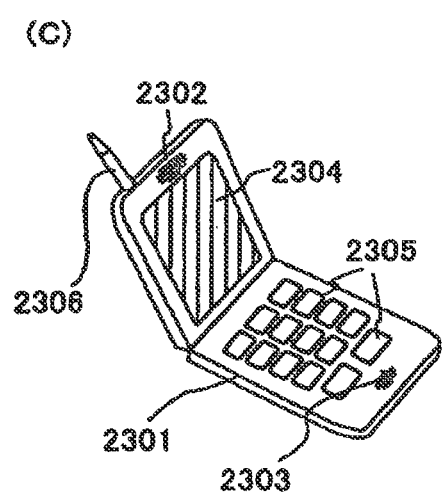
(D)
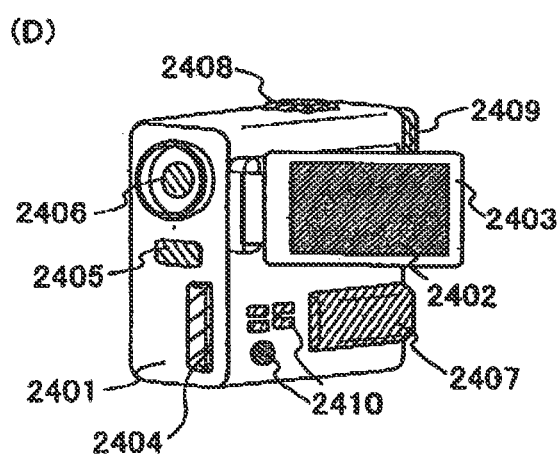

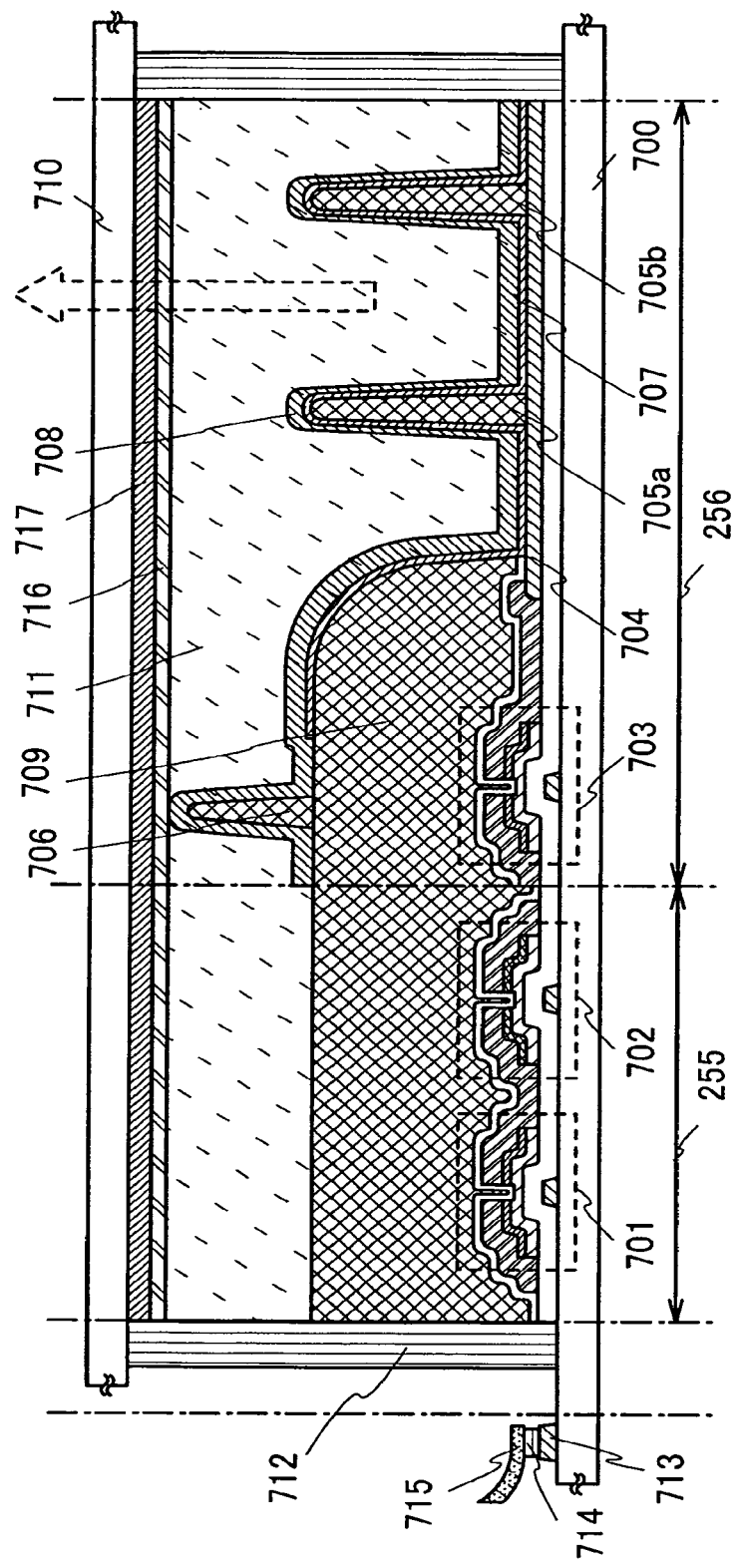
[Fig. 24]

[FIG. 25]
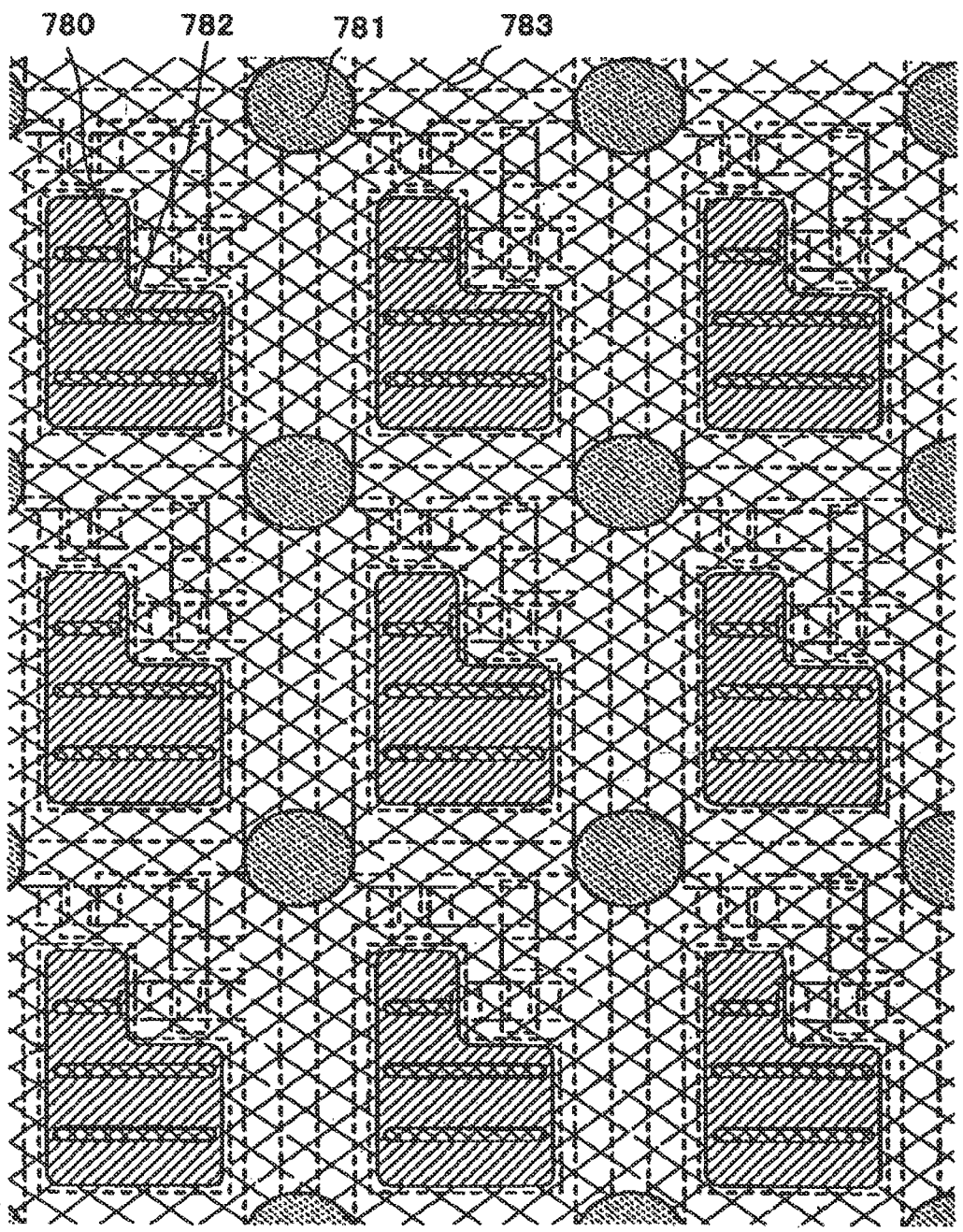

[FIG. 26]
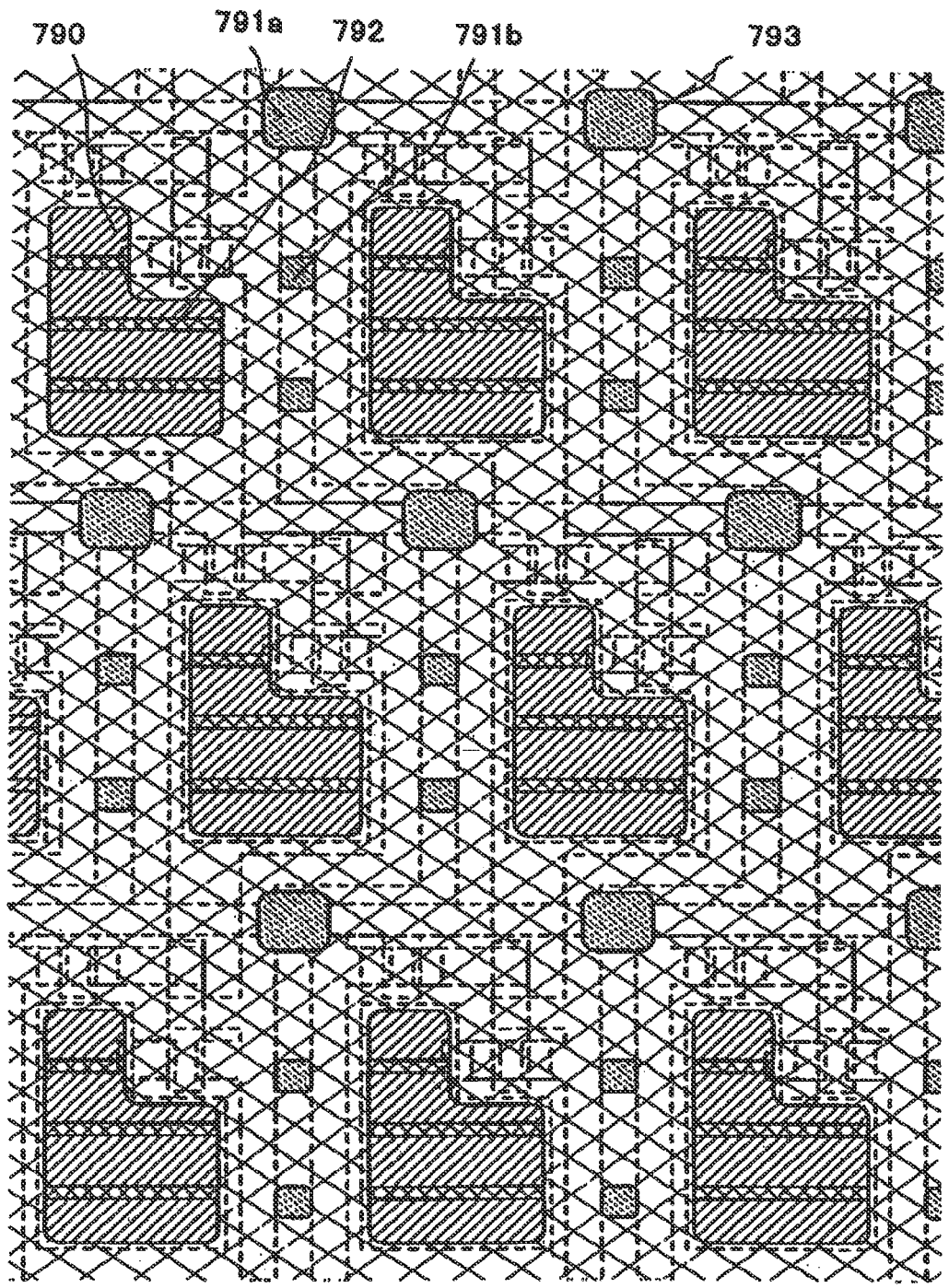

[FIG. 27]
(A)
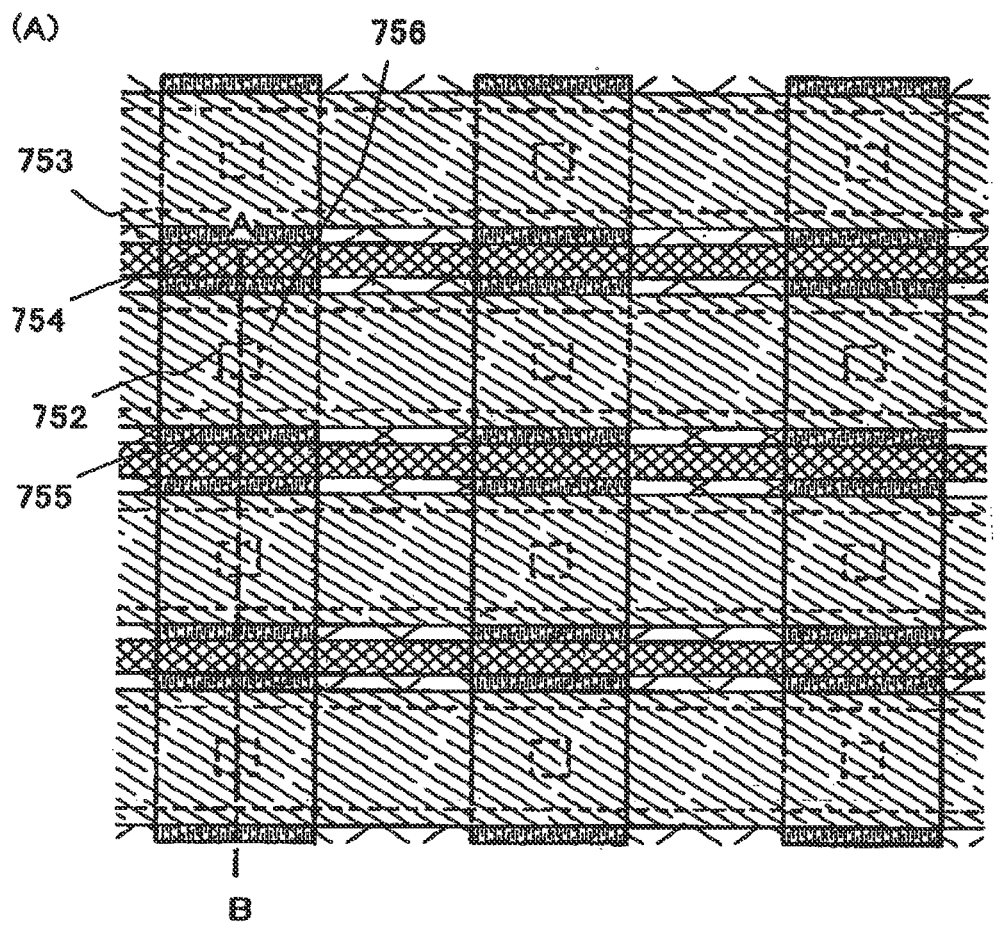
(B)
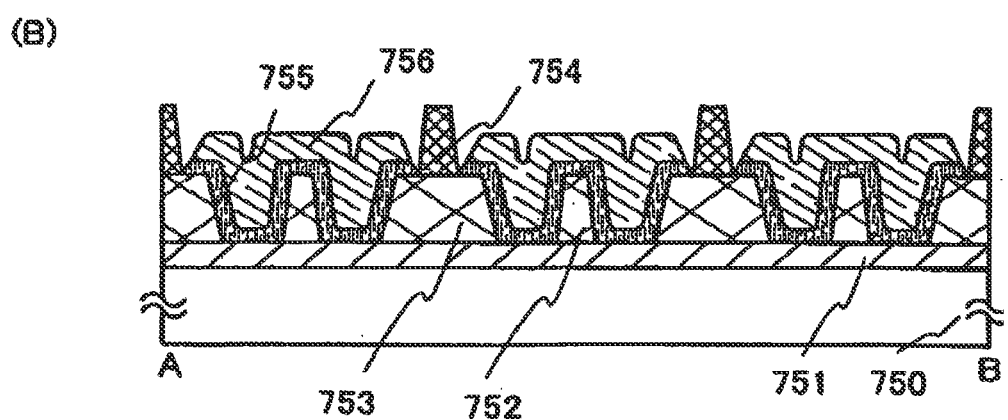

[FIG. 28]
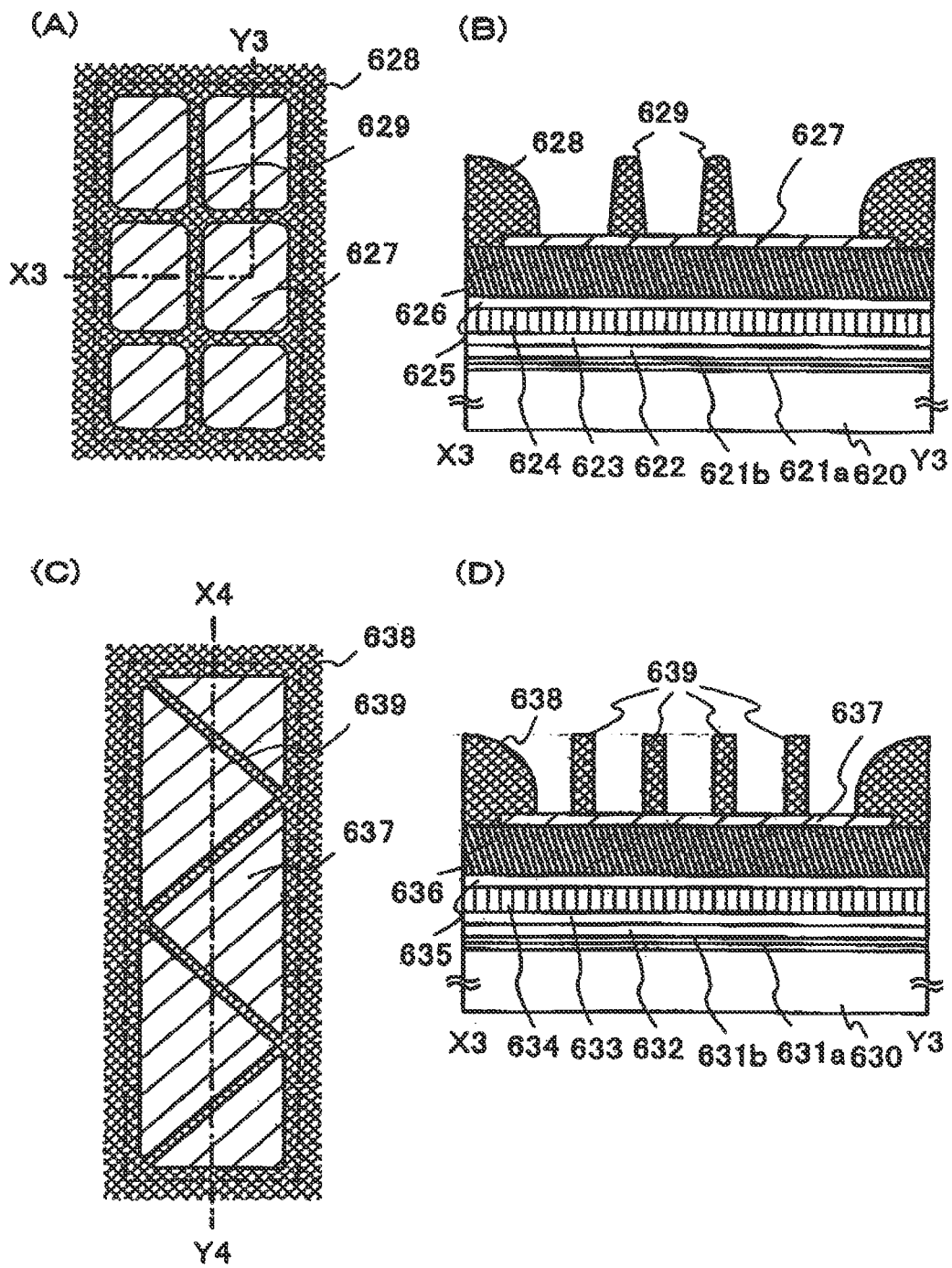

[FIG. 29]
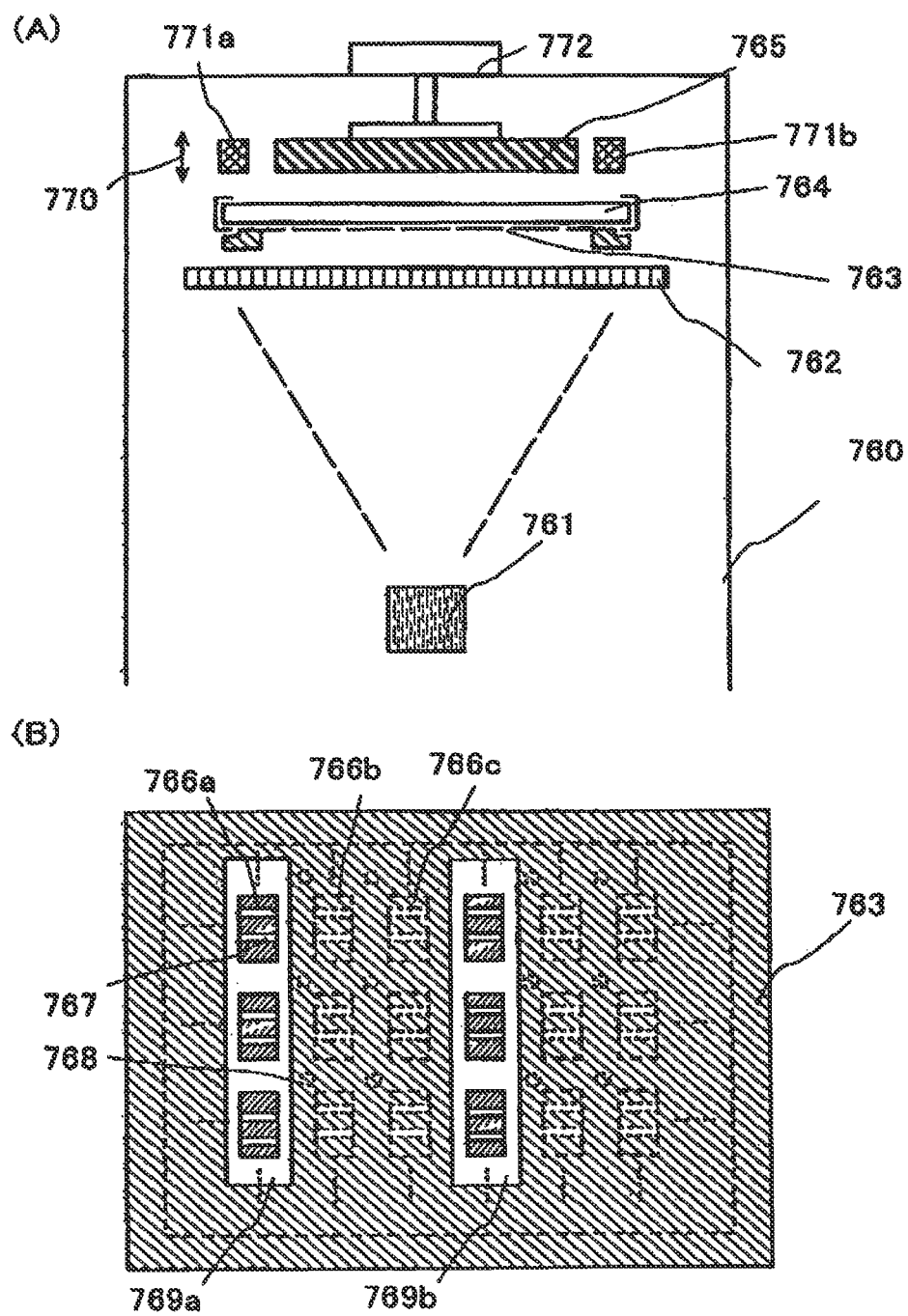

[FIG. 30]
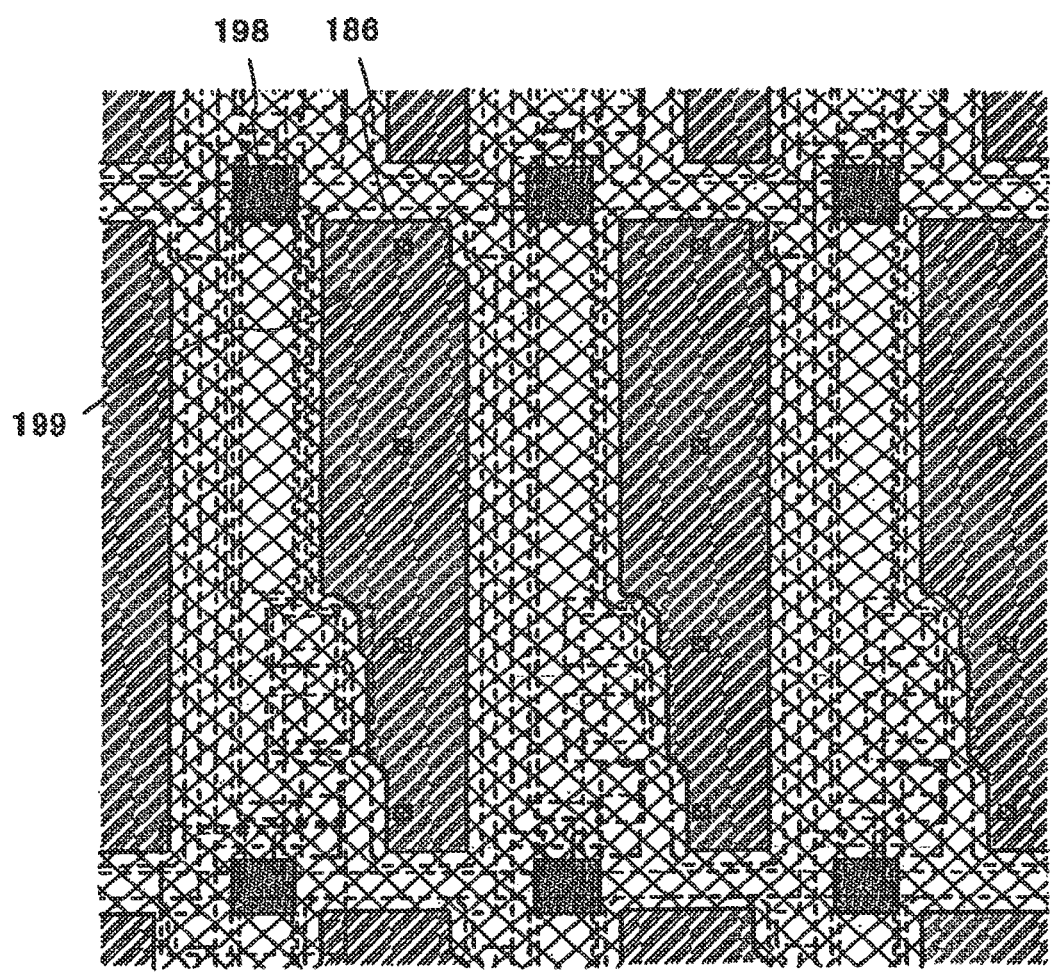

[FIG. 31]
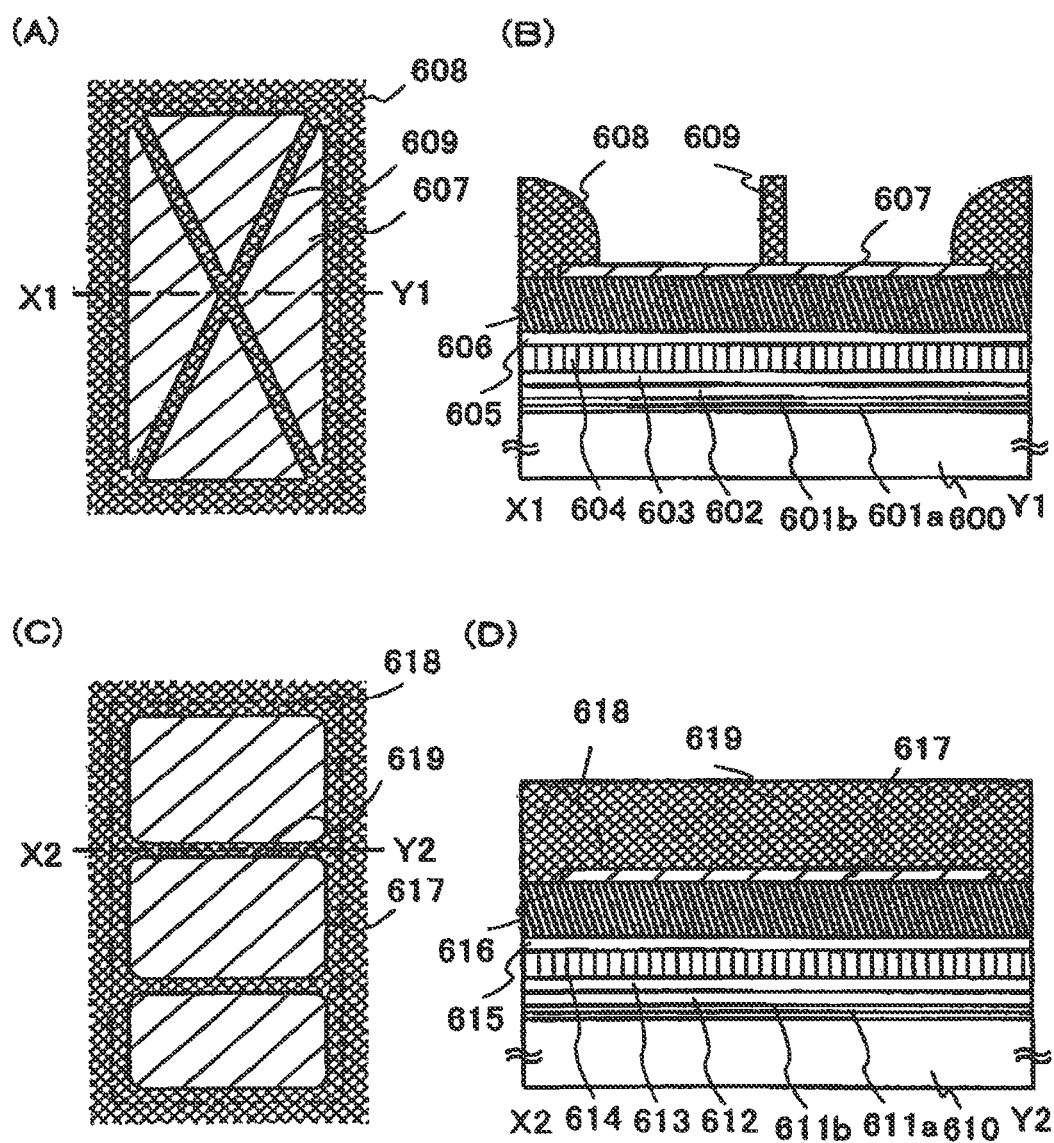

[Fig. 32]
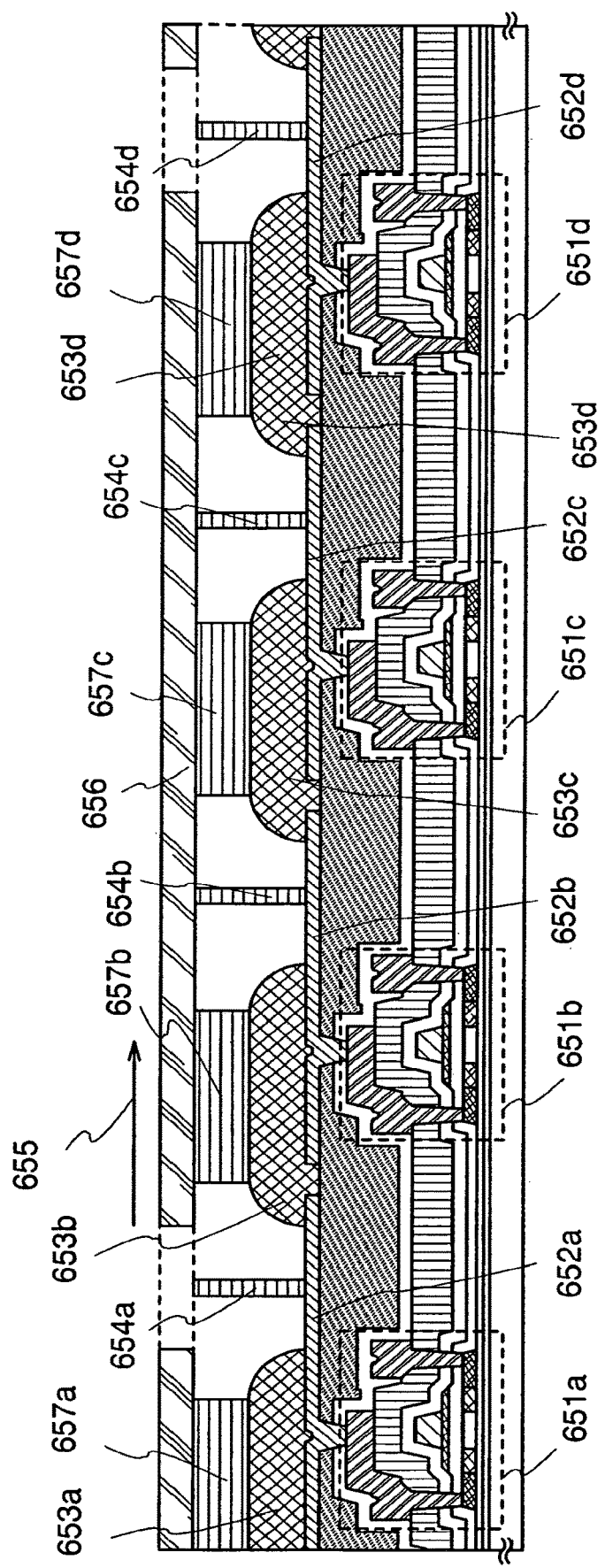

[FIG. 33]
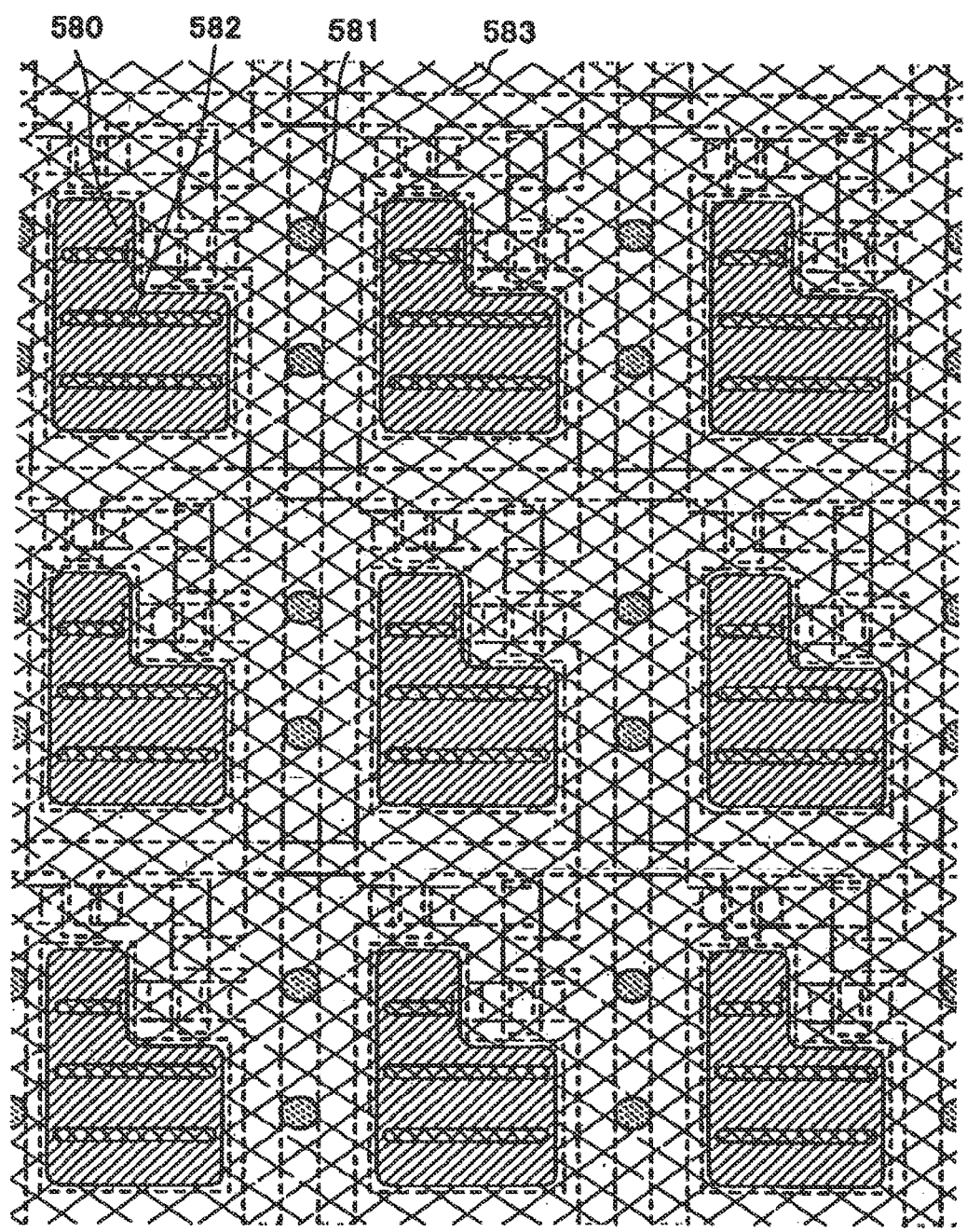

[FIG. 34]
(A)
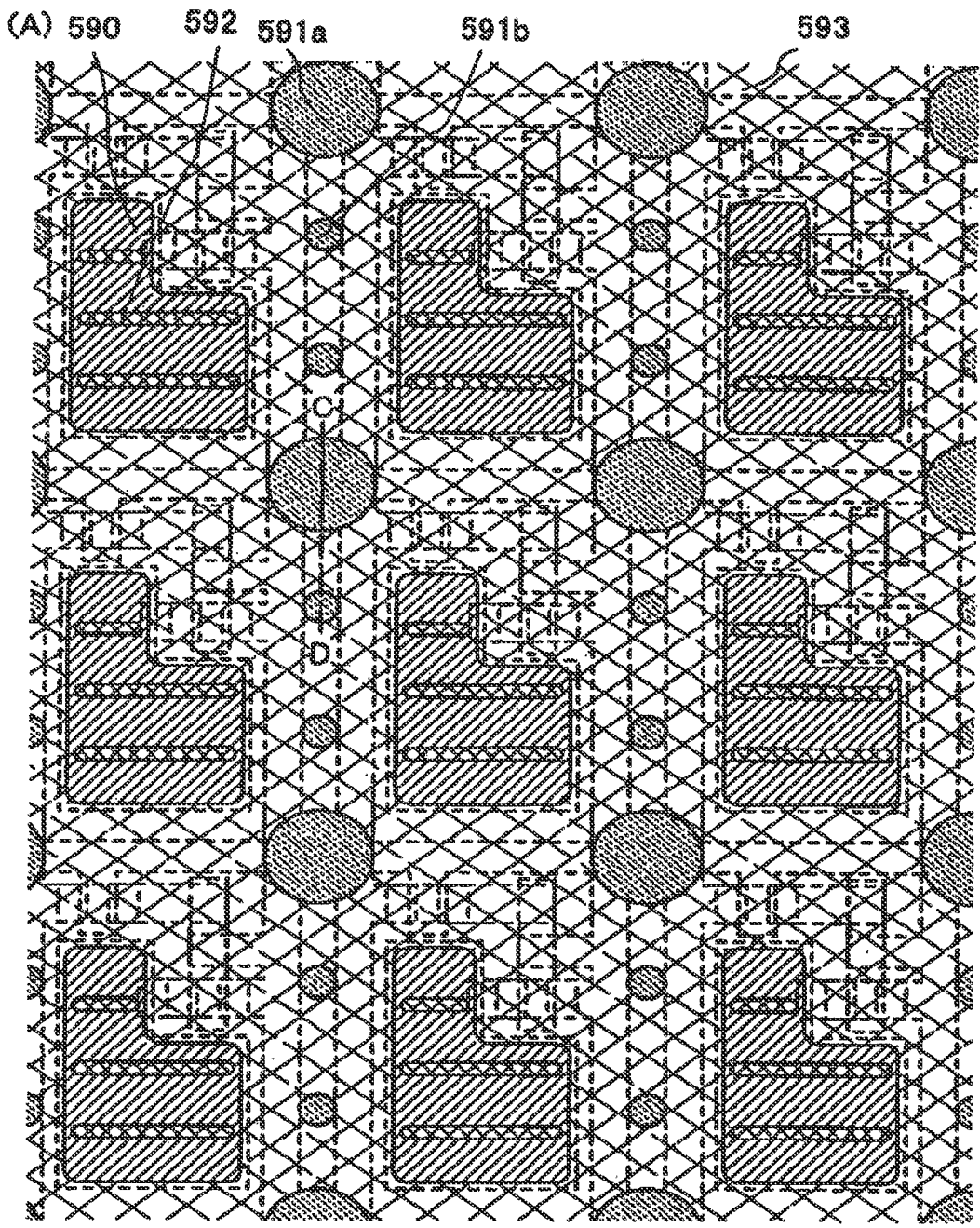
(B)
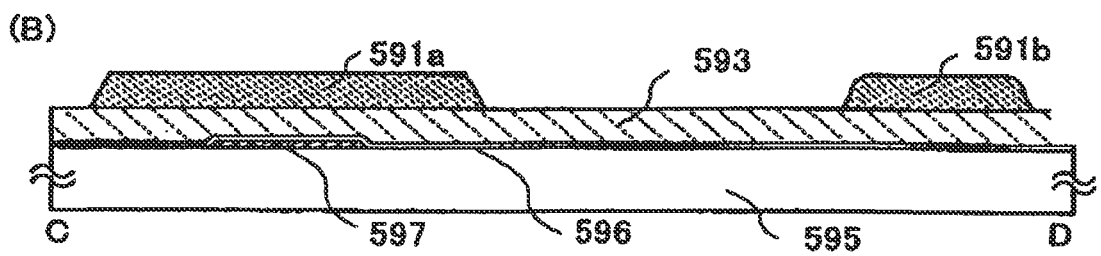

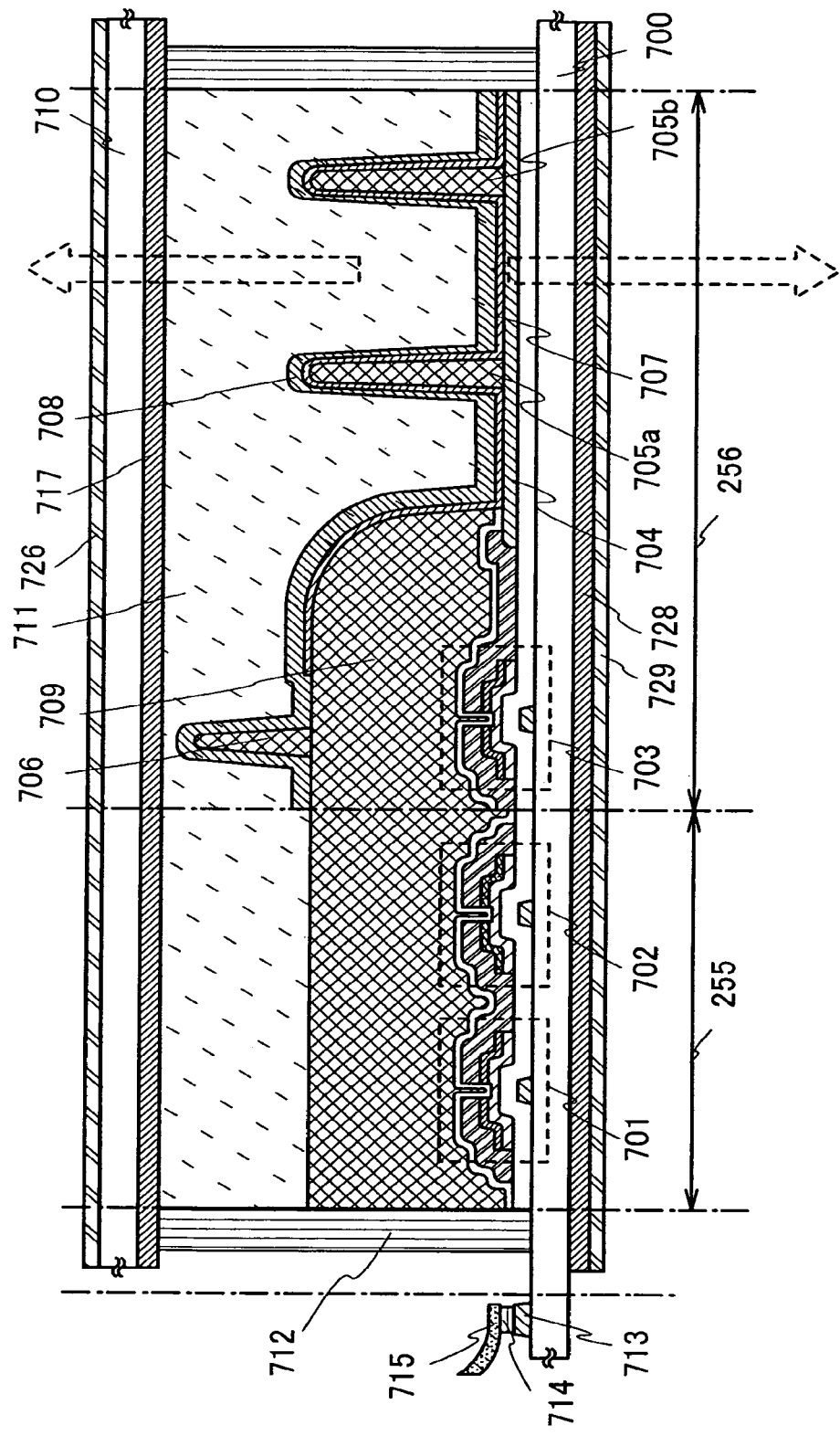
[Fig. 35]

DISPLAY DEVICE, ELECTRONIC APPARATUS, AND METHOD OF FABRICATING THE DISPLAY DEVICE

1. TECHNICAL FIELD

The present invention relates to a display device, an electronic apparatus, and a method of fabricating the display device.

2. BACKGROUND ART

In order to perform a full color display by a display device provided with an electroluminescence (hereinafter also referred to as EL) element, a color light emitting element which emits color light is used. One of important factors for forming a color light emitting element is to form a light emitting material of each color in a fine pattern over an electrode.

For the aforementioned purpose, generally used is a method for forming a fine pattern using a mask when forming a material using a vapor deposition method and the like.

However, there is a problem in that a defect occurs due to a precision and a deflection of a mask used in vapor deposition which is caused by the fineness of a pixel region in accordance with higher resolution and the large size of a substrate in accordance with a larger arm. A research aimed at high precision of a vapor deposition mask and high reliability has been reported (for example, see Japanese Patent Laid-Open No. 2000-129419.

SUMMARY OF THE INVENTION

The invention provides a technique to manufacture a display device having high resolution and high reliability with high yield without complicating steps and apparatus.

Means for Solving the Problem

The invention has spacers over a pixel electrode layer in a pixel region and over an insulating layer which functions as a partition covering the periphery of the pixel electrode layer. When forming a light emitting material over the pixel electrode layer, a mask for selective formation is supported by the spacers, thereby preventing the mask from contacting the pixel electrode layer due to a twist and deflection thereof. Accordingly, such damage as a crack by the mask does not occur in the pixel electrode layer. Thus, the pixel electrode layer does not have a defect in shapes, thereby a display device which performs a high resolution display with high reliability can be manufactured.

A display device to which the invention can be applied includes a light emitting display device in which a thin film transistor (hereinafter also referred to as a TFT) is connected to a light emitting element including electrodes and a layer containing an organic substance which emits light called electroluminescence or a mixture of organic and inorganic substances interposed therebetween.

One of the display devices of the invention has a first spacer over a first electrode layer, an insulating layer (insulator) covering an end portion of the first electrode layer, a second spacer over the insulating layer, an electroluminescent layer over the first electrode layer and the first spacer, and a second electrode layer over the electroluminescent layer.

One of the display devices of the invention has a first spacer over a first electrode layer, an insulating layer (insulator) covering an end portion of the first electrode layer, a second spacer over the insulating layer, an electroluminescent layer over the first electrode layer and the first spacer, and a second electrode layer over the electroluminescent layer, and the insulating layer and the first spacer are made of the same material.

One of the display devices of the invention has a first spacer over a first electrode layer, an insulating layer (insulator) coveting an end portion of the first electrode layer, a second spacer over the insulating layer, an electroluminescent layer over the first electrode layer and the first spacer, and a second electrode layer over the electroluminescent layer, and the first spacer and the second spacer are made of the same material.

According to the aforementioned structures, the first spacer and the insulating layer may be separated as in FIGS. 25 and 30 or continuously connected as in FIGS. 26 and 30. Similarly, the first spacer and the second spacer may be separated or continuously connected. When forming an electroluminescent layer over the first electrode layer which functions as a pixel electrode layer, the first spacer and the second spacer become spacers for a mask being used as well as function as spacers to prevent damage, and deformation of a display device due to external pressure or shocks even after forming the electroluminescent layer and sealing with a sealing substrate to complete the display device.

One of the methods for manufacturing a display device of the invention comprises: forming a first electrode layer, forming an insulating layer (insulator) covering an end portion of the first electrode layer and a first spacer over the first electrode layer, forming a second spacer over the insulating layer, forming, an electroluminescent layer over the first electrode layer and the first spacer, and forming a second electrode layer over the electroluminescent layer.

One of the methods for manufacturing a display device of the invention comprises: forming a first electrode layer, forming an insulating layer (insulator) coveting an end portion of the first electrode layer and a first spacer over the first electrode layer, providing a mask in contact with a second spacer, selectively forming an electroluminescent layer over the first electrode layer and the first spacer; and forming a second electrode layer over the electroluminescent layer.

One of the methods for manufacturing a display device of the invention comprises: forming a first electrode layer, forming an insulating layer (insulator) covering an end portion of the first electrode layer, forming a first spacer over the first electrode layer and a second spacer over the insulating layer, forming an electroluminescent layer over the first electrode layer and the first spacer, and forming a second electrode layer over the electroluminescent layer.

One of the methods for manufacturing a display device of the invention comprises: forming a first electrode layer, forming an insulating layer (insulator) covering an end portion of the first electrode layer, forming an insulating film (insulating layer) over the first electrode layer and the insulating layer, patterning the insulating film to form a first spacer over the first electrode layer and a second spacer over the insulating layer, forming an electroluminescent layer over the first electrode layer and the first spacer, and forming a second electrode layer over the electroluminescent layer.

One of the methods for manufacturing a display device of the invention comprises: forming a first electrode layer, forming an insulating layer (insulator) covering an end portion of the first electrode layer, forming a first spacer over the first electrode layer and a second spacer over the insulating layer, providing a mask in contact with the second spacer, selectively forming an electroluminescent layer over the first electrode layer and the first spacer, and forming a second electrode layer over the electroluminescent layer.

Effect of the Invention

When using the invention, a display device with high reliability can be manufactured by simplified steps. Therefore, a display device with high resolution and high image quality can be manufactured at low cost with high yield.

BRIEF DESCRIPTION OF THE DRAWINGS

FIG. 1 Diagrams illustrating a display device of the invention.
FIG. 2 Diagrams illustrating a method for manufacturing a display device of the invention.
FIG. 3 Diagrams illustrating a method for manufacturing a display device of the invention.
FIG. 4 Diagrams illustrating a method for manufacturing a display device of the invention.
FIG. 5 Diagrams illustrating a method for manufacturing a display device of the invention.
FIG. 6 Diagrams illustrating a method for manufacturing a display device of the invention.
FIG. 7 Diagrams illustrating a method for manufacturing a display device of the invention.
FIG. 8 A diagram illustrating a display device of the invention.
FIG. 9 A diagram illustrating a display device of the invention.
FIG. 10 Diagrams illustrating a display device of the invention.
FIG. 11 A diagram illustrating a display device of the invention.
FIG. 12 A diagram illustrating a display device of the invention.
FIG. 13 Diagrams illustrating structures of a light emitting element applicable to the invention.
FIG. 14 An equivalent circuit diagram of an EL display device illustrated in FIG. 15.
FIG. 15 A top plan view illustrating a display device of the invention.
FIG. 16 Top plan views each illustrating a display device of the invention.
FIG. 17 Top plan views each illustrating a display device of the invention.
FIG. 18 A top plan view of a display device of the invention.
FIG. 19 A diagram illustrating a droplet injection method applicable to the invention.
FIG. 20 Views each showing an electronic apparatus to which the invention is applied.
FIG. 21 Diagrams showing an electronic apparatus to which the invention is applied.
FIG. 22 A view showing an electronic apparatus to which the invention is applied.
FIG. 23 Views each showing an electronic apparatus to which the invention is applied.
FIG. 24 A diagram illustrating a display device of the invention.
FIG. 25 A top plan view of a display device of the invention.
FIG. 26 A top plan view of a display device of the invention.
FIG. 27 Top plan views each illustrating a display device of the invention.
FIG. 28 Diagrams each illustrating a display device of the invention.
FIG. 29 Diagrams illustrating a method for manufacturing a display device of the invention.
FIG. 30 A top plan view of a display device of the invention.
FIG. 31 Diagrams each illustrating a display device of the invention.
FIG. 32 A diagram illustrating a method for manufacturing a display device of the invention.
FIG. 33 A top plan view of a display device of the invention.
FIG. 34 Top plan views each of a display device of the invention.
FIG. 35 A diagram illustrating a display device of the invention.

DETAILED DESCRIPTION OF THE PREFERRED EMBODIMENTS

Embodiment modes of the invention are described in detail with reference to drawings. However, the invention is not limited to the following description and those skilled in the art easily understand that the modes and details can be varied, unless such changes and modifications depart from the theme and scope of the invention. Therefore, the invention is not construed limited in the description of the embodiment modes described below. Note that in the structure of the invention which is described below, the same reference numerals are used in common for identical portions or portions having a similar function in different drawings and repetitive descriptions thereof are omitted.

Embodiment Mode 1

A method for manufacturing a thin film transistor of this embodiment mode is described in details with reference to FIGS. 1 to 6, 16 and 17.

FIG. 16(A) is a top plan view showing a structure of a display panel in accordance with the invention, in which a pixel portion 2701 where pixels 2702 are arranged in matrix, a scan line side input terminal 2703, and a signal line side input terminal 2704 are formed over a substrate 2700 having an insulating surface. The number of pixels may be set in accordance with various standards, and 1024×768×3 (RGB) pixels may be provided in the case of XGA, 1600×1200×3 (RGB) pixels may be provided in the case of UXGA, and 1920×1080×3 (RGB) pixels may be provided in the case of corresponding to, a full spec high vision.

Scan lines extending from the scan line side input terminal 2703 and signal lines extending from the signal line side input terminal 2704 cross each other so that the pixels 2702 are disposed in matrix. Each pixel 2702 is provided with a switching element and a pixel electrode layer connected thereto. A typical example of the switching element is a TFT. A gate electrode layer side of the TFT is connected to the scan line, and a source or drain side thereof is connected to the signal line, thereby each pixel can be controlled independently by a signal inputted externally.

A semiconductor layer, a gate insulating layer and a gate electrode layer are major components of a TFT. A wiring layer connected to source and drain regions formed in the semiconductor layer is attached thereto. Typically known structures are a top gate type in which a semiconductor layer, a gate insulating layer, and a gate electrode layer are disposed from a substrate side, a bottom gate type in which a gate electrode layer, a gate insulating layer, and a semiconductor layer are disposed from a substrate side and the like, and any of the aforementioned structures may be used for the invention.

FIG. 16(A) shows a structure of a display panel in which signals inputted to the scan line and the signal line are controlled by an external driver circuit, however, a driver IC 2751 may be mounted on the substrate 2700 by a COG (Chip on Glass) method as shown in FIG. 17(A). Further, as another mode of mounting, a TAB (Tape Automated Bonding) method as shown in FIG. 17(B) may be used as well. A driver IC may be formed using a single crystalline semiconductor substrate or using a circuit thrilled with TFTs over a glass substrate. In FIG. 17, the driver IC 2751 is connected to an FPC (Flexible printed circuit) 2750.

Further, in the case of forming a TFT provided in a pixel using a semiconductor having crystallinity, a scan line side driver circuit 3702 can be formed over a substrate 3700 to be integrated as shown in FIG. 16(B). In FIG. 16(B), a pixel portion 3701 is controlled by an external driver circuit connected to a signal line side input terminal 3704 similarly to FIG. 16(A). In the case where a TFT provided in a pixel is formed using a polycrystalline (microcrystalline) semiconductor, a single crystalline semiconductor and the like with high mobility, a pixel portion 4701, a scan line driver circuit 4702, and a signal line driver circuit 4704 can be integrally formed over a substrate 4700 in FIG. 16(C).

As a base film over a substrate 100 having an insulating surface, a silicon nitride oxide film (SiNO) is used to form a base film 101a with a thickness of 10 to 200 nm (preferably 50 to 100 nm) and a silicon oxynitride film (SiON) is used to stack a base film 101b with a thickness of 50 to 200 nm (preferably 100 to 150 nm) by a sputtering method, a PVD method (Physical Vapor Deposition), a CVD method (Chemical Vapor Deposition) such as a low pressure CVD method (LPCVD method), or a plasma CVD method and the like. In this embodiment mode, the base film 101a and the base film 101b are formed using a plasma CVD method. As the substrate 100, a glass substrate, a quartz substrate, a silicon substrate, a metal substrate, or a stainless substrate each having a surface covered with an insulating film may be used. Further, a plastic substrate having heat resistance which can resist a processing temperature of this embodiment mode may be used or a flexible substrate such as a film may be used as all. As a plastic substrate, a substrate formed of PET (polyethylene terephthalate), PEN (polyethylene naphthalate), or PES (polyether sulfone) can be used while a synthetic resin such as acrylic may be used as a flexible substrate.

As a base film, silicon oxide, silicon nitride, silicon oxynitride, silicon nitride oxide and the like can be used, and a single layer or a stacked structure such as two layers or three layers may be as well. Note that in this specification, silicon oxynitride is a substance in which a composition ratio of oxygen is higher than a composition ratio of nitrogen and can also be referred to as silicon oxide containing nitrogen. Similarly, silicon nitride oxide is a substance in which a composition ratio of nitrogen is higher than a composition ratio of oxygen and can also be referred to as silicon nitride containing oxygen. In this embodiment mode, a silicon nitride oxide film is formed over the substrate with a thickness of 50 nm using $SiH_4$, $NH_3$, $N_2O$, $N_2$, and $H_2$ as a reaction gas, and a silicon oxynitride film is formed thereover with a thickness of 100 nm using $SiH_4$ and $N_2O$ as a reaction gas. Alternatively, the silicon nitride oxide film may be formed with a thickness of 140 nm and the silicon oxynitride film to be stacked may be formed with a thickness of 100 nm.

It is preferable to form a silicon nitride film or a silicon nitride oxide film with a thickness of 0.3 to 5 nm as a top layer of the base film in contact with the semiconductor layer. In this embodiment mode, a metal element (in this embodiment mode, nickel is used) for promoting crystallization is added to the semiconductor layer and thereafter removed by performing gettering process. Although an interface condition between a silicon oxide film and a silicon film is favorable, there may be a case where a metal element in the silicon film and oxygen in silicon oxide react in the interface to easily become a metal oxide (in this embodiment mode, nickel oxide ($NiO_x$)), thereby the metal element is not easily gettered. Moreover, it is concerned a silicon nitride film may adversely affect the interface condition with the semiconductor layer due to a stress of the silicon nitride film and an effect of a trap. Therefore, a silicon nitride film or a silicon nitride oxide film is formed with a thickness of 0.3 to 5 nm as a top layer of an insulating layer in contact with the semiconductor layer. In this embodiment mode, after stacking a silicon nitride oxide film and a silicon oxynitride film over the substrate 100, a silicon nitride oxide film is formed with a thickness of 0.3 nm to 5 nm over the silicon oxynitride film to form a stacked structure of three layers. With such a structure, a gettering efficiency of a metal element in the semiconductor layer increases and the adverse effect of the silicon nitride film on the semiconductor layer can be reduced. Further, the insulating layer to be stacked is preferably formed continuously by changing a reaction gas at the same temperature without breaking the vacuum in the same chamber. By continuously forming without breaking the vacuum, an interface between the stacked films can be prevented from contamination.

Subsequently, a semiconductor film is formed over the base film. The semiconductor film may be formed by a known means (a sputtering method, an LPCVD method, a plasma CVD method or the like) with a thickness of 25 to 200 nm (preferably 30 to 150 nm). In this embodiment mode, it is preferable to use a crystalline semiconductor film formed by laser crystallizing an amorphous semiconductor film.

A material for forming the semiconductor film includes an amorphous semiconductor (hereinafter also referred to as "amorphous semiconductor: AS") manufactured by a vapor deposition method or a sputtering method using a semiconductor material gas typified by silane and germane, a polycrystalline semiconductor which is obtained by crystalling an amorphous semiconductor using light energy or heat energy, a semi-amorphous (also referred to as microcrystal or fine crystal. Hereinafter also referred to as "SAS") semiconductor and the like.

The SAS is a semiconductor having an intermediate structure between amorphous and crystalline (including single crystalline and polycrystalline) structures and having a third state which is stable in free energy. Moreover, the SAS includes a crystalline region having a short range order and lattice distortion, and at least in a portion of a region in the film, a crystalline region of 0.5 to 20 nm can be observed. In the case of containing silicon as a main component, Raman spectrum is shifted toward a lower wavenumber than 520 $cm^{-1}$. Diffraction peaks of (111) and (220), which are believed to be derived from silicon crystal lattice, are observed by X-ray diffraction. Hydrogen or halogen is contained at least by 1 atom % or more for terminating dangling bonds (dangling bonds). The SAS is formed by decomposing a silicon source gas through glow discharge (plasma CVD). As the silicon source gas, $SiH_4$, as well as $Si_2H_6$, $SiH_2Cl_2$, $SiCl_4$, $SiF_4$ and the like can be used. Further, $F_2$ and $GeF_4$ may be mixed as well. The silicon source gas may be diluted with $H_2$ or a mixed gas of $H_2$ and one or more of rare gas elements selected from He, Ar, Kr, and Ne. A dilution ratio is set in a range of 2 to 1000 times, pressure is set in a range of approximately 0.1 Pa to 133 Pa, and a power supply frequency is set to 1 MHz to 120 MHz, preferably 13 MHz to 60 MHz. It is preferable that a temperature for heating the substrate be 300° C. or lower, but a temperature for heating the substrate may be 100 to 200° C. as well. Here, it is preferable that impurities derived from atmospheric components such as oxygen, nitrogen, and carbon as impurity elements which are introduced mainly at the film deposition be $1\times10^{20}$ cm$^{-3}$ or less. In particular, oxygen concentration is preferably $5\times10^{19}$/cm$^{-3}$ or less and more preferably $1\times10^{19}$/cm$^{-3}$ or less. Further, when a rare gas element such as helium, argon, krypton, or neon is included so that the lattice distortion is increased further and the stability is thus enhanced, a favorable SAS can be obtained. Moreover, as the semiconductor film, an SAS layer formed with a silicon source gas containing hydrogen may be stacked over an SAS layer formed with a silicon source gas containing fluorine.

As a typical amorphous semiconductor, there are hydrogenated amorphous silicon while as a typical crystalline semiconductor, there are polysilicon and the like. Polysilicon (polycrystalline silicon) includes what is called high temperature polysilicon using polysilicon as a main material which is formed at a processing temperature of 800° C. or higher, what is called low temperature polysilicon using polysilicon as a main material which is formed at a processing temperature of 600° C. or lower, polysilicon crystallized by adding an element which promotes crystallization and the like. It is needless to say that a semi-amorphous semiconductor or a semiconductor containing a crystal phase in a portion of a semiconductor film can be used as described above.

In the case of using a crystalline semiconductor film for the semiconductor film, a known method (a laser crystallization method, a thermal crystallization method, a thermal crystallization method using an element such as nickel which promotes crystallization and the like) may be used for a method for manufacturing the crystalline semiconductor film. Further, a microcrystalline semiconductor as an SAS may be crystallized by laser irradiation so that crystallinity thereof can be enhanced. In the case where an element which promotes crystallization is not introduced, the amorphous semiconductor film is heated at 500° C. for 1 hour in a nitrogen atmosphere to discharge hydrogen so that a hydrogen concentration of the amorphous semiconductor film is $1\times10^{20}$ atoms/cm$^3$ or lower before irradiating the amorphous semiconductor film with laser light. This is because if the amorphous semiconductor film containing a lot of hydrogen is irradiated with laser light, the amorphous semiconductor film may be broken. An annealing furnace, laser irradiation, irradiation of light emitted from a lamp (also referred to as lamp annealing) or the like can be used for the heat treatment for crystallization. As a heating method, there are RTA methods such as a GRTA (Gas Rapid Thermal Anneal) method and an LRTA (Lamp Rapid Thermal Anneal) method.

A method for introducing a metal element into the amorphous semiconductor film is not particularly limited as long as it is a method for making the metal element exist over a surface of the amorphous semiconductor film or inside thereof. For example, a sputtering method, a CVD method, a plasma treatment method (including a plasma CVD method), an adsorption method, or a method of applying a solution of metal salt can be used. Among these, a method of using a solution is easy and advantageous in that the concentration of the metal element can be easily controlled. Moreover, at this time, it is desirable to form an oxide film by UV light irradiation in an oxygen atmosphere, a thermal oxidation method, treatment with ozone water containing hydroxyl radical or hydrogen peroxide, or the like to improve wettability of a surface of the amorphous semiconductor to diffuse an aqueous solution over the entire surface of the amorphous semiconductor film.

By irradiation of a second harmonic to fourth harmonic laser light of a fundamental wave using a solid state laser capable of continuous oscillation, large grain crystals can be obtained. Typically, for example, it is desirable to use a second harmonic (532 nm) and third harmonic (355 nm) of an Nd:YVO$_4$ laser (fundamental wave is 1064 nm). Specifically, laser light emitted from the continuous oscillation. YVO$_4$ laser is converted into a harmonic by non-linear optical element, thereby laser light having an output of several W or higher is obtained. It is preferable to form laser light into a rectangular or elliptical shape on an irradiated surface by an optical system to irradiate a semiconductor film. An energy density at this time is required to be about 0.001 to 100 MW/cm$^2$ (preferably 0.1 to 10 MW/cm$^2$). Then, the semiconductor film is irradiated at a scan rate of about 0.5 to 2000 cm/sec (preferably 10 to 200 cm/sec).

It is preferable that a shape of a laser beam be linear. As a result, throughput can be improved. Furthermore a semiconductor film is preferably irradiated with laser at an incident angle θ (0<θ<90°), thereby an interference of the laser can be prevented.

Such laser and the semiconductor film are relatively scanned, thereby laser irradiation can be performed. Further, in the laser irradiation, a marker can be formed for overlapping beams at high precision and controlling a position to start laser irradiation and a position to finish laser irradiation. The marker may be formed over the substrate at the same time as the amorphous semiconductor film.

Note that a gas laser, a solid state laser, a copper vapor laser, a gold vapor laser and the like of continuous oscillation or pulsed oscillation can be used as a laser. As examples of a gas laser, there are an excimer laser, an Ar laser, a Kr laser, an He—Cd laser and the like while as examples of a solid state laser, there are a YAG laser, a YVO$_4$ laser, a YLF laser, a YAlO$_3$ laser, a Y$_2$O$_3$ laser, a glass laser, a ruby laser, an alexandrite laser, a Ti:sapphire laser and the like.

Moreover, the laser crystallization may be performed using laser light of pulsed oscillation at a repetition rate of 0.5 MHz or higher, which is a drastically higher range of repetition rates than a generally used range of repetition rates of several ten Hz to several hundred Hz. It is said that it takes several ten to several hundred nsec for a semiconductor film to be completely solidified after it is irradiated with laser light of a pulsed oscillation. Therefore, by using the aforementioned range of repetition rate the semiconductor film can be irradiated with the following pulse of the laser light after the semiconductor film is melted by the laser light until it is solidified. Accordingly, solid-liquid interface can be continuously moved in the semiconductor film, therefore, a semiconductor film having crystal grains that grow continuously in a scanning direction is formed. Specifically, an aggregate of contained crystal grains having widths of 10 to 30 μm in the scanning direction and widths of about 1 to 5 μm in a direction perpendicular to the scanning direction can be formed. By forming crystal grains of single crystal that extend long along the scanning direction, a semiconductor film which has almost no grain boundary at least in a channel direction of a thin film transistor can be formed.

Further, irradiation of laser light may be performed in an inert gas atmosphere such as rare gas or nitrogen. Therefore, roughness of a surface of the semiconductor film due to laser light irradiation can be suppressed, and variation of a threshold due to variation of interface state densities can be suppressed.

An amorphous semiconductor film may be crystallized by the combination of thermal treatment and laser light irradiation, or one of thermal treatment and laser light irradiation may be performed a plurality of times.

In this embodiment mode, an amorphous semiconductor film is formed over the base film 101$b$ and the amorphous semiconductor film is crystallized to form a crystalline semiconductor film. As the amorphous semiconductor film, amorphous silicon formed using a reaction gas of $SiH_4$ and $H_2$ is used. In this embodiment mode, the base film 101$a$, the base film 101$b$, and the amorphous semiconductor film are continuously formed by changing a reaction gas without breaking the vacuum in the same chamber at the same temperature of 330° C.

After removing an oxide film formed over the amorphous semiconductor film, an oxide film is formed with a thickness of 10 to 50 Å by UV light irradiation in an oxygen atmosphere, a thermal oxidization method, treatment with ozone water containing hydroxy radical or hydrogen peroxide, or the like. In this embodiment mode, Ni is used as an element for promoting crystallization. An aqueous solution containing 10 ppm of Ni acetate is applied by a spin coating method.

In this embodiment mode, after performing thermal treatment at 650° for 6 minutes by an RTA method, the oxide film formed over the semiconductor film is removed and laser light irradiation is performed. The amorphous semiconductor film is crystallized by the aforementioned crystallization treatment to form a crystalline semiconductor film.

In the case of performing crystallization using a metal element, a gettering step is performed for reducing or removing the metal element. In this embodiment mode, the metal element is captured using the amorphous semiconductor film as a gettering sink. First, an oxide film is formed over the crystalline semiconductor film by UV light irradiation in an oxygen atmosphere, a thermal oxidation method, treatment with ozone water containing hydroxyl radical or hydrogen peroxide, or the like. It is desirable that the oxide film be formed thicker by heat treatment. In this embodiment mode, after forming the oxide film, the oxide film is formed thicker by performing thermal treatment at 650° C. for 6 minutes by an RTA method. Subsequently, am amorphous semiconductor film is formed with a thickness of 30 nm by a plasma CVD method (with a condition of this embodiment mode as 350 W and 35 Pa).

After that, thermal treatment is performed at 650° C. for 6 minutes by an RTA method to reduce or remove the metal element. The thermal treatment may be performed in a nitrogen atmosphere. Then, the amorphous semiconductor film as a gettering sink and an oxide film formed over the amorphous semiconductor film are removed with hydrofluoric acid and the like, thereby a crystalline semiconductor film 102 in which the metal element is reduced or removed can be obtained (see FIG. 2(A)). In this embodiment mode, the amorphous semiconductor film as a gettering sink is removed using TMAH (Tetramethyl ammonium hydroxide).

The semiconductor film obtained in this manner may be doped with a slight amount of impurity elements (boron or phosphorus) for controlling a threshold voltage of a thin film transistor. This doping of impurity elements may be performed to an amorphous semiconductor film before a crystallization step. When impurity elements are doped in a state of the amorphous semiconductor film, the impurities can be activated by heat treatment for crystallization later. Further, a defect and the like generated at the doping can be improved as well.

Subsequently, the crystalline semiconductor film 102 is patterned using a mask. In this embodiment mode, after removing the oxide film formed over the crystalline semiconductor film 102, an oxide film is newly formed. Then, a photo mask is manufactured and a patterning process is applied using a photolithography method, thereby a semiconductor layer 103, a semiconductor layer 104, a semiconductor layer 105 and a semiconductor layer 106 are formed.

An etching process at the patterning may adopt either plasma etching (dry etching) or wet etching. However, in the case of processing a large area substrate, plasma etching is suitable. As an etching gas, a gas containing fluorine such as $CF_4$ and $NF_3$ or a gas containing chlorine such as $Cl_2$ and $BCl_3$ is used, to which an inert gas such as He and Ar may be appropriately added. Further, in the case of applying an etching process by atmospheric pressure discharge, local discharge processing can be realized, thereby a mask layer is not required to be formed over an entire surface of the substrate.

In the invention, a conductive layer for forming a wiring layer or an electrode layer, a mask layer for forming a predetermined pattern, or the like may be formed by a method where a pattern can be selectively formed such as a droplet discharge method. In the droplet discharge (ejecting) method (also referred to as an inkjet method depending on the system thereof), a predetermined pattern (a conductive layer, an insulating layer, and the like) can be formed by selectively discharging (ejecting) a droplet of a composition prepared for a specific purpose. At this time, a process for controlling wettability and adhesion may be performed to a region for forming a pattern. Additionally, a method for transferring or describing a pattern, for example, a printing method (a method for forming a pattern such as screen printing and offset printing) or the like can be used.

In this embodiment mode, a resin material such as an epoxy resin, an acrylic resin, a phenol resin, a novolac resin, a melamine resin, or a urethane resin is used for a mask to be used. Alternatively, the mask may be formed using an organic material such as benzocyclobutene, parylene, and polyimide having a transmitting property; a compound material formed by polymerization of siloxane polymers or the like; a composition material containing a water-soluble homopolymer and a water-soluble copolymer; and the like. In addition, a commercially available resist material containing a photosensitive agent may also be used. For example, a novolac resin and a naphthoquinonediazide compound that are a photosensitive agent, which are typical positive type resist; a base resin, diphenylsilanediol, an acid generating material that are a negative type resist, and the like may be used. In the case where a droplet discharge method is used, even when any material is used, the surface tension and the viscosity are appropriately adjusted by controlling the solvent concentration, adding a surfactant, or the like.

The oxide film over the semiconductor layer is removed to form a gate insulating layer 107 covering the semiconductor layer 103, the semiconductor layer 104, the semiconductor layer 105, and the semiconductor layer 106. The gate insulating layer 107 is formed of an insulating film containing silicon with a thickness of 10 to 150 nm using a plasma CVD method or a sputtering method. The gate insulating layer 107 may be formed of a known material such as an oxide material or nitride material of silicon, typified by silicon nitride, silicon oxide, silicon oxynitride, and silicon nitride oxide and may be stacked layers or a single layer. In this embodiment mode, three stacked layers of a silicon nitride film, a silicon oxide film, and a silicon nitride film are used for the gate insulating layer. Alternatively, a single layer of a silicon oxynitride film or stacked layers of two layers of the silicon oxynitride film and one of the aforementioned films may be employed, as well. Preferably, a silicon nitride film with a dense film quality may be used. Furthermore, a thin silicon oxide film may be formed between the semiconductor layer and the gate insulating layer with a thickness of 1 to 100 nm, preferably 1 to 10 nm, and more preferably 2 to 5 nm. As a method for forming the thin silicon oxide film, the surface of the semiconductor region is oxidized by a GRTA method, an LRTA method, or the like to form a thermal oxide film is formed, thereby a silicon oxide film with a thin thickness can be formed. Note that a rare gas element such as argon may be contained in a reaction gas so as to be mixed into an insulating film to be formed in order to form a dense insulating film having a little gate leak current at low film deposition temperature.

Subsequently, a first conductive film 108 with a thickness of 20 to 100 nm and a second conductive film 109 with a thickness of 100 to 400 nm, each of which is used as a gate electrode layer are stacked over the gate insulating layer 107 (see FIG. 2(B)). The first conductive film 108 and the second conductive film 109 can be formed by a known method such as a sputtering method, a vapor deposition method, or a CVD method. The first conductive film 108 and the second conductive film 109 may be formed of an element selected from tantalum (Ta), tungsten (W), titanium (Ti), molybdenum (Mo), aluminum (Al), copper (Cu), chromium (Cr), and neodymium (Nd), or an alloy material or compound material having the aforementioned element as a main component. Moreover, a semiconductor film typified by a polycrystalline silicon film which is doped with impurity elements such as phosphorus or an AgPdCu alloy may be used as the first conductive film 108 and the second conductive film 109. Further, the gate electrode layer is not limited to the two-layer structure, and for example, may have a three-layer structure in which a tungsten film with a thickness of 50 nm as the first conductive film, an alloy film of aluminum and silicon (Al—Si) with a thickness of 500 nm as the second conductive film, and a titanium nitride film with a thickness of 30 nm as the third conductive film are sequentially stacked. Moreover, in the case of the three-layer structure, tungsten nitride may be used instead of tungsten as the first conductive film; an alloy film of aluminum and titanium (Al—Ti) may be used instead of the alloy film of aluminum and silicon (Al—Si) as the second conductive film; or a titanium film may be used instead of the titanium nitride film as the third conductive film. Further, a single-layer structure may also be used. In this embodiment mode, tantalum nitride (TaN) is formed with a thickness of 30 nm as the first conductive film 108 and tungsten (W) is formed with a thickness of 370 nm as the second conductive film 109.

Subsequently, formed are a mask 110a, a mask 110b, a mask 110c, a mask 110d, and a mask 110f each of which is formed with a resist using a photolithography method and the first conductive film 108 and the second conductive film 108 are patterned to form a first gate electrode layer 121, a first gate electrode layer 122, a conductive layer 123, a first gate electrode layer 124, a first gate electrode layer 125, a first gate electrode layer 126, is conductive layer 111, a conductive layer 112, a conductive layer 113, a conductive layer 114, a conductive layer 115, and a conductive layer 116 (see FIG. 2(C)). The first gate electrode layer 121, the first gate electrode layer 122, the conductive layer 123, the first gate electrode layer 124, the first gate electrode layer 125, the first gate electrode layer 126, the conductive layer 111, the conductive layer 112, the conductive layer 113, the conductive layer 114, the conductive layer 115, and the conductive layer 116 can be etched to have a desired tapered shape by appropriately adjusting etching conditions (amount of power applied to a coiled electrode layer, amount of power applied to an electrode layer on a substrate side, electrode temperature on a substrate side, or the like) using an ICP (Inductively Coupled Plasma: inductively coupled plasma) etching method. Further, an angle and the like of the tapered shape can be controlled by the shapes of the mask 110a, the mask 110b, the mask 110c, the mask 110d, and the mask 110f. Note that as an etching gas, a chlorine-based gas typified by $Cl_2$, $BCl_3$, $SiCl_4$, $CCl_4$, or the like, a fluorine based gas typified by $CF_4$, $CF_5$, $SF_6$, $NF_3$, or the like, or $O_2$ can be appropriately used. In this embodiment mode, the second conductive film 109 is etched using an etching gas containing $CF_5$, $Cl_2$, and $O_2$ and then the first conductive film 108 is continuously etched using an etching gas containing $CF_5$ and $Cl_2$.

Subsequently, the conductive layer 111, the conductive layer 112, the conductive layer 113, the conductive layer 114, the conductive layer 115, and the conductive layer 116 are patterned using the mask 110a, the mask 110b, the mask 110c, the mask 110d, and the mask 110f. At this time, the conductive layers are etched with an etching condition of high selection ratio between the second conductive film 109 which forms the conductive layers and the first conductive film 108 which forms the first gate electrode layers. By this etching, the conductive layer 111, the conductive layer 112, the conductive layer 113, the conductive layer 114, the conductive layer 115, and the conductive layer 116 are etched to form a second gate electrode layer 131, a second gate electrode layer 132 a conductive layer 133, a second gate electrode layer 134, a second gate electrode layer 135, and a second gate electrode layer 136. In this embodiment mode, although a third conductive layer also has a tapered shape, the tapered angle thereof is larger than the tapered angle of the first gate electrode layer 121, the first gate electrode layer 122, the conductive layer 123, the first gate electrode layer 124, the first gate electrode layer 125, and the first gate electrode layer 126. Note that the tapered angle is a side angle to the surfaces of the first gate electrode layer, the second gate electrode layer, and the conductive layer. Accordingly, in the case where the tapered angle is increased to 90°, the conductive layer has a perpendicular side and no tapered shape. In this embodiment mode, $Cl_2$, $SF_6$, and $O_2$ are used as an etching gas to form the second gate electrode layers.

In this embodiment mode, each of the first gate electrode layer, the conductive layer, and the second gate electrode layer is formed to have a tapered shape, therefore, both of the two gate electrode layers have tapered shapes. However, the invention is not limited to this and one of the gate electrode layers may have a tapered shape while the other thereof may have a perpendicular side by anisotropic etching. As in this embodiment mode, the tapered angles may be different or the same between the stacked gate electrode layers. With a tapered shape, coverage of a film to be stacked thereover is improved and defects are reduced to improve reliability.

By the aforementioned steps, a gate electrode layer 117 formed of the first gate electrode layer 121 and the second gate electrode layer 131, and a gate electrode layer 118 formed of the first gate electrode layer 122 and the second gate electrode layer 132 can be formed in a peripheral driver circuit region 204; a gate electrode layer 127 formed of the first gate electrode layer 124 and the second gate electrode layer 134, a gate electrode layer 128 fined of the first gate electrode layer 125 and the second gate electrode layer 135, a gate electrode layer 129 formed of the first gate electrode layer 126 and the second gate electrode layer 136 can be formed in a pixel region 206; and a conductive layer 130 formed of the conductive layer 123 and the conductive layer 133 can be formed in a connecting region 205 (see FIG. 2(D)). In this embodiment mode, the gate electrode layers are for formed by dry etching, however, wet etching may be employed as well.

The gate insulating layer 107 may be etched to some extent and reduced in thickness (what is called film thickness reduction) by an etching step when forming the gate electrode layers.

When forming the gate electrode layer, by thinning a width of the gate electrode layer, a thin film transistor capable of high speed operation can be formed. Two methods by which a width of the gate electrode layer in a channel direction is formed thin are described as follows.

A first method is to form a mask for a gate electrode layer, and then, slim the mask in a width direction by etching, aching and the like to form a mask with a thinner width. By using a mask which is formed in advance to have a shape with a thinner width, the gate electrode layer can be formed in a shape with a thinner width as well.

Subsequently, a second method is to form a normal mask to form a gate electrode layer using the mask. Then, the obtained gate electrode layer is side-etched in a width direction to be thinned. Accordingly, a gate electrode layer with a thinner width can be formed finally. Through the aforementioned steps, a thin film transistor with a short channel length can be formed later so that a thin film transistor capable of high speed operation can be formed.

Subsequently, an impurity element 151 which imparts n type is added with the gate electrode layer 117, the gate electrode layer 118, the gate electrode layer 127, the gate electrode layer 128, the gate electrode layer 129, and the conductive layer 130 as masks to form a first n-type impurity region 140a, a first n-type impurity region 140b, a first n-type impurity region 141a, a first n-type impurity region 141b, a first n-type impurity region 142a, a first n-type impurity region 142b, a first n-type impurity region 142c, a first n-type impurity region 143a, and a first n-type impurity region 143b (see FIG. 3(A)). In this embodiment mode, doping is performed using phosphine (PH$_3$) (the composition rate of P is 5%) as a doping gas containing an impurity element at a gas flow rate of 80 sccm, a beam current of 54 µA/cm, an acceleration voltage of 50 kV, and an adding dosage of $7.0 \times 10^{13}$ ions/cm$^2$. Here, doping is performed so that the impurity element which imparts n type is contained at a concentration of about $1 \times 10^{17}$ to $5 \times 10^{18}$/cm$^3$ in the first n-type impurity region 140a, the first n-type impurity region 140b, the first n-type impurity region 141a, the first n-type impurity region 141b, the first n-type impurity region 142a, the first n-type impurity region 142b, the first n-type impurity region 142c, the first n-type impurity region 143a, and the first n-type impurity region 143b. In this embodiment mode, phosphorus (P) is used as the impurity element which imparts n type.

In this embodiment mode, regions of the impurity regions which overlap the gate electrode layers with the gate insulating layer interposed therebetween are denoted as Lov regions, while regions of the impurity regions which do not overlap the gate electrode layers with the gate insulating layer interposed therebetween are denoted as Loff regions. In FIG. 3A, the impurity regions are shown by hatching and blank spaces. However, this does not mean that impurity elements are not added to the blank spaces, but is for understanding intuitively that the concentration distribution of the impurity element in this region reflects the mask and the doping condition. Note that this is similar to other drawings of this specification.

Subsequently, a mask 153a, a mask 153b, a mask 153c, and a mask 153d which cover the semiconductor layer 103, a portion of the semiconductor layer 105 and the semiconductor layer 106 are formed. Using the mask 153a, the mask 153b, the mask 153c, the mask 153d, and the second gate electrode layer 132 as masks, an impurity element 152 which impacts n type is added to form a second n-type impurity region 144a, a second n-type impurity region 144b, a third n-type impurity region 145a, a third n-type impurity region 145b, a second n-type impurity region 147a, a second n-type impurity region 147b, a second n-type impurity region 147c, a third n-type impurity region 148a, a third n-type impurity region 148b, a third n-type impurity region 148c, and a third n-type impurity region 148d. In this embodiment mode, doping is performed using PH$_3$ (the composition rate of P is 5%) as a doping gas containing an impurity element at a gas flow rate of 80 sccm, a beam current of 540 µA/cm, an acceleration voltage of 70 kV, and an adding dosage of $5.0 \times 10^{15}$ ions/cm$^2$. Here, doping is performed so that the impurity element which imparts n type is contained at a concentration of about $5 \times 10^{19}$ to $5 \times 10^{20}$/cm$^3$ in the second n-type impurity region 144a and the second n-type impurity region 144b. The third n-type impurity region 145a and the third n-type impurity region 145b are formed to contain the impurity element which imparts n type at an approximately the same concentration as or a slightly higher concentration than the third n-type impurity region 148a, the third n-type impurity region 148b, the third n-type impurity region 148c, and the third n-type impurity region 148d. Further, a channel forming region 146 is formed in the semiconductor layer 104, and a channel forming region 149a and a channel forming region 149b are formed in the semiconductor layer 105.

The second n-type impurity region 144a, the second n-type impurity region 144b, the second n-type impurity region 147a, the second n-type impurity region 147b, and the second n-type impurity region 147c are high concentration n-type impurity regions which function as sources or drains. On the other hand, the third n-type impurity region 145a, the third n-type impurity region 145b, the third n-type impurity region 148a, the third n-type impurity region 148b, the third n-type impurity region 148c, and the third n-type impurity region 148d are low concentration impurity regions to be LDD (Lightly Doped Drain) regions. The n-type impurity region 145a and the n-type impurity region 145b covered with the first gate electrode layer 122 with the gate insulating layer 107 interposed therebetween are Lov regions which can alleviate an electric field around a drain and suppress a degradation of an on current due to a hot carrier. As a result, a thin film transistor capable of high speed operation can be formed. On the other hand, the third n-type impurity region 148a, the third n-type impurity region 148b, the third n-type impurity region 148c, and the third n-type impurity region 148d are formed in Loff regions which are net covered with the gate electrode layer 127 and the gate electrode layer 128, therefore, there are effects that an electric field around a drain can be alleviated and degradation due to a hot carrier injection can be prevented as well as an off current can be reduced. As a result, a semiconductor device with high reliability and low power consumption can be formed.

Subsequently, the mask 153a, the mask 153b, the mask 153c, and the mask 153d are removed and a mask 155a and a mask 155b to cover the semiconductor layer 103 and the semiconductor layer 103 are formed. By adding an impurity element 154 which impart p type with the mask 155a, the mask 155b, the gate electrode layer 117 and the gate electrode layer 129 as masks, a first p-type impurity region 160a, a first p-type impurity region 160b, a first p-type impurity region 163a, a first p-type impurity region 163b, a second p-type impurity region 161a, a second p-type impurity region 161b, a second p-type impurity region 164a, and a second p-type impurity region 164b are formed. In this embodiment mode, boron (B) is used as an impurity element, therefore, doping is performed using diborane ($B_2H_6$) (the composition rate of B is 15%) as a doping gas containing an impurity element at a gas flow rate of 70 sccm, a beam current of 180 µA/cm, an acceleration voltage of 80 kV, and an adding dosage of $2.0 \times 10^{15}$ ions/cm$^2$. Here, doping is performed so that the first p-type impurity region 160a, the first p-type impurity region 160b, the first p-type impurity region 163a, the first p-type impurity region 163b, the second p-type impurity region 161a, the second p-type impurity region 161b, the second p-type impurity region 164a, and the second p-type impurity region 164b contain the impurity element which imparts p type at a concentration of about $1 \times 10^{20}$ to $5 \times 10^{21}$/cm$^3$. In this embodiment mode, the second p-type impurity region 161a, the second p-type impurity region 161b, the second p-type impurity region 164a, and the second p-type impurity region 164b are formed in a self-aligned manner by reflecting the shapes of the gate electrode layer 117 and the gate electrode layer 129 to have a lower concentration than the first p-type impurity region 160a, the first p-type impurity region 160b, the first p-type impurity region 163a, and the first p-type impurity region 163b. Further, a channel forming region 162 is formed in the semiconductor layer 103 and a channel forming region 165 is formed in the semiconductor layer 106.

The second n-type impurity region 144a, the second n-type impurity region 144b, the second n-type impurity region 147a, the second n-type impurity region 147b, and the second n-type impurity region 147c are high concentration n-type impurity regions which function as sources or drains. On the other hand, the second p-type impurity region 161a, the second p-type impurity region 161b, the second p-type impurity region 164a, and the second p-type impurity region 164b are low concentration impurity regions to be LDD (LightlyDoped Drain) regions. The second p-type impurity region 161a, the second p-type impurity region 161b, the second p-type impurity region 164a, and the second p-type impurity region 164b covered with the first gate electrode layer 121 and the first gate electrode layer 126 with the gate insulating layer 107 interposed therebetween are Lov regions which can alleviate an electric field around a drain and suppress a degradation of an on current due to a hot carrier.

The mask 155a and the mask 155b are removed by $O_2$ ashing or a resist peeling solution, thereby the oxide film is also removed. After that, an insulating film, namely sidewalls may be formed so as to cover sides of the gate electrode layers. The sidewalls can be formed of an insulating film containing silicon using a plasma CVD method or a low pressure CVD (LPCVD) method.

In order to activate the impurity element, heat treatment, strong light irradiation, or laser light irradiation may be performed. At the same time as the activation, plasma damage to the gate insulating layer and plasma damage to an interface between the gate insulating layer and the semiconductor layer can be recovered.

Subsequently, an interlayer insulating layer which covers the gate electrode layer and the gate insulating layer is formed. In this embodiment mode, it is formed with a stacked-layer structure of the insulating film 167 and the insulating film 168 (see FIG. 4(A)). A silicon nitride oxide film is formed as the insulating film 167 with a thickness of 200 nm and oxynitride insulating film is formed as the insulating film 168 with a thickness of 800 nm to be a stacked-layer structure. Further, a stacked-layer structure of three layers may be employed by forming a silicon oxynitride film with a thickness of 30 nm, forming a silicon nitride oxide film with a thickness of 140 nm, and forming a silicon oxynitride film with a thickness of 800 nm while covering the gate electrode layer and the gate insulating layer. In this embodiment mode, the insulating film 167 and the insulating film 168 are continuously formed using a plasma CVD method similarly to the base film. The insulating film 167 and the insulating film 168 are not limited to a silicon nitride film and may be a silicon nitride oxide film, a silicon oxynitride film, or a silicon oxide film using a sputtering method or a plasma CVD method. Alternatively, a single-layer structure or a stacked-layer structure of three or more layers of other insulating film containing silicon may be employed as well.

Further, thermal treatment is performed in a nitrogen atmosphere at 300 to 550° C. for 1 to 12 hours, thereby a step of hydrogenating the semiconductor layer is performed, or preferably performed at 400 to 500° C. This step is a step of terminating dangling bonds in the semiconductor layer with hydrogen contained in the insulating film 167 which is an interlayer insulating layer. In this embodiment mode, heat treatment is performed at 410° C. (° C.).

The insulating film 167 and the insulating film 168 can be formed of a material selected from aluminum nitride (AlN), aluminum oxynitride (AlON), aluminum nitride oxide (AlNO) in which nitrogen content its more than oxygen content, aluminum oxide, diamond-like carbon (DLC), a nitrogen-containing carbon film (CN), polysilazane and other substance containing an inorganic insulating material. Further, a siloxane material (inorganic siloxane and organic siloxane) may be used as well. Moreover, an organic insulating material may be used, and polyimide, acrylic, polyamide, polyimide amide, resist, or benzocyclobutene can be used as an organic material. A coated film with a superior planarity by a coating method may be used as well.

Subsequently, contact holes (openings) reaching the semiconductor layer are formed in the insulating film 167 and the insulating film 168, and the gate insulating layer 107 using a mask composed of resist. Etching may be performed once or a plurality of times in accordance with a selection ratio of a material to be used. In this embodiment mode, first etching is performed with a condition that a selection ratio can be obtained between the insulating film 168 which is a silicon oxynitride film, the insulating film 167 which is a silicon nitride oxide film and the gate insulating layer 107, thereby the insulating film 168 is removed. Then, the insulating film 167 and the gate insulating layer 107 are removed by second etching to form openings reaching the first p-type impurity region 160a, the first p-type impurity region 160b, the first p-type impurity region 163a, the first p-type impurity region 163b, the second n-type impurity region 144a, the second n-type it region 144b, the second n-type impurity region 147a and the second n-type impurity region 147b which are source regions or drain regions. In this embodiment mode, the first etching is performed by wet etching while the second etching is performed by dry etching. A fluorine-based solution such as a mixed solution containing ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. Further, an inert gas may be added to an etching gas to be used. As an inert element to be added, one or a plurality of elements selected from He, Ne, Ar, Kr, and Xe can be used.

A conductive film formed so as to cover the openings, and the conductive film is etched to form a source electrode layer or a drain electrode layer 169a, a source electrode layer or a drain electrode layer 169b, a source electrode layer or a drain electrode layer 170a, a source electrode layer or a drain electrode layer 170b, a source electrode layer or a drain electrode layer 171a, a source electrode layer or a drain electrode layer 171b, a source electrode layer or a drain electrode layer 172a, a source electrode layer or a drain electrode layer 172b, and a wiring layer 156 which are electrically connected to a portion of each source region or dram region. The source electrode layer or drain electrode layer can be formed by forming a conductive film by a PVD method, a CVD method, a vapor deposition method and the like, and then etching the conductive film into a desired shape. Further, a conductive layer can be selectively formed in a predetermined place by a droplet discharge method, a printing method, an electrolytic plating method and the like. Furthermore, a reflow method and a damascene method may be used as well. The material of the source electrode layer or drain electrode layer is formed using a metal such as Ag, Au, Cu, Ni, Pt, Pd, Ir, Rh, W, Al, Ta, Mo, Cd, Zn, Fe, Ti, Si, Ge, Zr, and Ba, an alloy thereof or a metal nitride thereof. Further, a stacked-layer structure of these may be used as well. In this embodiment mode, titanium (Ti) is formed with a thickness of 100 nm, an alloy of aluminum and silicon (Al—Si) is formed with a thickness of 700 nm, and titanium (Ti) is formed with a thickness of 200 nm, and then patterned into a desired shape.

By the aforementioned steps, an active matrix substrate can be formed in which a p-channel thin film transistor 173 having a p-type impurity region in a Lov region and an n-channel thin film transistor 174 having an n-channel impurity region in a Lov region are formed in the peripheral driver circuit region 204, a conductive layer 177 is formed in the connecting region, and a multi-channel type n-channel thin film transistor 175 having an n-type impurity region in a Loff region and a p-channel thin film transistor 176 having a p-type impurity region in a Lov region are formed in the pixel region 206 (see FIG. 4(B)).

Then, the active matrix substrate can be used for a light emitting device having a self-luminous element, a liquid crystal display device having a liquid crystal element, and other display devices. Moreover, the active matrix substrate can be used for a semiconductor device such as various processors typified by a CPU (Central Processing Unit) and a card which incorporates an ID chip.

The invention is not limited to this embodiment mode, and a thin film transistor may have a single-gate structure in which one channel forming region is formed, a double-gate structure in which two channel forming regions are formed, or a triple-gate structure in which three channel forming regions are formed. Further, a thin film transistor in the peripheral driver circuit region may have a single-gate structure, a double-gate structure, or a triple-gate structure as well.

Note that the invention is not limited to the method for manufacturing a thin film transistor described in this embodiment mode, and can be applied to a top gate type (planar type), a bottom gate type (inverted stagger type), or a dual gate type in which two gate electrode layers are arranged at the top and bottom of a channel region with a gate insulating film interposed therebetween, or other structures.

Subsequently, an insulating film 180 and an insulating film 181 are formed as a second interlayer insulating layer (see FIG. 5(A)). FIG. 5 shows a manufacturing step of a display device, in which a separating region 201 for separating by scribing, an external terminal connecting region 202 which is an attached portion of an FPC, a wiring region 203 as a lead wiring region of a peripheral portion, a peripheral driver circuit region 204, a connecting region 205, and a pixel region 206 are provided. The wiring region 203 is provided with a wiring 179a and a wiring 179b, and the external terminal connecting region 202 is provided with a terminal electrode layer 178 connected to an external terminal.

The insulating film 180 and the insulating film 181 can be formed of a material selected from silicon wide, silicon nitride, silicon oxynitride, silicon nitride oxide, aluminum nitride (AlN), aluminum oxynitride (AlON), aluminum nitride oxide (AlNO) in which nitrogen content is more than oxygen content, aluminum oxide, diamond-like carbon (DLC), a nitrogen-containing carbon film (CN), PSG (phosphorous silicate glass), BPSG (boron phosphorous silicon glass), alumina film, polysilazane, and other substance containing an inorganic insulating material. Further, a siloxane resin may be used as well. Note that the siloxane resin corresponds to a resin including a Si—O—Si bond. Siloxane is composed of a skeleton structure formed by the bond of silicon (Si) and oxygen (O), in which an organic group containing at least hydrogen (such as an alkyl group or aromatic hydrocarbon) is used as a substituent. Alternatively, a fluoro group may be used as the substituent. Further alternatively, a fluoro group and an organic group containing at least hydrogen may be used as the substituent. Moreover, an organic insulating material may be used, and polyimide, acrylic, polyamide, polyimide amide, resist, benzocyclobutene, or a low dielectric organic insulating material can be used as an organic material which is either photosensitive or non-photosensitive.

In this embodiment mode, a silicon oxynitride film is formed with a thickness of 200 nm as the insulating film 180 using a CVD method. As an interlayer insulating layer provided for planarization, high heat resistance, high insulation, and high planarization ratio are required so that it is preferable to use a coating method typified by a spin coating method as a method for forming of the insulating films 181.

In this embodiment mode, a coated film using a siloxane resin material is used as a material of the insulating film 181. A film after being fired can be called a silicon oxide film $(SiO_x)$ (x, y=1, 2 . . . ) including an alkyl group. The silicon oxide film including the alkyl group can resist to even heat treatment of 300° C. or higher.

The insulating film 180 and the insulating film 181 can be formed by adopting dipping, spray application, a doctor knife, a roll coater, a curtain coater, a knife coater, a CVD method, a vapor deposition method and the like. The insulating film 180 and the insulating film 181 may be formed by a droplet discharge method. In the case of using the droplet discharge method, a material liquid can be saved. Further, a method for transferring or drawing a pattern similarly to the droplet discharge method, for example a priming method (a method for forming a pattern such as screen printing and offset printing) and the like can be used as well.

Subsequently, as shown in FIG. 5(B), openings are formed in the insulating film 180 and the insulating film 181 which are the second interlayer insulating layer. The insulating film 180 and the insulating film 181 are required to be etched in a wide area in the connecting region 205, the wiring region 203, the external terminal connecting region 202, the separating region 201 and the like. However, in the pixel region 206, an opening area is extremely small and minute compared to an opening area of the connecting region 205 and the like. Therefore, a photolithography step of forming an opening in the pixel region and a photolithography step of forming an opening in the connecting region are provided to widen margin of etching conditions. As a result, yield can be improved. Further, by widening the margin of etching conditions, a contact hole formed in the pixel region can be formed at high precision.

Specifically, wide area openings are formed in the insulating film 180 and the insulating film 181 which are provided in a part of the connecting region 205, the wiring region 203, the external terminal connecting region 202, the separating region 201, and the peripheral driver circuit region 204. Therefore, a mask is formed to cover the insulating film 180 and the insulating film 181 in the pixel region 206, a part of the connecting region 205, and a part of the peripheral driver circuit region 204. A parallel plate RIE device and an ICP etching device can be used for etching. Note that etching time may be long enough to over etch the wiring layer and the first interlayer insulating layer. With such degree of overetching, thickness variation and etching rate variation in a substrate can be reduced. In this manner, an opening 182 and an opening 183 are formed in the connecting region 205 and the external terminal connecting region 202 respectively.

After that, as shown in FIG. 5(B), a minute opening, that is a contact bole is formed in the insulating film 180 and the insulating film 181 of the pixel region 206 (see FIG. 5(C)). At this time, a mask is formed to cover the pixel region 206, a part of the connecting region 205, the peripheral driver circuit region 204, and the pixel region 206. The mask is a mask for forming an opening in of the pixel region 206 and a minute opening is provided in a predetermined place. As such a mask, for example, a resist mask can be used.

Then, the insulating film 180 and the insulating film 181 are etched using a parallel plate RIE device. Note that etching time may be long enough to overetch the wiring layer and the first interlayer insulating layer. With such degree of overetching in this manner, thickness variation and etching rate variation in a substrate can be reduced.

Further, an ICP device may be used for an etching device. In the above steps, an opening 184 reaching the source electrode or the drain electrode layer 172a is formed in the pixel region 206. In the invention, the source electrode or the drain electrode layer 172a is formed to cover the gate electrode layer 126 of the thin film transistor 176 in which many thin films are stacked with a large total thickness with the insulating film 167 and the insulating film 168 interposed therebetween. Therefore, the opening 184 is not required to be opened with a deep thickness, thereby an opening step can be shortened to improve controllability. Further, since an electrode layer formed in the opening is also not required to widely cover an opening with a large angle, excellent coverage can be obtained and reliability can be improved.

In this embodiment mode, although description is made on the case where the insulating film 180 and the insulating film 181 are etched with the mask which covers a part of the connecting region 205, the wiring region 203, the external terminal connecting region 202, the separating region 201, and the peripheral driver circuit region 204 and is provided with a predetermined opening in the pixel region 206, the invention is not limited thereto. For example, since the opening of the connecting region 205 has a large area, an etching amount thereof is large. Such opening of a large area may be etched a plurality of times. Further, in the case of forming a deep opening compared to other opening portions, etching may be performed a plurality of times similarly. Therefore, the insulating film 180 and the insulating film 181 may be etched using the mask provided with a predetermined opening in the connecting region 205 and the pixel region 206 while covering only the insulating film 180 and the insulating film 181 in a part of the wiring region 203, the external terminal connecting region 202, the separating region 201, and the peripheral driver circuit region 204. In the case of etching using such a mask, the insulating film 180 and the insulating film 181 in the connecting region 205 are etched in further depth to be etched until the insulating film 168 is exposed.

Further, in this embodiment mode, although the formation of the openings in the insulating film 180 and the insulating film 181 is separately conducted a plurality of times as shown in FIGS. 5(B) and (C), the formation of the openings in the insulating film 180 and the insulating film 181 may be performed by one etching step. In this case, etching is performed using an ICP device with an ICP power of 7000 W, bias power of 1000 W, a pressure of 0.8 Pascal (Pa), $CF_4$ of 240 sccm and 0.2 of 160 sccm as etching gas. The bias power is preferably 1000 to 4000 W. Since openings can be formed by one etching step, there is an advantage in that a step can be simplified.

Subsequently, a first electrode layer 185 (also referred to as a pixel electrode layer) is formed in contact with the source electrode layer or drain electrode layer 172a. The first electrode layer functions as an anode or cathode, and may be formed using an element selected from Ti, Ni, W, Cr, Pt, Zn, Sn, In, or Mo, TiN, $TiSi_xN_y$, $WSi_x$, $WN_x$, $WSi_xN_y$, NbN, a film which is mainly formed of an alloy material or compound material containing the aforementioned material as a main component, or stacked films thereof with a total thickness of a range of 100 to 800 nm.

A structure in this embodiment mode includes a light emitting element used as a display element and light from the light emitting element is extracted from the first electrode layer 185 side, therefore, the first electrode layer 185 has a light transmitting property. A transparent conductive film is formed as the first electrode layer 185 and then etched into a desired shape to form the first electrode layer 185. Indium tin oxide containing silicon oxide (also referred to as indium tin oxide containing silicon oxide and hereinafter referred to as "ITSO"), zinc oxide, tin oxide, indium oxide and the like may be used as the first electrode layer 185 used in the invention. Besides, a transparent conductive film such as indium oxide zinc oxide alloy in which zinc oxide (ZnO)

of 2 to 20% is mixed in indium oxide and the like can be used. As the first electrode layer 185, a titanium nitride film or a titanium film may be used as well as the aforementioned transparent conductive film. In this case, after forming a transparent conductive film, a titanium nitride film or a titanium film is formed with a thickness enough to transmit light (preferably about 5 nm to 30 nm). In this embodiment mode, ITSO using indium tin oxide and silicon oxide is used as the first conductive layer 185. In this embodiment mode, an ITSO film is formed with a thickness of 185 nm using a target in which silicon oxide ($SiO_2$) of 1 to 10 [%] is mixed in indium tin oxide at an Ar gas flow rate of 120 sccm, an $O_2$ gas flow rate of 5 sccm, a pressure of 0.25 Pa, and a power of 3.2 kW by a sputtering method. The first electrode layer 185 may be swabbed and polished with a polyvinyl alcohol-based porous media by a CMP method to planarize the surface thereof. Further, after the polish using a CMP method, UV light irradiation, oxygen plasma treatment and the like may be applied to the surface of the first electrode layer 185.

After forming the first electrode layer 185, heat treatment may be performed. By the heat treatment, moisture contained in the first electrode layer 185 is discharged. Therefore, the first electrode layer 185 does not generate degasification and the like, thereby a light emitting material is not deteriorated even when a light emitting material which is easily deteriorated by moisture is formed over the first electrode layer. Thus, a display device with high reliability can be manufactured. In this embodiment mode, ITSO is used for the first electrode layer 185, thereby not crystallized unlike ITO (indium oxide tin oxide alloy) even when baked and remain in an amorphous state. Therefore, ITSO has higher planarity than ITO and does not easily generate a short circuit with a cathode even when a layer containing an organic compound is thin.

Subsequently, an insulator (insulating layer) 186 (also referred to as a bank, a partition, a barrier, an embankment, and the like) is formed to cover an end portion of the first electrode layer 185, and the source electrode layers or drain electrode layers (see FIG. 6(B)). Further, an insulator (insulating layer) 187*a* and an insulator (insulating layer) 187*b* are formed in the external terminal connecting region 202 by the same step.

In order to perform a full color display, electroluminescent layers for emitting light of RGB are required to be formed separately when forming an electroluminescent layer over the first electrode layer. Therefore, when forming an electroluminescent layer of another color, the pixel electrode layer (the first electrode layer) for the color is covered with a mask. The mask may in a form of a film formed of a metal material and the like. At this time, although the mask is provided over the insulator 186 which becomes a partition and supported, the mask may contact the pixel electrode layer by a deflection or a twist, and may cause a crack in the pixel electrode layer. When the pixel electrode layer has a defect in shapes by a crack and the like, a light emission defect, a display defect and the like are caused to decrease image quality. Therefore, reliability and performance may also be degraded.

In this embodiment mode, a spacer 199 is formed with an equivalent thickness to that of the insulator 186 over the first electrode layer 185 which is a pixel electrode layer. By the spacer 199, a mask which is used in vapor deposition of the electroluminescent layer is supported so that the mask is not in contact with the first electrode layer. Therefore, a shape defect of the first electrode layer by the mask is prevented so that the first electrode layer does not generate a fight emission defect and a display defect, and a display device with high reliability and high image quality can be provided.

In this embodiment mode, although the spacer 199 is formed of the same material and by the same step as the insulator 186 which is a partition, another step may be employed as well. The shape and size of the spacer are not limited, and they may be set in consideration of the size, aperture ratio and the like of the pixel region. In this embodiment mode, the spacer has a columnar shape of which a top portion has a round shape like a hemisphere as shown in FIG. 6(B), of which height is 1 to 2 μm (preferably 1 to 1.5 μm).

An example of the shape of a spacer is described with reference to FIGS. 31 and 28. As shown in FIGS. 28 and 31, an insulator (insulating layer) which is a partition and a spacer may be continuously connected to be formed. FIGS. 31(A), (C), 28(A) and (C) are top plan views of a pixel region. FIGS. 31(B), (C), 28(B) and (D) are cross sectional diagrams along lines X1-Y1, X2-Y2, X3-Y3, and X4-Y4 of FIGS. 31(A), (C), 28(A) and (C) respectively. In FIGS. 31(A) and (B), a first electrode layer 607 which is a pixel electrode layer is formed over a substrate 600, a base film 601*a*, a base film 601*b*, a gate insulating layer 602, an insulating film 603, an insulating film 604, an insulating film 605, and an insulating film 606. An insulator (insulating layer) 608 which is a partition is formed to cover an end portion of the first electrode layer 607, and a spacer 609 is formed of the same material and by the same step as the insulator 608.

In FIGS. 31(A) and 31(B), the spacer 609 is formed to be in contact with the insulator 608. The spacer 609 is continuously formed so as to cross over the first electrode layer, the first electrode layer 607 diagonally. When continuously forming the spacer 609 in this manner, a mask is always supported by the spacer 609 while being moved, thus it can be prevented that the mask contacts the first electrode layer 607 and the first electrode layer 607 has a defect in shapes.

In FIGS. 31(C) and (D), a first electrode layer 617 which is a pixel electrode layer is formed over a substrate 610, a base film 611*a*, a base film 611*b*, a gate insulating layer 612, insulating film 613, an insulating film 614, an insulating film 615, and an insulating film 616. An insulator (insulating layer) 618 which is a partition is formed to cover an end portion of the first electrode layer 617, and a spacer 619 is formed of the same material and by the same step as the insulator 618.

In FIGS. 31(C) and (D), the spacer 619 is formed to be in contact with the insulator 618. The spacer 619 is continuously formed at two places so as to cross over the first electrode layer, the first electrode layer 617 in a short side direction thereof. When continuously forming the spacer 619 at a plurality of places in this manner, a mask is always supported by the spacer 619 while being moved, thus it can be prevented that the mask contacts the first electrode layer 617 and the first electrode layer 617 has a defect in shapes.

In FIGS. 28(A) and (B), a first electrode layer 627 which is a pixel electrode layer is formed over a substrate 620, a base film 621*a*, a base film 621*b*, a gate insulating layer 622, an insulating film 623, an insulating film 624, an insulating film 625, and an insulating film 626. An insulator (insulating layer) 628 which is a partition is formed to cover an end portion of the first electrode layer 627, and a spacer 629 is formed of the same material and by the same step as the insulator 628.

In FIGS. 28(A) and (B), the spacer 629 is formed to be in contact with the insulator 628. The spacer 629 is continuously formed so as to cross over the first electrode layer, the first electrode layer 627 in a long side direction and a short side direction thereof in a lattice shape. When continuously forming the spacer 629 in a lattice shape in this manner, a mask is always supported by the spacer 629 while being moved, thus it can be prevented that the mask contacts the first electrode layer 627 and the first electrode layer 627 has a defect in shapes.

In FIGS. 8(C) and (D), a first electrode layer 637 which is a pixel electrode layer is formed over a substrate 630, a base film 631a, a base film 631b, a gate insulating layer 632, and an insulating film 633, an insulating film 634, an insulating film 635, and an insulating film 636. An insulator (insulating layer) 638 which is a partition is formed to cover an end portion of the first electrode layer 637, and a spacer 639 is formed of the same material and by the same step as the insulator 638.

In FIGS. 28(C) and (D), the spacer 639 is formed to be in contact with the insulator 638. The spacer 639 is limited so as to obliquely cross over the first electrode layer 637 a plurality of times relatively to an interface with the insulator 638. In this embodiment mode, an angle between a short axis of the interface between the first electrode layer 637 and the insulator and the spacer 639 is 45°. When continuously forming the spacer 639 in this manner, a mask is always supported by the spacer 639 while being moved, thus it can be prevented that the mask contacts the first electrode layer 637 and the first electrode layer 637 has a defect in shapes.

As shown in FIG. 28(B), the spacer 629 has a tapered shape. In this manner, the spacer may be in an approximate rectangular parallelepiped as shown in FIGS. 31(B) and 28(D) or may have various shapes such as a columnar shape, a prism, a cone, a pyramid, and a tapered shape.

The spacer is formed in contact with the insulator (insulating layer) which is a partition in FIGS. 31 and 28, however, it may be separated from the insulator without contact.

The spacer can be formed of an inorganic insulating material such as silicon oxide, silicon nitride, silicon oxynitride, aluminum oxide, aluminum nitride, and aluminum oxynitride, or acrylic acid, methacrylic acid, and a derivative thereof, or heat-resistant polymers such as polyimide (polyimide), aromatic polyamide, and polybenzoimidazole (polybenzoimidazole), or an insulating material such as a siloxane resin. In this embodiment mode, acrylic is used for the spacer 199.

In this embodiment mode, as is used for the insulator 186. Further, if the insulator 186 is formed using the same material and by the same step as the insulating film 181, manufacturing cost can be reduced. Moreover, cost can be reduced by using a coating deposition apparatus, an etching apparatus and the like in common.

The insulator 186 can be formed of an inorganic insulating material such as silicon oxide, silicon nitride, silicon oxynitride, aluminum oxide, aluminum nitride, and aluminum oxynitride, or acrylic acid, methacrylic acid, a derivative thereof, or a heat-resistant polymers such as polyimide (polyimide), aromatic polyamide, or polybenzimidazole (polybenzimidazole), or an insulating material such as a siloxane resin. Alternatively, the insulator 186 may be formed using a photosensitive or non-photosensitive material such as acrylic or polyimide. The insulator 186 preferably has a shape that a curvature radius thereof continuously changes. Accordingly, coverage of an electroluminescent layer 188 and a second electrode layer 189 to be formed thereover is improved.

In the connecting region 205, the insulator 186 is formed to cover the end portion of the insulating film 180 and the insulating film 181 on a side face of the opening 182. Due to steep steps of the end portions of the insulating film 180 and the insulating film 181 each formed to have a step by patterning, the coverage of the second electrode layer 189 to be stacked thereover is unfavorable. Therefore, as in the invention, by covering the steps in the periphery of the opening with the insulator 186 to planarize the steps, the coverage of the second electrode layer 189 to be stacked can be improved. In the connecting region 205, a wiring layer formed of the same material and by the same step as the second electrode, layer is electrically connected to the wiring layer 156. In this embodiment mode, the second electrode layer 189 is electrically connected to the wiring layer 156 directly, however, they may be electrically connected with another wiring interposed therebetween.

In the invention, a spacer 198 is formed over the insulator 186 which functions as a partition. Similarly to the spacer 199 formed over the pixel electrode layer, a mask which is used in vapor deposition of the electroluminescent layer is supported by the spacer 198 so that this spacer is also not in contact with the first electrode layer. It is preferable that the spacer 198 formed over the insulator 186 be not formed over a thin film transistor, which can prevent a defect such as electrostatic discharge damage. Note that the spacer 199 formed over the pixel electrode layer and the spacer 198 formed over the insulator 186 can also be called a first spacer and a second spacer respectively. Therefore, aa mask is supported by the first spacer and the second spacer, thereby the first electrode layer is prevented from having a defect in shapes by the mask so that the first electrode layer does not generate a light emission defect and a display defect. Thus, a display device with high reliability and high image quality can be provided.

The insulator 186, the spacer 199, and the spacer 198 can be formed by dipping, spray application, a doctor knife, a roll coater, a curtain coater, a knife coater, a CVD method, a vapor deposition method and the like. The insulator 186, the spacer 199, and the spacer 198 may be formed by a droplet discharge method. In the case of using the droplet discharge method, a material liquid can be saved. Further, a method for transferring or drawing a pattern like the droplet discharge method, for example a printing method (a method for forming a pattern such as screen printing and offset panting) and the like can be used as well.

Moreover, after forming the insulator 186, the spacer 199, and the spacer 198, the surfaces thereof may be pressed by pressure to be planarized so as to increase the planarity. As a method for pressing, a roller type press may be scanned over the surface to reduce an asperity, or the surface may be perpendicularly pressed with a plane board type press. In pressing, a heating step may be performed. Further, the surface may be softened or melted with a solvent and the like and the asperity of the surface may be removed with an air knife. Furthermore, a CMP method may be used to polish.

The spacer 198 may be formed of the same material and by the same step as the spacer 199, or may be formed by another step as in this embodiment mode. The shape and size of the spacer are not limited, and they may be set in consideration of the size, a mask material, thickness, and the like of the pixel region. In this embodiment mode, the spacer has a columnar shape of which a top portion has a round shape like a hemisphere as shown in FIG. 6(B), of which height is 1 to 3 μm (preferably 1.5 or more and 2 μm or less). Further, in the case of forming the spacer 198 and the spacer 199 with different materials and steps, spacers having different shapes and thickness can be freely formed. In this embodiment mode, although a height from the substrate 100 to the top surface of the spacer 198 and a height from the substrate 100 to the top surface of the spacer 199 are different from each other, they can be approximately the same heights if the spacer 198 and the spacer 199 are formed using a coated film or the like with high planarity after forming the insulator 186 after forming the insulator. In such a case, a region of a mask supported by a spacer is increased, therefore, the mask can be set further stably.

The insulator 186 and the spacer 198 are stacked to be formed in different shapes, therefore, a material which has a high selection ratio in etching is preferably used. For example, when using an inorganic material for the insulating layer 186 and an organic material for the spacer 198, the selection ratio can be high to be patterned in an excellent shape.

Moreover, in order to further improve the reliability, it is preferable to perform degasification by vacuum heating before forming the electroluminescent layer (layer containing an organic compound) 188. For example, it is desirable to perform heat treatment for removing gas contained in the substrate in a low pressure atmosphere or an inert gas atmosphere at 200 to 400° C. or preferably 250 to 350° C. before performing vapor deposition of an organic compound material. Further, it is preferable to form the electroluminescent layer 188 by a vacuum vapor deposition method or a droplet discharge method under low pressure without air exposure. By this thermal treatment, moisture contained in or attached to a conductive film to be the first electrode layer or an insulating layer (partition) can be discharged. This heat treatment can be combined with a prior heating step as long as the substrate can be transferred in a vacuum chamber without breaking the vacuum. Therefore, the prior heating step may be performed once after forming an insulating layer (partition). Here, the interlayer insulating film and the insulator (partition) are formed with a substance having highly heat resistance, thereby wheat treatment step can be sufficiently performed for improving the reliability.

The electroluminescent layer 188 is formed over the first electrode layer 185. Note that although only one pixel is shown in FIG. 1, electric electrode layers corresponding to the respective colors of R (red), G (green), and B (blue) are formed separately in this embodiment mode. In this embodiment mode, each of FIGS. 32 and 29 shows a state of selectively forming each material which shows the light emission of red (R), green (G), or blue (B) as the electroluminescent layer 188 by a vapor deposition method using a vapor deposition mask and the like. FIGS. 32 and 29 show a step of forming a material which shows red light emission. In this embodiment mode, a method is used by which each color is formed using a different vapor deposition apparatus or a vapor deposition mask, however, the light emitting materials of three colors can be formed in the same chamber by moving one mask.

FIG. 29(A) is a schematic diagram of a vapor deposition step and FIG. 29(B) is a diagram of an element substrate and a vapor deposition mask seen from a vapor deposition source 761 side. As shown in FIG. 29(A), a magnetic body 765 for controlling the position of a mask and detaching the mask from and attaching the mask to an element substrate 764, the element substrate 764, a mask 763, a shutter 762, and the vapor deposition source 761 are provided in a chamber 760 of a vapor deposition apparatus. The magnetic body 765 is moved in a direction of an arrow 770 by a control apparatus 772, and an alignment of the element substrate 764 and the mask 763 is observed by a camera 771a and a camera 771b. Besides, a heater for heating the vapor deposition source, a quartz oscillator for controlling a film thickness, a control apparatus for controlling the temperature and position at each portion, and the like are provided in the vapor deposition apparatus. The element substrate 764 is provided with an element side facing down toward the vapor deposition source 761, and the mask 763 is provided close to the element substrate 764 and the shutter 762 for controlling the start and finish of vapor deposition is provided between the mask 763 and the vapor deposition source 761 toward the vapor deposition source 761 side. The mask 763 is formed of a metal material and has a magnetic property, therefore, controlling the upper and lower positions of the mask 763 shown in the direction of the arrow 770 is performed by the magnetic body 765 formed of a magnetic material.

FIG. 29(B) shows the mask 763 and the element substrate 764 seen from the vapor deposition source 761 side. The mask 763 is set to be closely attached onto the element side of the element substrate 764 by the magnetic force of the magnetic body 765. Further, an alignment of each pixel may be any one of arrangement methods of a stripe arrangement in which pixels corresponding to red, green, and blue are arranged in stripes, a delta arrangement in which the pixels are shifted by a half pitch per one line, and a mosaic arrangement in which sub-pixels corresponding to red, green, and blue are arranged obliquely. The stripe arrangement is suitable for displaying a line, a figure, text, and the like, therefore, it is preferably applied to a monitor. Further, a more natural image than the stripe arrangement can be obtained with the mosaic arrangement, therefore, it is preferably applied to a television device and the like. Furthermore, a natural image display can also be obtained with the delta arrangement, therefore, it is preferably applied to a television device and the like. The television device is also called television simply.

In this embodiment mode, the stripe arrangement is used as the arrangement of pixels. As shown in FIG. 29(B), a slit type mask having a slit shape opening such as an opening 769a and an opening 769b is used for the mask 763. With the slit type mask, all pixels which emit a color among colors can be formed at the same time, thereby productivity is high. Other than the slit type mask, a slot type mask having an opening corresponding to each pixel in a slot shape without a continuous opening like the slit type mask may be used as well. There is a case where the slot type mask requires a plurality of times (twice or more) of vapor depositions for each color in the pixels of the stripe arrangement, however, the slot type mask is suitable for the delta arrangement in which an arrangement is not linear, and mask rigidity is high since one openings small.

A pixel electrode layer 766a to be a pixel for displaying red color, a pixel electrode layer 766b to be a pixel for displaying green color, and a pixel el ode layer 766c to be a pixel for displaying blue color are provided on the element substrate 764. FIG. 29 shows the case of forming a light emitting material for red color, therefore, the mask 763 is provided so that the opening 769a and the opening 769b correspond to the pixel electrode layers for displaying red color.

According to the invention, spacers are formed over a pixel electrode layer and over an insulator (insulating layer) which covers an end portion of each pixel electrode layer and functions as a partition. Accordingly, a spacer 767 and a spacer 768 are provided over a pixel electrode layer and an insulator (insulating layer) shown in FIG. 29(B) as well. The mask 763 is supported by the spacer 767 and the spacer 768, therefore, it can be prevented that the mask 763 contacts the pixel electrode layer 766a, the pixel electrode layer 766b, and the pixel electrode layer 766c even when the rigidity of the mask 763 is weak, and twist, deflection and the like occur due to a magnetic force, gravitation and the like. Therefore, damage is not caused to the pixel electrode layer, thereby favorable light emission and display can be performed. Even in the case where a substrate has a large area and high resolution, and thus an opening of a mask becomes large and a shield portion is thinned, which leads to decrease the rigidity of the mask itself and difficulty in accurately controlling the position of the mask, the mask can be supported by the spacers and provided in a desired position.

With reference to FIG. 32, description is made on a positional relationship between an element substrate and a mask in detail. FIG. 32 is a cross sectional diagram of an element substrate and a mask in vapor deposition which is seen with a vapor deposition source on the upper side. Therefore, a state is inverted to the element substrate shown in FIG. 29(A). In FIG. 32, a thin film transistor 651a, a thin film transistor 651b, a thin film transistor 651c, and a thin film transistor 651d are connected to a first electrode layer 652a, a first electrode layer 652b, a first electrode layer 652c, and a first electrode layer 652d which are pixel electrode layers. Each end portion of the first electrode layers is covered with an insulator (insulating layer) 653a, an insulator (insulating layer) 653b, an insulator (insulating layer) 653c, and an insulator (insulating layer) 653d which function as partitions. Over the first electrode, layers, a spacer 654a, a spacer 654b, a spacer 654c, and a spacer 654d are formed. Similarly, over the insulators (insulating layers), a spacer 657a, a spacer 657b, a spacer 657c, and a spacer 657d are formed. FIG. 32 shows an example in which the spacer 654a, the spacer 654b, the spacer 654c, the spacer 654d, the spacer 657a, the spacer 657b, the spacer 657c, and the spacer 657d are formed of the same material and by the same step after forming the insulator 653a, the insulator 653b, the insulator 653c, and the insulator 653d.

The spacer 654a to the spacer 654b, the spacer 657a and the spacer 657b are formed by forming a layer with high planarity by a coating method, and then patterning the layer by dry etching, thereby a height from the substrate is equivalent, each spacer has a columnar shape and an upper surface connected to the mask has planarity. When the mask is supported by such spacers which have an equal height and planar support surfaces, the support surface of the mask increases, therefore, the mask can be further stable. End portions thereof have preferably a smooth shape having curvatures so that the insulator 653a to the insulator 653d improve the coverage of an electroluminescent layer and a second electrode layer which are formed thereover. When the insulators and spacers are formed through different steps, each spacer can be formed in free shape with a different material and a different step. Therefore, a spacer which is fit to a layout of a pixel and a vapor deposition mask can be provided. It is needless to say that there is an advantage in that a step can be shortened and a material can be used efficiently when the spacers and the insulators (insulating layers) over the pixel electrode layers are formed of the same material and by the same step. After forming, the spacers and the insulators over the pixel electrode layers with the same material and by the same step, another spacer can be formed over the pixel electrode layer again when forming the spacer over the insulator.

The first electrode layer 652a and the first electrode layer 652d are pixels to display red color and provided so as to correspond to an opening of a mask 656. Then, a light emitting material for red color is formed over the first electrode layer 652a and the first electrode layer 652d as an electroluminescent layer. On the other hand, the first electrode layer 652b is a pixel to display green color and the first electrode layer 652c is a pixel to display blue color, therefore, they are provided so as to correspond to a shielding portion of the mask 656. The mask 656 is stably supported by the spacers formed over the first electrode layers and the insulator, therefore, such problem does not occur that the mask becomes contact with the first electrode layer due to twist, deflection and the like, thereby the first electrode layer has a defect in shapes. Therefore, the first electrode layer does not generate a light emission defect and a display defect, thereby a display device with high reliability and high image quality can be manufactured.

When an electroluminescent layer is formed over the pixel electrode layer 652a, the spacer 654a provided over the pixel electrode layer 652a is not shielded by the mask, therefore, there is a case where an electroluminescent layer is formed over the surface or periphery of the spacer 654a. On the other hand, the insulator 653a, the insulator 653b, the spacer 657a, and the spacer 657b are almost shield by the mask 656, therefore, a place where an electroluminescent layer is formed is only at the periphery close to an opening of the mask 656. In this embodiment mode, when a plurality of spacers are provided such as the spacer 657a formed over the insulator 653a and the spacer 654a formed over the pixel electrode layer 652a, in vapor deposition of an electroluminescent layer, the spacer 657a connected to the mask 656 and the spacer 654a not connected to the mask 656 exist.

Further, in the case where light emitting materials for each color are selectively formed with one mask 656, after forming an electroluminescent layer over the first electrode layer 652a and the first electrode layer 652d, the mask 656 is moved in a direction of an arrow 655 so that the electroluminescent layer can be formed over each first electrode layer.

Subsequently, the second electrode layer 189 formed of a conductive film is provided over the electroluminescent layer 188. As the second electrode layer 189, a material having a low work function (Al, Ag, Li, Ca, or an alloy or compound thereof, MgAg, MgIn, AlLi, $CaF_2$ or CaN) may be used. In this manner, a light emitting element 190 formed of the first electrode layer 185, the electroluminescent layer 188, and the second electrode layer 189 is formed.

In the display device of this embodiment mode shown in FIG. 1, light emitted from the light emitting element 190 is emitted from the first electrode layer 185 side through it in a direction of an arrow, in FIG. 1.

It is effective to provide a passivation film 191 so as to cover the second electrode layer 189. The passivation film 191 is formed of an insulating film containing silicon nitride, silicon oxide, silicon oxynitride (SiON), silicon nitride oxide (SiNO), aluminum nitride (AlN), aluminum oxynitride (AlON), aluminum nitride oxide (AlNO) in which nitrogen content is more than oxygen content, aluminum oxide, diamond-like carbon (DLC), or a nitrogen-containing carbon film (CN), and either a single layer of the insulating film or stacked layers thereof can be used. Moreover, a siloxane resin material may be used as well.

At this time, it is preferable to use a film with favorable coverage as a passivation film, for which a carbon film, particularly a DLC film is effectively used. A DLC film can be deposited in the temperature range from a room temperature to 100° C., therefore, it can be easily formed above an electroluminescent layer 119 with low heat resistance. A DLC film can be formed by a plasma CVD method (typically an RF plasma CVD method, a microwave CVD method, an electron cyclotron resonance (ECR) CVD method, a thermal filament CVD method and the like), a combustion method, a sputtering method, an ion beam vapor deposition method, a laser vapor deposition method and the like. As a reaction gas used for deposition, a hydrogen gas and a carbon hydride based gas (for example, $CH_4$, $C_2H_2$, $C_6H_6$ and the like) are used to be ionized by glow discharge and the film is deposited by accelerating the ions to impact against a cathode to which a negative self bias is applied. Further, a CN film may be formed using a $C_2H_4$ gas and a N gas as a reaction gas. A DLC film has a high blocking effect against oxygen, thereby oxidization of the electroluminescent layer 188 can be suppressed. Therefore, a problem such that the electroluminescent layer 188 is oxidized while performing a subsequent sealing step can be prevented.

FIG. 18 shows a top plan view of a pixel region of a display device manufactured in this embodiment mode. In FIG. 18, the pixel 2702 includes a TFT 501, a TFT 502, a capacitor 504, the first electrode layer 185, a gate wiring layer 506, a source and drain wiring layer 505, and a power source line 507. The display device in FIG. 18 is a diagram in which the first electrode layer 185 is formed.

Subsequently, FIG. 30 shows a display device in which the insulator 186 which cover the periphery of the end portion of the first electrode layer 185 and functions as a partition, the spacer 199, and the spacer 198 are formed. In FIG. 30, a plurality of the spacers 199 are provided over the first electrode layer and a plurality of spacers 198 are provided over the insulator 186. The spacer 198 formed over the insulator 186 is preferably formed in a region in which a thin film transistor is not formed under the insulator 186, since a defect such as an electrostatic discharge does not easily occur. Further, instead of the spacer 198 over the insulator, a mask in which a depression portion is formed in a place corresponding to the spacer 198 may be used. The spacer may be one or a plurality of numbers, and in the case of providing a plurality of spacers, they are not required to have the same shape. The mask used in a step of forming electroluminescent layer is supported by the spacer, therefore, damage is not caused by contact with the first electrode layer due to twist and deflection.

In this manner, by firmly fixing a sealing substrate 195 and the substrate 100 over which the light emitting element 190 is formed with a sealing material 192, the light emitting element is sealed (see FIG. 1). In the display device of the invention, the sealing material 192 and the insulator 186 are formed apart so as not to contact each other. In this manner, when the sealing material and the insulator 186 are formed apart from each other, even when an insulating material using an organic material having high moisture absorbing property is used for the insulator 186, moisture does not easily enter so that deterioration of the light emitting element can be prevented to improve the reliability of the display device. As the sealing material 192, it is typically preferable to use a visible light curable resin, an ultraviolet curable resin, or a heat curable resin. For example, an epoxy resin can be used such as a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine resin, a heterocyclic epoxy resin, and a modified epoxy resin. Note that a region surrounded by a sealing material may be filled with a filling material 193, and may be sealed with nitrogen and the like by sealing in a nitrogen atmosphere. This embodiment mode is a bottom emission type, therefore, the filling material 193 is not required to have a light-transmitting property. However, in the case of a structure extracting light through the filling material 193, the filling material 193 is required to have a light-transmitting property. Typically, a visible light curable, ultraviolet curable, or heat curable epoxy resin may be used. By the aforementioned steps, a display device having a display function using a light emitting element of this embodiment mode is completed. Further, the display device may be filled with the filling material by dropping a filling material in a liquid state.

A dropping injection method adopting a dispenser method is described with reference to FIG. 19. The dropping injection method of FIG. 19 includes a control device 40, an image pickup means 42, a head 43, a filling material 33, a marker 35, a marker 45, a barrier layer 34, a sealing material 32, a TFT substrate 30, and a counter substrate 20. The filling material 33 is dropped once or a plurality of times from the head 43 in a closed loop formed by the sealing material 32. In the case where the material of the filling material has high viscosity, the filling material is continuously discharged and attached to a forming region without a break. On the other hand, in the case where the material of the filling material has low viscosity, the filling material is intermittently discharged and dropped as shown in FIG. 19. At this time, the barrier layer 34 may be provided to prevent that the sealing material 32 reacts with the filling material 33. Subsequently, the substrates are attached to each other in vacuum and then ultraviolet curing is performed to be a state filled with the filling material. As a filling agent, a substance having a moisture absorbing property such as a drying agent may be used to obtain a further moisture absorbing effect, thereby deterioration of the element can be prevented.

A drying agent is set in an EL display panel to prevent deterioration of an element by moisture. In this embodiment mode, a drying agent is set in a depression portion formed in the sealing substrate so as to surround the pixel region to form a structure which does not hinder a thin design. Further, a drying agent is also formed in a region corresponding to a gate wiring layer so as to secure a wide moisture absorbing area, thereby a moisture absorbing effect is high. Further, a drying agent is formed over a gate wiring layer which does not emit light directly, therefore, light extraction efficiency is not decreased either.

Note that in this embodiment mode, the case where a light emitting element is sealed with a glass substrate is shown, however, sealing treatment is treatment for protecting a light emitting element from moisture, and any one of a method for mechanically sealing the light emitting element with a cover material, a method for sealing the light emitting element with a heat curable resin or an ultraviolet curable resin, or a method for sealing the light emitting element with a thin film having a high barrier property such as a metal oxide, a nitride, and the like may be used. As the cover material, glass, ceramics, plastic, or metal can be used, however, a material is required to have a light-transmitting property in the case where light is emitted to the cover material side. Further, the cover material and the substrate over which the light omitting element is formed are attached using a sealing material such as a heat curable resin or an ultraviolet curable resin, and the resin is cured by heat treatment or ultraviolet irradiation treatment, thereby a sealed space is formed. It is also effective to provide a moisture absorbing material typified by barium oxide in this scaled space. This moisture absorbing material may be provided in contact with the sealing material, or provided over or on the periphery of the partition so as not to prevent the light from the light emitting element. Furthermore, the space formed between the cover material and the substrate over which the light emitting element is formed can be filled with a heat curable resin or an ultraviolet curable resin. In this case, it is effective to add an absorbing material typified by barium oxide into the heat curable resin or the ultraviolet curable resin.

In this embodiment mode, an FPC 194 is connected to a terminal electrode layer 178 through an anisotropic conductive layer 196 in an external terminal connecting region 202 to form a structure electrically connected to external. Further, as shown in FIG. 1(A) which is a top plan view of a display device, a display device manufactured in this embodiment mode includes a peripheral driver circuit region 207a, and a peripheral driver circuit region 207b each including a scan line driver circuit as well as a peripheral driver circuit region 204 including a signal line driver circuit.

The aforementioned circuit is formed in this embodiment mode, however, the invention is not limited thereto. An IC chip may be mounted by the aforementioned COG method or TAB method as the peripheral driver circuit. Further, each of the gate line driver circuit and the source line driver circuit may be in a plurality of numbers or a single number.

Moreover, in the display device of the invention, a driving method for an image display is not particularly limited, and for example, a dot sequential driving method, a line sequential driving method, an area sequential driving method and the like may be used. Typically, the line sequence driving method may be used, and a time division gray scale driving method and an area gray scale driving method may be appropriately used as well. Further, a video signal inputted to the source line of the display device may be an analog signal or a digital signal. The driver circuit and the like may be appropriately designed in accordance with the video signal.

Further, a display device in which a video signal is digital includes the one in which a constant voltage (CV) video signal is inputted to a pixel or the one in which a constant current (CC) video signal is inputted to a pixel. A display device in which a video signal is the constant voltage (CV) includes the one in which a constant voltage is applied to a light emitting element (CVCV) and the one in which a constant current is applied to a light emitting element (CVCC). Further, a display device in which a video signal is the constant current (CC) includes the one in which a constant voltage is applied to a light emitting element (CCCV) and the one in which a constant current is applied to a light emitting element (CCCC).

According to the invention, a display device with high reliability can be manufactured by simplified steps. Therefore, a display device with high resolution and high image quality can be manufactured at low coat with high yield.

Embodiment Mode 2

An embodiment mode of the invention is described with reference to FIGS. 7 to 9. This embodiment mode shows an example in which a second interlayer insulating layer is not formed in the display device manufactured in accordance with Embodiment Mode 1. Therefore, repetitive description on the same portion or a portion having a similar function is omitted.

As shown in Embodiment Mode 1, the thin film transistor 173, the thin film transistor 174, thin film transistor 175, the thin film transistor 176, and the conductive layer 177 are formed over the substrate 100, and the insulating film 168 and the insulating film 168 are formed. A source electrode layer or drain electrode layer connected to a source region or drain region of a semiconductor layer is formed over each thin film transistor. A first electrode layer 395 in contact with the source electrode layer or drain electrode layer 172b in the thin film transistor 176 formed in the pixel region 206 is formed (see FIG. 7(A)).

The first electrode layer 395 functions as a pixel electrode and may be formed with the same material and by the same step as the first electrode layer 185 in Embodiment Mode 1. In this embodiment mode, the first electrode layer 395 is formed using ITSO which is a transparent conductive film and patterning it in order to extract light through the first electrode layer similarly to Embodiment Mode 1.

The insulator 186 is formed to cover an end portion of the first electrode layer 395 and the thin film transistor, and the spacer 199 is formed over the pixel electrode layer. After forming the insulator 186, the spacer 198 is formed over the insulator 186 (see FIG. 7(B)). Acrylic is used for the insulator 186 and the spacer 199 in this embodiment mode. In this embodiment mode, the spacer 198 has a columnar shape of which an upper surface has higher planarity. A mask for forming an electroluminescent layer is supported by the spacer 198 and the spacer 199, thereby damage of the pixel electrode layer is not caused by the mask. Therefore, a display device with high image quality and high reliability can be manufactured. Further, as in this embodiment mode, when a projection portion is formed by the spacer 198 to form a structure in which the sealing substrate 195 is supported by the projection portion, a space between the element substrate and the sealing substrate can be controlled to be uniform. When the space is uniform, a display defect such that light emitted from a light emitting element is interfered is not generated so that good and high image quality display can be performed.

The electroluminescent layer 188 is formed over the first electrode layer and the second electrode layer 189 is stacked thereover to form the light emitting element 190. The second electrode layer 189 is electrically connected to the wiring layer 156 in the connecting region 205 while the terminal electrode layer 178 is connected to the FPC 194 through the anisotropic conductive layer 196 in the external terminal connecting region 202. The passivation film 191 is formed so as to cover the second electrode layer 189. The substrate 100 is attached to the sealing substrate 195 with the sealing material 192, thereby inside the display device is filled with the filling material 193 (see FIG. 8). In the display device of the invention, the sealing material 192 and the insulator 186 are formed apart so as not to be in contact with each other. In this manner, when the sealing material and the insulator 186 are formed apart from each other, even when an insulating material using an organic material having a high moisture absorbing property is used for the insulator 186, moisture does not easily enter so that deterioration of the light emitting element can be prevented to improve the reliability of the display device.

Further, in a display device in FIG. 9, the first electrode layer 395 can be selectively formed over the insulating film 168 before forming the source electrode layer or drain electrode layer 172b connected to the thin film transistor 176. In this case, according to this embodiment mode, a connecting structure of the first electrode layer 395 and the source electrode layer or drain electrode layer 172b is a structure in which the source electrode layer or drain electrode layer 172b is stacked over the first electrode layer 395. When the first electrode layer 395 is formed before the source electrode layer or drain electrode layer 172b, a plane forming region can be formed. Accordingly, such advantages can be provided that good coverage and film deposition can be achieved with high planarity and polish treatment such as CMP can be sufficiently performed.

According to the invention, a display device with high reliability can be manufactured by simplified steps. Therefore, a display device with high resolution and high image quality can be manufactured at low cost with high yield.

Embodiment Mode 3

An embodiment mode of the invention is described with reference to FIG. 10. This embodiment mode shows an example in which a gate electrode layer structure of a thin film transistor is different in the display device manufactured in accordance with Embodiment Mode 1. Therefore, repetitive description on the same portion or a portion having a similar function is omitted.

Each of FIGS. 10(A) to (C) is a display device in a manufacturing step, and corresponds to the display device of Embodiment Mode 1 shown in FIG. 4(B).

In FIG. 10(A), a thin film transistor 273 and a thin film transistor 274 are provided in a peripheral driver circuit region 214, a conductive layer 277 is provided in a connecting region, and a thin film transistor 275 and a thin film transistor 276 are provided in a pixel region 216. A gate electrode layer of the thin film transistor in FIG. 10(A) is formed of stacked layers of two conductive films and an upper layer of the gate electrode layer is patterned to have a thinner width than a lower layer of the gate electrode layer. Although the lower layer of the gate electrode layer has a tapered shape, the upper layer of the gate electrode layer does not have a tapered shape. In this manner, a gate electrode layer may have a tapered shape or a shape of which side angle is almost perpendicular, a so-called shape without a tapered shape.

In FIG. 10(B), a thin film transistor 373 and a thin film transistor 374 are provided in the peripheral driver circuit region 214, a conductive layer 377 is provided in the connecting region, and a thin film transistor 375 and a thin film transistor 376 are provided in the pixel region 216. Although a gate electrode layer of the thin film transistor in FIG. 10(B) is also formed of stacked layers of two conductive films, each of an upper layer of the gate electrode layer and a lower layer of the gate electrode layer has a continuous tapered shape.

In FIG. 10(C), a thin film transistor 473 and a thin film transistor 474 are provided in the peripheral driver circuit region 214, a conductive layer 477 is provided in the connecting region, and a thin film transistor 475 and a thin film transistor 476 are provided in the pixel region 216. A gate electrode layer of the thin film transistor in FIG. 10(C) has a single-layer structure and has a tapered shape. In this manner, the gate electrode layer may have a single-layer structure.

As set forth above, the gate electrode layer may have various structures in accordance with the structure and shape thereof. Therefore, a display device manufactured thereby also shows various structures. In the case where in an impurity region of a semiconductor layer is formed in a self-aligned manner with the gate electrode layer as a mask, a structure and concentration distribution of the impurity region are changed in accordance with the structure of the gate electrode layer. A thin film transistor having a desired function can be manufactured by designing in consideration of the aforementioned aspects.

This embodiment mode can be implemented in combination with each of Embodiment Modes 1 and 2.

Embodiment Mode 4

A display device having a light emitting element can be formed by adopting the invention, and light emitted from the light emitting element is emitted to any one of a bottom side, top side, or dual sides. In this embodiment mode, examples of a dual emission type and a top emission type are described with reference to FIGS. 11 and 12.

A display device shown in FIG. 12 includes an element substrate 1300, a thin film transistor 1355, a thin film transistor 1365, a thin film transistor 1375, a first electrode layer 1317, an electroluminescent layer 1319, a second electrode layer 1320, a transparent conductive film 1321, a filling material 1322, a sealing material 1325, a gate insulating layer 1310, an insulating film 1311, an insulating film 1312, an insulating film 1313, an insulating film 1309, an insulator (insulating layer) 1314, a sealing substrate 1323, a wiring layer 1380, a terminal electrode layer 1381, an anisotropic conductive layer 1382, an FPC 1383, a spacer 1330, a spacer 1399a, and a spacer 1399b. As shown in FIG. 12, a plurality of the spacers 1399a and the spacers 1399b having different shapes may be formed over the insulator. The display device has a separating region 221, an external terminal connecting region 222, a wiring region 223, a peripheral driver circuit region 224, and a pixel region 226. The filling material 1322 can be formed using a composition in liquid form by a dropping method as a dropping method of FIG. 19. The element substrate 1300 over which the filling material is formed by the dropping method and the sealing substrate 1323 are attached to seal a light emitting display device.

The display device shown in FIG. 12 is a dual emission type and has a structure in which light is emitted in directions of arrows from the element substrate 1300 side and the sealing substrate 1323 side as well. Note that in this embodiment mode, the first electrode layer 1317 is formed by depositing a transparent conductive film and etching it into a desired shape. A transparent conductive film can be used as the first electrode layer 1317. As the first electrode layer 1317, a titanium nitride film or a titanium film may be used other than the aforementioned transparent conductive film. In this case, after depositing a transparent conductive film, a titanium nitride film or a titanium film is formed with a thickness enough to transmit light (preferably about 5 to 30 nm). In this embodiment mode, ITSO is used as the first electrode layer 1317.

Subsequently, the second electrode layer 1320 formed of a conductive film is provided over the electroluminescent layer 1319. As the second electrode layer 1320, a material having a low work function (Al, Ag, Li, Ca, or an alloy or compound thereof, MgAg, MgIn, AlLi, $CaF_2$ or CaN) may be used. In the display device of FIG. 6, stacked layers are used in which a metal thin film having a thin film thickness (MgAg: film thickness of 10 nm) is used for the second electrode layer 1320 and ITSO with a thickness of 100 nm is used for the transparent conductive film 1321 so as to transmit light. As the transparent conductive film 1321, a similar film to the aforementioned first electrode layer 1317 can be used.

The display device in FIG. 11 is a one-side light emission type and has a structure in which light is emitted to the top side in a direction of an arrow. The display device shown in FIG. 11 includes an element substrate 1600, a thin film transistor 1655, a thin film transistor 1665, a thin film transistor 1675, a metal layer 1624 having reflectivity, a first electrode layer 1617, an electroluminescent layer 1619, a second electrode layer 1620, a transparent conductive film 1621, a filling material 1622, a sealing material 1625, a gate insulating layer 1610, an insulating film 1611, an insulating film 1612, an insulating film 1613, an insulating film 1609, an insulator (insulating layer) 1614, a sealing substrate 1623, a wiring layer 1680, a terminal electrode layer 1681, an anisotropic conductive layer 1682, an FPC 1683, a spacer 1630, and spacers 1699. In the display device in FIG. 11, an insulating layer stacked over the terminal electrode layer 1681 is etched and removed. In this manner, when a structure in which an insulating layer having moisture permeability is not provided on the periphery of the terminal electrode layer, the reliability can be further improved. Moreover, the display device includes a separating region 231, an external terminal connecting region 232, a wiring region 233, a peripheral driver circuit region 234, and a pixel region 236. In this case, in the aforementioned dual emission type display device shown in FIG. 12, the metal layer 1624 having reflectivity is formed under the first electrode layer 1317. The first electrode layer 1617 which is a transparent conductive film functioning as an anode is formed over the metal layer 1624 having reflectivity. Since the metal layer 1624 may have reflectivity, Ta, W, Ti, Mo, Al, Cu, and the like may be used. It is preferable to use a substance having high reflectivity in a visible light region. In this embodiment mode, a TiN film is used.

The second electrode layer 1620 formed of a conductive film is provided over the electroluminescent layer 1619. As the second electrode layer 1620 which functions as a cathode, a material having a low work function (Al, Ag, Li, Ca, or an alloy or compound thereof, MgAg, MgIn, AlLi, CaF$_2$ or CaN) may be used. In this embodiment mode, stacked layers are used in which a metal thin film having a thin film thickness (MgAg: film thickness of 10 nm) is used for the second electrode layer 1620 and ITSO with a thickness of 110 nm is used for the transparent conductive film 1621 so as to transmit light.

A mode of a light emitting element applicable to this embodiment mode is shown in FIG. 13. A light emitting element has a structure with an electroluminescent layer 860 interposed between a first electrode layer 870 and a second electrode layer 850. A material for the first electrode layer and the second electrode layer is required to be selected in consideration of an work function, and either of the first electrode layer or the second electrode layer may be an anode or a cathode depending on a pixel structure. In this embodiment mode, in the case where the polarity of a driving TFT is a p-channel type, the first electrode layer may be an anode and the second electrode layer may be a cathode. Further, since the polarity of the driving TFT is an n-channel type, it is preferable that the first electrode layer be a cathode and the second electrode layer be an anode.

FIGS. 13(A) and 13(B) show the case where the first electrode layer 870 is an anode and the second electrode layer 850 is a cathode. It is preferable that the electroluminescent layer 860 be formed by stacking an HIL (hole injecting layer) HTL (hole transporting layer) 804, an EML (light emitting layer) 803, an ETL (electron transporting layer) EIL (electron injecting layer) 802, and the second electrode layer 850 in this order from the first electrode layer 870 side. FIG. 13(A) shows a structure in which light is emitted from the first electrode layer 870, and the first electrode layer 870 is formed of an electrode layer 805 formed of an oxide conductive material having a light-transmitting property, and the second electrode layer is formed of an electrode layer 801 containing an alkali metal such as LiF and MgAg or alkaline earth metal and an electrode layer 800 formed of a metal material such as aluminum from the electroluminescent layer 860 side. FIG. 13(B) shows a structure in which light is emitted from the second electrode layer 850, and the first electrode layer is formed of an electrode layer 807 formed of a metal such as aluminum and titanium, or a metal material containing the aforementioned metal and nitrogen at a concentration equal to or lower than the stoichiometric composition ratio, and a second electrode layer 806 formed of an oxide conductive material containing silicon oxide at a concentration of 1 to 15 atomic %. The second electrode layer, the second electrode layer is formed of an electrode layer 801 containing an alkaline metal such as LiF and MgAg or an alkaline earth metal and an electrode layer 800 formed of a metal material such as aluminum from the electroluminescent layer 860 side. Both of the layers are formed with a thickness of 100 nm or less to be a state that light can be transmitted, therefore, light can be emitted from the second electrode layer 850.

FIGS. 13(C) and (D) show the case where the first electrode layer 870 is a cathode and the second electrode layer 850 is an anode. It is preferable that the electroluminescent layer 860 be formed by stacking the EIL (electron injecting layer) ETL (electron transporting layer) 802, the EML (light emitting layer) 803, the HTL (hole transporting layer) HIL (hole injecting layer) 804, and the second electrode layer 850 as an anode in this order from a cathode side. FIG. 13(C) shows a structure in which light is emitted from the first electrode layer 870, and the first electrode layer 870 is formed of the electrode layer 801 containing an alkaline metal such as LiF and MgAg or an alkaline earth metal, and the electrode layer 800 formed of a metal material such as aluminum from the electroluminescent layer 860 side. Both of the layers are formed with a thickness of 100 nm or less to be capable of transmitting light, therefore, light can be emitted from the first electrode layer 870. The second electrode layer is formed of the second electrode layer 806 formed of an oxide conductive material containing silicon oxide at a concentration of 1 to 15 atomic %, and the electrode layer 807 formed of a metal such as aluminum and titanium, or a metal material containing the aforementioned metal and nitrogen at a concentration equal to or lower than the stoichiometric composition ratio from the electroluminescent layer 860 side. FIG. 13(D) shows a structure in which light is emitted from the second electrode layer 850. The first electrode layer 870 is formed of the electrode layer 801 containing an alkaline metal such as LiF and MgAg or an alkaline earth metal and the electrode layer 800 formed of a metal material such as aluminum from the electroluminescent layer 860 side, with an enough film thickness to reflect light emitted from the electroluminescent layer 860. The second electrode layer 850 is formed of the electrode layer 805 formed of an oxide conductive material having a light-transmitting property. Note that the electroluminescent layer can have a single-layer structure or a mixed-layer structure other than the stacked-layer structure.

Further, a material which exhibits light emission of each of red (R), green (B), and blue (B) is selectively formed by a vapor deposition method using a vapor deposition mask and the like as an electroluminescent layer. The material which exhibits light emission of red (R), green (G), and blue (B) can be formed by a droplet discharge method similarly to a color filter (a low molecular or high molecular weight material and the like). This method is preferable since RGB can be separately deposited without using, a mask.

Further, in the case of using ITO or ITSO having a light-transmitting property as the second electrode layer in the case of the top emission type, BzOs—Li in which Li is added to benzoxazole derivatives (BzOs) and the like can be used. Further, for example, Alq$_3$ doped with dopant (DCM or the like in the case of R, and DMQD or the like in the case of G) corresponding to each emission color of R, G, and B may be used for an EML.

Note that the electroluminescent layer is not limited to the aforementioned materials. For example, it can be formed by co-evaporation of an oxide such as molybdenum oxide (MoO$_x$: x=2 to 3) or the like and α-NPD rubrene instead of using CuPc or PEDOT, thereby a hole injecting property can be improved. Further, an organic material (containing low molecular weight or high molecular weight) or a composite material of an organic material and an inorganic material can be used as the electroluminescent layer material. Hereinafter, a material for forming a light emitting element is described in details.

Among charge injecting/transporting substances, as a substance having a particularly high electron transporting property, for example, there is a metal complex or the like having a quinoline skeleton or a benzoquinoline skeleton such as tris(8-quinolinato) aluminum (abbreviated: Alq$_3$), tris(5-methyl-8-quinolinolate) aluminum (abbreviated: Almq$_3$), bis(10-hydroxybenzo[h]-quinolinato) beryllium (abbreviated: BeBq$_2$), or bis(2-methyl-8-quinolinolato)-4-phenylphenolato-aluminum (abbreviated: BAlq). Moreover, as a substance having a high hole transporting property, for example, there are aromatic amine based (that is having a benzene ring-nitrogen bond) compounds such as 4,4'-bis[N-(1-naphthyl)-N-phenyl-amino]-biphenyl (abbreviated: α-NPD), 4,4'-bis[N-(3-methylphenyl)-N-phenyl-amino]-biphenyl (abbreviated: TPD), 4,4',4''-tris(N,N-diphenyl-amino)-triphenylamine (abbreviated: TDATA), and 4,4',4''-tris[N-(3-methylphenyl)-N-phenyl-amino]-triphenylamine (abbreviated: MTDATA).

Further, among charge injecting/transporting substances, as a substance having a particularly high electron injecting property, there is a compound of an alkali metal or an alkali earth metal such as lithium fluoride (LiF), cesium fluoride (CsF), or calcium fluoride (CaF$_2$). Besides, a mixture of a substance having a high electron transporting property such as Alq$_3$ and an alkali earth metal such as magnesium (Mg) may be used as well.

Among charge injecting/transporting, substances, as a substance having a high hole injecting property, for example, there is a metal oxide such as molybdenum oxide (MoO$_x$), vanadium oxide (VO$_x$), ruthenium oxide (RuO$_x$), tungsten oxide (WO$_x$), or manganese oxide (MnO$_x$). Besides, a phthalocyanine compound such as phthalocyanine (abbreviated: H$_2$Pc) or copper phthalocyanine (CuPc) may be used.

A light emitting layer may have a structure in which each of light emitting layers having different emission wavelength bands is respectively formed in each pixel for performing color display. Typically, light emitting layers corresponding to the respective colors of R (red), G (green), and B (blue) are formed. In this case, by forming a structure where a filter which transmits light having each emission wavelength band at the light emission side of the pixel is provided, color purity can be improved and a pixel portion can be prevented from being a mirror surface (reflection). By providing the filter, a circular polarizing plate or the like that is conventionally required can be omitted, therefore, loss of light emitted from the light emitting layer can be prevented.

Moreover, color changes which occur in the case where the pixel portion (display screen) is seen obliquely can be reduced.

There are various materials in light emitting materials. As a low molecular weight organic light emitting material, 4-dicyanomethylene-2-methyl-6-[2-(1,1,7,7-tetramethyl-9-julolidyl)-ethenyl]-4H-pyran (abbreviated: DCJT), 4-dicyanomethylene-2-t-butyl-6-[2-(1,1,7,7-tetramethyljulolidine-9-yl)ethenyl]-4H-pyran (abbreviated: DCJTB), periflanthene, 2,5-dicyano-1,4-bis[2-(10-metoxy-1,1,7,7-tetramethyljulolidine-9-yl)-ethenyl]benzene, N,N'-dimethyl quinacridone (abbreviated: DMQd), coumarin 6, coumarin 545T, tris(8-quinolinolato)aluminum (abbreviated: Alq$_3$), 9,9'-biantrile, 9,10-diphenylantracene (abbreviated: DPA), 9,10-bis(2-naphtyl)anthracene (abbreviated: DNA), or the like can be used. Further, other substances may be used as well.

On the other hand, a high molecular weight organic light emitting material has higher physical strength compared to a low molecular weight organic light emitting material, and an element has high durability. Moreover, a film deposition is possible by coating, thereby an element can be comparatively easily manufactured. A structure of a light emitting element using a high molecular weight organic light emitting material is basically the same as that of a light emitting element using a low molecular weight organic light emitting material. The structure is such that a cathode, an organic light emitting layer, and an anode are formed in this order. However, it is difficult to form a stacked-layer structure as in the case of using a low molecular weight organic light emitting material when a light emitting layer is formed using a high molecular weight organic light emitting material, and in many cases, a two-layer structure is applied. Specifically, a structure is such that a cathode, a light emitting layer, a hole transporting layer, and an anode are formed in this order.

Emission color is determined by a material for forming a light emitting layer, thereby a light emitting element which exhibits desired light emission can be formed by selecting the material. As a high molecular weight electroluminescent material which can be used for forming a light emitting layer, there is a polyparaphenylene vinylene based material, a polyparaphenylene based material, polythiophene based material, or a polyfluorene based material.

As the polyparaphenylene vinylene based material, there are a derivative of poly(paraphenylene vinylene) [PPV], poly(2,5-dialkoxy-1,4-phenylene vinylene) [RO-PPV], poly (2-(2'-ethyl-hexoxy)-5-methoxy-1,4-phenylene vinylene) [MEH-PPV], poly(2-(dialkoxyphenyl)-1,4-phenylenevinylene) [ROPh-PPV], and the like. As the polyparaphenylene based material, there are a derivative of polyparaphenylene [PPP], poly(2,5-dialkoxy-1,4-phenylene) [RO-PPP], poly(2,5-dihexoxy-1,4-phenylene), and the like. As the polythiophene based material, there are a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2 bithiophene] [PTOPT], and the like. As the polyfluorene based material, there are a derivative of polyfluorene [PF] poly(9,9-dialkylfluorene) [PDAF], poly(9,9-dioctylfluorene) [PDOF], and the like.

Note that a hole injecting property from the anode can be improved when a high molecular weight organic light emitting material having a hole transporting property is interposed between the anode and a high molecular weight organic light emitting material having a light emitting property, fin general, the high molecular weight organic light emitting material having a hole transporting property and an acceptor material dissolved together in water are applied by a spin coating method and the like. Further, since the high molecular weight organic light emitting material having a hole transporting property does not dissolve in organic solvent, the stacked layers of the material and the aforementioned organic light emitting material having a light emitting property can be used. As the high molecular weight organic light emitting material having a hole transporting property, there are a mixture of PEDOT and camphorsulfonic acid (CSA) as an acceptor material, a mixture of polyaniline [PANI] and polystyrenesulfonic acid [PSS] as an acceptor material, and the like.

Moreover, the light emitting layer can have a structure to exhibit monochromatic emission or white emission. In the case of using a white emission material, color display can be realized as a structure in which a filter (colored layer) which transmits light with a specified wavelength is provided at the light emission side of the pixel.

To form a light emitting layer which exhibits white emission, for example, $Alq_3$, $Al_3$ partly doped with Nile red as a red light emitting pigment, $Alq_3$, p-EtTAZ, and TPD (aromatic diamine) are stacked sequentially by a vapor deposition method so that white color can be obtained. Further, in the case where an EL is formed by a coating method using spin coating, the material is preferably baked by vacuum heating after being applied. For example, poly (ethylene dioxythiophene)/poly(styrene sulfonic acid) solution (PEDOT/PSS) which functions as a hole injecting layer may be applied onto a whole surface and baked, and thereafter, polyvinylcarbazole (PVK) solution doped with luminescent center pigments which function as a light emitting layer (1,1,4,4-tetraphenyl-1,3-butadiene (TPB), 4-dicyanomethylene-2-methyl-6-(p-dimethylamino-styryl)-4H-pyran (DCM1), Nile red, coumarin 6, or the like) may be applied onto a whole surface and baked.

The light emitting layer can also be formed with a single layer, and a 1,3,4-oxadiazole derivative (PBD) having an electron transporting property may be dispersed in polyvinylcarbazole (PVK) having a hole transporting property. Further, white emission can be obtained by dispersing PBD of 30 wt % as an electron transporting agent and dispersing an appropriate amount of four kinds of pigments (TPB, coumarin 6, DCM1, and Nile red). In addition to the light emitting element which can provide white emission as described here, a light emitting element which can provide red emission, green emission, or blue emission can be manufactured by appropriately selecting a material of a light emitting layer.

Moreover, besides the singlet excited light emitting material, a triplet excited material containing a metal complex or the like may be used for the light emitting layer. For example, among a red light emitting pixel, a green light emitting pixel, and a blue light emitting pixel, the red light emitting pixel having comparatively short half-brightness lifetime is formed with a triplet excited light emitting material and the others are formal with singlet excited light emitting materials. The triplet excited light emitting material has a characteristic in that it requires lower power consumption to obtain the same luminance because of high luminous efficiency. That is, in the case of applying the triplet excited material to the red light emitting pixel, the reliability can be improved since the amount of current to flow to the light emitting element can be small. To reduce power consumption, the red light emitting pixel and the green light emitting pixel may be formed with the triplet excited light emitting materials, and the blue light emitting pixel may be formed with a singlet excited light emitting material. By forming a green light emitting element that has high visibility to humans, with the triplet excited light emitting material, the power consumption can be reduced further.

As an example of the triplet excited light emitting substance, there is a material using a metal complex as a dopant, and a metal complex including platinum which is a the third transition series element as a central metal, a metal complex including iridium as a central metal or the like is known. The triplet excited light emitting material is not limited to these compounds. A compound which has the aforementioned structure and has an element belonging to groups 8 to 10 in the periodic table of elements as a central metal can be used.

Above mentioned materials for forming the light emitting layer are only examples. The light emitting element can be formed by appropriately stacking each functional layer such as a hole injecting/transporting layer, a hole transporting layer, an electron injecting/transporting layer an electron transporting layer, a light emitting layer, an electron blocking layer, and a hole blocking layer. Moreover, a mixed layer or mixed junction in which each of the above layers is combined may be formed as well. The layer structure of the light emitting layer is changeable. Therefore, instead of providing a specific electron injecting region or light emitting region, modifications of the structure may be allowed without departing from the scope of the invention, for example by providing an electrode layer for this purpose, or providing a dispersed light emitting material.

The light emitting element formed with the aforementioned materials emits light with forward bias. A pixel of a display device formed using the light emitting element can be driven by either a simple matrix method or an active matrix method. In any case, although each pixel emits light by applying forward bias thereto at a specified timing, each pixel is in a non-light emission state for a certain period. The reliability of the light emitting element can be improved by applying reverse bias thereto in the non-light emission period. The light emitting element may be in deterioration in which light emission intensity is decreased under a regular driving condition or may be in a deterioration mode in which apparent luminance is decreased due to the expansion of a non-light emission region in the pixel. However, the progress of deterioration can be delayed by AC driving to apply forward bias and reverse bias so that the reliability of the light emitting device can be improved. Rather, both digital drive and analog drive can be applied.

Therefore, a color filter (colored layer) may be formed over the sealing substrate. The color filter (colored layer) can be formed by a vapor deposition method or a droplet discharge method. When using a color filter (colored layer), high definition display can be performed, since a broad peak in an emission spectrum of each RGB can be corrected into a sharp peak by the color filter (colored layer).

The case of forming materials which exhibit each light emission of RGB is described above. A full color display can be performed by forming a material which exhibits monochromatic emission and combining a color filter or a color conversion layer. The color filter (colored layer) or the color conversion layer may be formed, for example, over a second substrate (sealing substrate) and attached to a substrate.

It is needless to say that monochromatic emission display may be performed. For example, an area color type display device may be formed by using monochromatic emission. An area color type is suitable for a passive matrix type display portion and can display mainly text or symbols.

In the aforementioned structure, a material having a low work function can be used as the cathode. For example, Ca, Al, CaF, MgAg, AlLi, and the like are desirable. The electroluminescent layer may be formed of a single layer type, a stacked-layer type or a mixed type which does not have an interface between layers. Further, the electroluminescent layer may be formed with a singlet material, a triplet material, combined material thereof, or a charge injecting/transporting substance containing an organic compound or an inorganic compound, and a light emitting material. The electroluminescent layer may include one or a plurality of layers, selected, based on the number of molecules, from a low molecular weight organic compound, an intermediate molecular weight organic compound (referred to an organic compound which does not have a subliming property and which has the number of molecules of 20 or shorter, or which has a molecular chain length of 10 µm or shorter), and a high molecular weight organic compound, and an inorganic compound having an electron injecting/transporting property or a hole injecting/transporting property can be combined with the electroluminescent layer. The first electrode layer is formed of a transparent conductive film, which transmits light. For example, ITO, ITSO, or a transparent conductive film in which zinc oxide (ZnO) of 2 to 20% is mixed with indium oxide is used. Note that before forming the first electrode layer, plasma treatment in an oxygen atmosphere or heat treatment under vacuum atmosphere may be performed. A partition (also referred to as a bank) is formed using a material containing silicon, an organic material, and a compound material. Further, a porous film may be used as well. However, the partition is preferably formed using a photosensitive material or non-photosensitive material such as acrylic or polyimide, since the edge of the partition has a shape of which a radius of curvature varies continuously so that a thin film of an upper layer is formed without a break. This embodiment mode can be freely combined with the aforementioned embodiment modes.

According to the invention, a display device with high reliability can be manufactured through simplified steps. Therefore, a display device with high resolution and high image quality can be manufactured at low cost with high yield.

This embodiment mode can be used in combination with any one of Embodiment Modes 1 to 3.

Embodiment Mode 5

Described with reference to FIG. 15 is a mode in which a protective diode is provided for each of a scan line side input terminal portion and a signal line side input terminal portion. In FIG. 15, the TFT 501, the TFT 502, the capacitor 504, and a pixel electrode layer 503 are provided in the pixel 2702. These TFTs have similar structures to Embodiment Mode 1. A spacer 510a and a spacer 510b are provided over the pixel electrode layer 503, and a spacer 511a and a spacer 511b are provided over an insulator (not shown) covering the periphery of the pixel electrode layer 503. These spacers support a vapor deposition mask used for forming an electroluminescent layer over the pixel electrode layer 503. Accordingly, these spacers can prevent the mask from contacting the pixel electrode layer 503 and thus causing damage thereto.

A protective diode 561 and a protective diode 562 are provided in the signal line side input terminal portion. These protective diodes are manufactured by similar steps to the TFT 501 and the TFT 502, and a gate and one of a drain and a source thereof are connected to each other to operate as a diode. FIG. 14 shows an equivalent circuit diagram of a top plan view shown in FIG. 15.

The protective diode 561 includes a gate electrode layer, a semiconductor layer, and a wiring layer. The protective diode 562 also has a similar structure. A common potential line 554 and a common potential line 555 which are connected to these protective diodes are formed of the same layer as the gate electrode layer. Accordingly, a contact hole is required to be formed in an insulating layer so as to be electrically connected to the wiring layer.

A contact hole in the insulating layer may be formed with a mask layer to perform an etching process. In this case, when adopting an etching process of atmospheric pressure discharge, local electric discharge process is possible, and a mask layer is not required to be formed over the entire surface of the substrate.

A signal wiring layer is formed of the same layer as the source and drain wiring layer 505 in the TFT 501 and has a structure that the signal wiring layer connected thereto and the souse or drain side are connected to each other.

An input terminal portion on the scan signal line side also has a similar structure. A protective diode 563 includes a gate electrode layer, a semiconductor layer, and a wiring layer. A protective diode 564 also has a similar structure. A common potential line 556 and a common potential line 557 which are connected to these protective diodes are formed of the same layer as the source and drain wiring layer. The protective diodes provided in an input stage can be formed at the same time. Note that although the position in which the protective diode is inserted is not limited to this embodiment mode, it can be provided between a driver circuit and a pixel.

Embodiment Mode 6

With a display device formed in accordance with the invention, a television device can be completed. A display panel may be in any one of modes such as a case where only a pixel portion is formed as a structure shown in FIG. 16(A) and a scan line side driver circuit and a signal hue side driver circuit are mourned by a TAB method as shown in FIG. 17(B) or a case mounted by a COG method as shown in FIG. 17(A), a case where TFT is formed with SAS as shown in FIG. 16(B), a pixel portion and a scan line side driver circuit are integrally formed over the substrate and a signal line side driver circuit is mounted as a driver IC separately, a case where a pixel portion, a signal line side driver circuit, and a scan line side driver circuit are integrally formed over the substrate as shown in FIG. 16(C), and the like.

Other external circuit configurations include, a video signal amplifier circuit for amplifying a video signal among signals received by a tuner, a video signal processing circuit for converting the outputted signal therefrom into a color signal corresponding to each color of red, green and blue, a control circuit for converting the video signal into input specification of a driver IC, and the like. The control circuit outputs signals to each of the scan line side and the signal line side. In the case of digital driving, a configuration in which a signal divider circuit is provided on the signal line side and an input digital signal is divided into m signals to be supplied may be used as well.

An audio signal among signals received by the tuner is transmitted to an audio signal amplifier circuit, and an output thereof is supplied to a speaker through an audio signal processing circuit. A control circuit receives data on receiving station (received frequency) and volume control from an input portion, and transmits the signals to the tuner or the audio signal processing circuit.

By incorporating a display module into a housing, a television device as shown in FIGS. 20(A) and (B) can be completed. A display panel to which an FPC is attached as shown in FIG. 1 is also generally referred to as an EL display module. Accordingly, when using the EL display module as shown in FIG. 1, an EL television device can be completed. A main display 2003 is formed by a display module and a speaker portion 2009, an operating switch and the like are provided as other accessory equipment. In this manner, a television device can be completed in accordance with the invention.

Further, a retardation plate or a polarizing plate may be used to block the reflection light of external incident light. Moreover, in the case of a display device of the top emission type, an insulating layer to be a partition may be colored to be used as a black matrix. This partition can be formed by the droplet discharge method and the like, and a black pigment resin, mixture of a carbon black or the like with a resin material such as polyimide, or stacked layers thereof may be as well. The partition may be formed by discharging different materials onto the same region a plurality of times by the droplet discharge method. As the retardation plat; a retardation plate, a λ/4 plate and a λ/2 plate may be used to design for controlling light. As the structure, TFT element substrate, a light emitting element, a sealing substrate (sealing member), the retardation plate, the retardation plate (the λ/4 plate and the λ/2 plate), and a polarizing plate are sequentially stacked. Light emitted from the light emitting element is emitted outside from the polarizing plate side through them. The retardation plate and the polarizing plate may be provided on a side through which light is emitted. In the case of a dual emission type display device which emits light to both sides, the retardation plate and the polarizing plate can be provided on both sides. In addition, an anti-reflection film may be provided on the outer side of the polarizing plate. Therefore, high resolution and fine image can be displayed.

As shown in FIG. 20(A), a display panel 2002 using a display element is incorporated in a housing 2001 and a receiver 2005 is connected to a communication network by wired or wireless connections through a modem 2004 in addition to receive general TV broadcast so that one-way (from a sender to a receiver) or two-way (between a sender and a receiver or between receivers) data communication can be carried out. The operation of the television device can be performed with a switch incorporated in the housing or a separate remote control operation unit 2006, and this remote control device may also be provided with a display portion 2007 for displaying output data.

Further, a sub screen 2008 may also be formed by a second display panel to add a structure which displays channels, volume, and the like in addition to the main screen 2003 in the television device. In this structure, the main screen 2003 may be formed by an EL display panel having an excellent viewing angle and the sub screen may be formed by a liquid crystal display panel capable of displaying at lower power consumption. Alternatively, in order to give priority to the reduction in power consumption, the main screen 2003 may be formed by a liquid crystal display panel and the sub screen may be formed by an EL display panel so that the sub screen may be a structure capable on and off. According to the invention, a display device with high reliability can be formed even when such a large size substrate is used and a large number of TFTs or electronic components are used.

FIG. 20(B) is a television device having a large display portion, for example, with a size of 20 to 80 inches. The television device includes a housing 2010, a keyboard portion 2012 which is an operation portion, a display portion 2011, a speaker portion 2013 and the like. The invention is applied to the manufacture of the display portion 2011. A flexible substance is used for the display portion of FIG. 20(B), thereby the television device has a curved display portion. The shape of the display portion can be designed freely in this manner, therefore, a television device with a desired shape can be manufactured.

By the invention, the display device can be formed by a simple step, thereby cost can be reduced as well. Therefore, a television device using the invention can be formed at low cost even with a large display portion. Accordingly, a television device with high performance and high reliability can be manufactured with high yield.

It is needless to say that the invention is not limited to the television device and can be applied to various applications as a large area display medium such as a monitor of a personal computer, an information display board at a train station, airport and the like, an advertisement display board on the streets.

Embodiment Mode 7

This embodiment mode of the invention is described with reference to FIGS. 25, 26, 33 and 34. This embodiment mode shows an example of an active matrix type display device using the invention which has a different pixel arrangement and different position of spacers. Therefore, repetitive description on the same portion or a portion having a similar function is omitted.

FIG. 25 is a top plan view of a pixel region of stripe alignment in which pixels are arranged in stripes. A spacer 782 is formed over a first electrode layer 780 which is a pixel electrode layer and a spacer 781 is formed over an insulator (insulating layer) 783 which functions as a partition covering an end portion of the first electrode layer 780. The spacer 781 is formed over the intersection of a gate line and a source line with the insulator 783 interposed therebetween. A mask is supported by the spacer 781 and the spacer 782 when forming an electroluminescent layer, thereby damage of the first electrode layer is not caused by the mask. A display defect due to a shape defect in the first electrode layer and the like are not generated, thereby a display device with high image quality and high reliability can be manufactured.

Although an inorganic insulating material or an organic insulating material can be used for the spacers, in this embodiment mode, polyimide is used for the spacer 781 and the spacer 782, and the spacer 781 has a height of 1 to 1.5 μm (in this embodiment mode, 1.5 μm), which has a tapered bell shape of which a diameter is gradually increased toward the bottom surface from the top surface with a diameter of 10 to 15 μm (in this embodiment mode, 15 μm) on the top plan view. The spacer 781 is provided in a position between the power source line and the source line and close to the pixel electrode layer, thereby a mask for forming an electroluminescent layer can be supported fairly stable. Therefore, the pixel electrode layer can be protected from a contact with the mask.

FIG. 33 is a top plan view of a pixel region of stripe alignment in which a pixel is arranged in stripe. A spacer 582 is formed over a first electrode layer 580 which is a pixel electrode layer and a spacer 581 is formed over an insulator (insulating layer) 583 which functions as a partition covering an end portion of the first electrode layer 580. A mask when forming an electroluminescent layer is supported by the spacer 581 and the spacer 582, thereby damage of the first electrode layer is not caused by the mask.

Although an inorganic insulating material or an organic insulating material can be used for the spacers, in this embodiment mode, acrylic is used for the spacer 581 and the spacer 582, and the spacer 581 has a height of 1 to 1.5 μm (in this embodiment mode, 1.5 μm), which has a tapered bell shape of which a diameter is gradually increased toward the bottom surface from the top surface with a diameter of 5 μm on the top plan view. The spacer 781 is provided in a position between the power source line and the source line and close to the pixel electrode layer, thereby a mask for forming an electroluminescent layer can be supported fairly stable. Therefore, the pixel electrode layer can be protected from a contact with the mask. A display defect due to a shape defect in the first electrode layer and the like are not generated, thereby a display device with high image quality and high reliability can be manufactured.

Shown are examples in which the spacers over the insulator covering the periphery of the pixel electrode layer is provided along the gate line corresponding to the intersection of the gate line and the source line in FIG. 25 and the spacer thereof is provided along the source line in FIG. 33. However, description is made on an example of a display device having two kinds of spacers of a spacer 591a provided along a gate line and a spacer 591b provided along a source line as shown in FIG. 34.

FIG. 34(A) is also a top plan view of a pixel region of stripe alignment in which pixels are arranged in stripes similarly to FIGS. 25 and 33. A spacer 592 is formed over a first electrode layer 590 which is a pixel electrode layer, and the spacer 591a and the spacer 591b are formed over an insulator (insulating layer) 593 which functions as a partition covering an end portion of the first electrode layer 590. The spacer 591a is formed over the intersection of the gate line and the source line along the gate line with the insulator 593 interposed therebetween. Further, the spacer 591a is formed along the source line with the insulator 593 interposed therebetween.

FIG. 34(B) shows a cross sectional diagram along line C-D of FIG. 34(A). A gate line 597 is formed over a substrate 595 and a gate insulating layer 596 is formed. The spacer 591a and the spacer 591b are provided over the insulator 593 which functions as a partition. In this embodiment mode, each film thickness (height) of the spacer 591a, the spacer 591b, and the insulator 593 is 1.5 μm and total height of the insulator 593 and the spacer 591a or the spacer 591b is 3 μm. A bottom surface of the spacer 591a has a diameter of 10 to 15 μm (in this embodiment mode, 15 μm) and a bottom surface of the spacer 591b has a diameter of 5 μm. Each shape of both the spacer 591a and the spacer 591b has a tapered shape of which the diameter is gradually increased along a thickness direction from the top surface to the bottom surface. The spacer can be stable with an appropriate tapered shape, therefore, a vapor deposition mask can also be supported stably. Further, as shown in FIG. 34(B), the spacer 591b has a round shape and a smooth shape having curvatures. The spacer 591b is provided in a position between the power source line and the source line and close to the pixel electrode layer, thereby a mask tor forming an electroluminescent layer can be supported fairly stable.

In this manner, by providing two or more kinds of spacers with different size and shapes are provided, a mask for forming an electroluminescent layer can be supported fairly stable. A mask is supported by the spacer 592, the spacer 591a, and the spacer 591b for forming an electroluminescent layer, thereby damage of the first electrode layer is not caused by the mask. A display defect due to a shape defect in the first electrode layer and the like are not generated, thereby a display device with high image quality and high reliability can be manufactured.

FIG. 26 is a top plan view of a pixel region with a delta arrangement in which pixels are shifted by a half pitch per one line. A spacer 792 is formed over a first electrode layer 790 which is a pixel electrode layer, and a spacer 791 is formed over an insulator (insulating layer) 793 which functions as a partition covering an end portion of the first electrode layer 790. Although the spacer 782 over the first electrode layer 780 in FIG. 25 is formed without contacting with the insulator 783, the spacer 792 over the first electrode layer 790 in FIG. 26 is formed in contact with the insulator. In this manner, a spacer shape can be freely set. A mask is supported by the spacer 791 and the spacer 792 when forming an electroluminescent layer, thereby damage of the first electrode layer is not caused by the mask. A display defect due to a shape defect in the first electrode layer and the like are not generated, thereby a display device with high image quality and high reliability can be manufactured.

Embodiment Mode 8

This embodiment mode of the invention is described with reference to FIG. 27. This embodiment mode shows an example of a passive matrix type display device using the invention. Therefore, repetitive description on the same portion or a portion having a similar function is omitted.

FIG. 27(A) is a top plan view of a passive type display device and FIG. 27(B) is a cross sectional diagram along line A-B of FIG. 27(A). A first electrode layer 751 is formed over a substrate 750, and a spacer 752 and an insulator (insulating layer) 753 which functions as a partition are formed over the first electrode layer. A spacer 754 is formed over the insulator 753 and an electroluminescent layer 755 and a second electrode layer 756 are formed over the first electrode layer 751 to form a light emitting element. A mask is supported by the spacer 752 and the spacer 754 when the electroluminescent layer 755 is vapor-deposited. Therefore, damage of the first electrode layer is not caused by the mask. A display defect due to a shape defect in the first electrode layer and the like are not generated, thereby a passive type display device with high image quality and high reliability can be manufactured.

Embodiment Mode 9

This embodiment mode of the invention is described with reference to FIGS. 24 and 35. This embodiment mode shows an example in which a channel etched inverted stagger type thin film transistor is used for a thin film transistor and a first interlayer insulating layer and a second interlayer insulating layer are not formed in the display device manufactured in Embodiment Mode 1. Therefore, repetitive description on the same portion or a portion having a similar function is omitted.

In a display device shown in FIG. 24, an inverted stagger type thin film transistor 701 and an inverted stagger type thin film transistor 702 are provided in a peripheral driver circuit region 255; an inverted stagger type thin film transistor 703, a first conductive layer 704, a spacer 705a, a spacer 705b, a insulator (insulating layer) 709, an electroluminescent layer 707, a spacer 706, a second electrode layer 708, a filling material 711, and a sealing substrate 710 are provided in a pixel region 256; a sealing material 712 is provided in a sealing region, a terminal electrode layer 713, an anisotropic conductive layer 714, an FPC 715, a polarizing plate 717, and a protective film 716 to be a passivation film are provided, which are provided over a substrate 700.

Each of a gate electrode layer, a source electrode layer and a drain electrode layer of the inverted stagger type thin film transistor 701, the inverted stagger type thin film transistor 702, and the inverted stagger type thin film transistor 703 manufactured in this embodiment mode are formed by a droplet discharge method. The droplet discharge method is a method in which a composition having a liquid conductive material is discharged and solidified by drying and baking to form a conductive layer and an electrode layer. When a composition including an insulating material is discharged and solidified by drying and baking, an insulating layer can also be formed. A component of a display device such as a conductive layer and an insulating layer can be selectively formed so that steps are simplified and a material loss can be prevented. Therefore, a display device can be manufactured at low cost with high productivity.

A droplet discharge means used for the droplet discharge method is a generic name of a means for discharging droplets such as a nozzle having a discharge orifice of composition, or a head provided with one or a plurality of nozzles. A diameter of a nozzle of a droplet discharge means is set to 0.02 to 100 μm (preferably 30 μm or smaller) and a discharged amount of composition discharged from the nozzle is set to 0.001 to 100 pl (preferably 0.1 to 40 pl, and more preferably 10 pl or, less). The discharged amount increases in proportion to the diameter of the nozzle. Further, a distance between a processing object and the discharge orifice of the nozzle is preferably as close as possible for discharging onto a desired position and preferably set to about 0.1 to 3 mm (preferably 1 mm or less).

As the composition discharged from the discharge orifice, a composition in which a conductive material is dissolved or dispersed in a solvent is used. The conductive material corresponds to fine particles or dispersive nanoparticles of metal such as Ag, Au, Cu, Ni, Pt, Pd, Ir, Rh, W, and Al, metal sulfide of Cd and Zn, oxide of Fe, Ti, Si, Ge, Si, Zr, Be, and the like, and silver halide. Moreover, the conductive material corresponds to indium tin oxide (ITO), ITSO composed of indium tin oxide and silicon oxide, organic indium, organotin, zinc oxide, titanium nitride, or the like which is used as a transparent conductive film. However, as the composition discharged from the discharge orifice, a composition in which any one of gold, silver, and copper is dissolved or dispersed in a solvent is preferably used in consideration of a specific resistance value, and more preferably, silver and copper having low resistance may be used. However, in case of using silver or copper, a barrier film is also preferably provided as a measure against an impurity. As a barrier film, a silicon nitride film or nickel boron (NiB) can be used.

In addition, a particle in which the periphery of a conductive material is coated with other conductive materials in a plurality of layers may be used as well. For example, a three-layer structure particle may be used in which the periphery of copper is coated with nickel boron (NiB), and then the periphery thereof is coated with silver and the like. As for solvents, esters such as butyl acetate and ethyl acetate, alcohols such as isopropyl alcohol and ethyl alcohol, organic solvents such as methyl ethyl ketone and acetone, and water, or the like are used. The viscosity of the composition is preferably 20 mPa·s (cp) or less. This is because the composition is prevented from drying or the composition can be smoothly discharged from the discharge orifice. Moreover, the surface tension of the composition is preferably 40 mN/m or less. However, the viscosity of the composition and the like may be appropriately adjusted in accordance with a solvent to be used and applications. As one example, the viscosity of a composition in which ITO, organic indium, or organotin is dissolved or dispersed in a solvent may be set to 5 to 20 mPa·s, the viscosity of a composition in which silver is dissolved or dispersed in a solvent may be set to 5 to 20 mPa·s, and the viscosity of a composition in which gold is dissolved or dispersed in a solvent may be set to 5 to 20 mPa·s.

Further, a plurality of conductive materials may be stacked as the conductive layer. In addition, after forming a conductive layer by a droplet discharge method using silver as a conductive material, it may be plated with copper or the like. Plating may be performed by electroplating or a chemical (electroless) plating method. Plating may be performed by soaking a substrate surface into a container filled with a solution having a plating material. A solution having a plating material may be applied to flow over the substrate surface with the substrate placed obliquely (or vertically). When the plating is performed by applying a solution with the substrate stand, there is an advantage of downsizing a step apparatus.

The diameter of a conductive particle is preferably as small as possible for preventing clogged nozzles and manufacturing a high-definition pattern although it depends on the diameter of each nozzle, a desired shape of a pattern, and the like. Preferably, the diameter of the particle is preferably 0.1 μm or smaller. The composition is formed by a known method such as an electrolytic method, an atomizing method, a wet reducing method, and the particle size thereof is generally about 0.01 to 10 μm. However, when formed by a gas evaporation method, a nanomolecule protected with a dispersant is as minute as about 7 nm. Moreover, when each surface of particles is covered using a coating agent, the nanoparticle does not cohere in the solvent and is stably dispersed in the solvent at a room temperature to show almost the same behavior as that of liquid. Accordingly, a coating agent is preferably used.

Moreover, the step of discharging the composition may be performed under low pressure. The step of discharging the composition is preferably performed under low pressure since an oxide film and the like are not formed on the surfaces of the conductive layers. After discharging the composition, one or both of a drying step and a baking step is/are performed. Both of the drying stop and the baking step are heat treatment stops. For example, the drying is performed at 100° C. for 3 minutes whereas the baking is performed at 200 to 350° C. for 15 to 60 minutes, and the purposes, temperatures, and time thereof vary. The drying step and the baking step are performed under normal pressure or under low pressure by laser light irradiation, rapid thermal annealing, an annealing furnace, and the like. Note that the timing of performing the heat treatment and the number of the heat treatment are not particularly limited. The substrate may be heated in advance so as to perform the drying and baking steps favorably. At this time, although the temperature depends on a material of the substrate and the like, it is generally set to be 100 to 800° C. (preferably, 200 to 350° C.). According to this step, a resin on the periphery is cured and shrunk so that the nanoparticles are in contact with one another and fusing and welding are accelerated as well as volatilizing the solvent in the composition or removing the dispersant chemically.

A gas laser or a solid state laser of a continuous wave oscillation or a pulsed oscillation may be used for laser light irradiation which is used in the drying or baking step. An excimer laser, a He—Cd laser, an Ar laser and the like are tel as the former gas laser, while lasers using crystals such as YAG, $YVO_4$ and $GdVO_4$ doped with Cr, Nd and the like are cited as the latter solid state laser. Note that it is preferable to use the continuous wave laser in relation to the rate of absorption of laser light. Alternatively, a so-called hybrid laser irradiation method combining a pulsed oscillation and a continuous wave oscillation may be used. Note that the heat treatment with laser light irradiation may be instantaneously performed for several microseconds to several ten seconds so as not to destroy the substrate 700 depending on a heat resistant property of the substrate 700. Rapid thermal annealing (RTA) is performed by instantaneously heating the substrate for several minutes to several microseconds while rapidly raising the temperature using an infrared lamp, a halogen lamp, and the like which emit ultraviolet light through infrared light under an inert gas atmosphere. This treatment is performed instantaneously, therefore, only a thin film of an outmost surface can be substantially heated so that underlying films are not affected. That is, a substrate having a low heat resistance property such as a plastic substrate is not affected either.

Further, after forming the conductive layer, the surface thereof may be pressed by pressure to be plagiarized for increasing the planarity. As the method for pressing, a roller-shaped object may scan the surface to reduce and level the depression/projection, or the surface may be pressed vertically with a flat plate. In pressing, a heating step may be performed. Moreover, the surface may be softened or welded using a solvent or the like and the depression/projection portion of the surface may be removed with an air knife. Alternatively, the depression/projection may be polished using a CMP method. In the case where a depression/projection occurs due to the droplet discharge method, this step can be applied to the case of planarizing the surface.

In this embodiment mode, an amorphous semiconductor is used as a semiconductor layer and a semiconductor layer having one conductive type may be formed, if necessary. In this embodiment mode, a semiconductor layer and an amorphous N-type semiconductor layer as a semiconductor layer with a semiconductor layer having one conductive type are stacked. Further, by forming an N-type semiconductor layer an NMOS structure of an N-channel TFT, PMO S structure of a P-channel TFT in which a P-type semiconductor layer is formed, and a CMOS structure of an N-channel TFT and a P-channel TFT can be manufactured. In this embodiment mode, the inverted stagger type thin film transistor 701 and the inverted stagger type thin film transistor 703 are formed with N-channel TFFs, and the inverted stagger type thin film transistor 702 is formed with a P-channel TFT, thereby the inverted stagger type thin film transistor 701 and the inverted stagger type thin film transistor 702 form a CMOS structure in the peripheral driver circuit region 255.

Moreover, by adding an element imparting conductivity by doping and by forming an impurity region in the semiconductor layer to impart conductivity, an N-channel TFT and a P-channel TFT can also be formed. Instead of forming an N-type semiconductor layer, conductivity may be imparted to the semiconductor layer by performing plasma treatment with $PH_3$ gas.

Further, a semiconductor layer may be formed using an organic semiconductor material as a semiconductor by a printing method, a spray method, a spin coating method, a droplet discharge method, air the like. In this case, the aforementioned etching step is not required, therefore, the number of steps can be reduced. As an organic semiconductor, a low molecular weight material, a high molecular weight material, and the like can be used, and a material such as an organic pigment and a conductive high molecular weight material can be used as well. As the organic semiconductor material used in the invention, a high molecular weight material of π electron conjugated system of which a skeleton is composed of conjugated double bonds is preferable. Typically, a soluble high molecular weight material such as polythiophene, polyfluorene, poly(3-alkylthiophene), polythiophene derivative and pentacene can be used.

A mask for forming an electroluminescent layer is supported by the spacer 705*a*, the spacer 705*b*, and the spacer 706, thereby damage of the pixel electrode layer is not caused by the mask. Therefore, a display device with high image quality and high reliability can be manufactured.

A structure described in the aforementioned embodiment modes can be used for a structure of a light emitting element applicable to the invention. Further, a structure of a light emitting element in the following embodiment mode can also be used in combination with the aforementioned embodiment modes. A light emitting element has a plurality of layers interposed between a pair of electrodes, and at least one layer thereof is composed of a layer containing a light emitting substance (also referred to as an electroluminescent layer).

An example of a favorable light emitting element has a layer containing a light emitting substance and a mixed region which includes at least one layer among other layers containing an inorganic substance and an organic substance. This mixed layer can be a hole injecting/transporting layer or an electron injecting/transporting layer by selecting an inorganic substance or an organic substance.

An example of a combination of hole injecting/transporting layers is as follows. As an inorganic substance, there are molybdenum oxide ($MoO_x$), vanadium oxide ($VO_x$), ruthenium oxide ($RuO_x$), tungsten oxide ($WO_x$), and the like. Besides, indium tin oxide (ITO), zinc oxide (ZnO), or tin oxide (SnO) can be used. However, the invention is not limited to the substances described here and other substances may be used as well. As an organic substance, a compound having high hole transporting property can be used such as an aromatic amine (that is, the one having a benzene ring-nitrogen bond) compound, for example, 4,4'-bis[N-(1-naphthyl)-N-phenyl-amino]-biphenyl (abbreviated: α-NPD), 4,4'-bis[N-(3-methylphenyl)-N-phenyl-amino]-biphenyl (abbreviated: TPD), 4,4',4''-tris(N,N-diphenyl-amino)-triphenylamine (abbreviated: TDATA), 4,4',4''-tris[N-(3-methylphenyl)-N-phenyl-amino]-triphenylamine (abbreviated: MTDATA), and the like. However, other than the substances described here, and other substances may be used as well.

An example of a combination of electron injecting/transporting layers is as follows. As an inorganic substance, there are any one or more metals showing an electron donor property selected from lithium, cesium, magnesium, calcium, barium, erbium, and ytterbium. As an organic substance, a substance having a high electron transporting property is used such as a layer formed of a metal complex having a quinoline skeleton or a benzoquinoline skeleton such as tris(8-quinolinolato)aluminum (abbreviated: $Alq_3$), tris(5-methyl-8-quinolinolato)aluminum (abbreviated: $Almq_3$), bis(10-hydroxybenzo[h]-quinolinato)beryllium (abbreviated: $BeBq_2$), and bis(2-methyl-8-quinolinolato)-4-phenylphenolate-aluminum (abbreviated: BAlq). Besides, a metal complex containing oxazole-based or thiazole-based ligand such as bis[2-(2-hydroxyphenyl)benzoxazolato]zinc (abbreviated: $Zn(BOX)_2$) and bis[2-(2-hydroxyphenyl)-benzothiazolato]zinc (abbreviated: $Zn(BTZ)_2$) and the like can also be used. Furthermore, other than the metal complex, 2-(4-biphenylyl)-5-(4-tert-butylphenyl)-1,3,4-oxadiazole (abbreviated: PBD), 1,3-bis[5-(p-tert-butylphenyl)-1,3,4-oxadiazole-2-yl]benzene (abbreviated: OXD-7), 3-(4-tert-butylphenyl)-4-phenyl-5-(4-biphenylyl)-1,2,4-triazole (abbreviated: TAZ), 3-(4-tert-butylphenyl)-4(4-ethylphenyl)-5-(4-biphenylyl)-1,2,4-triazole (abbreviated: p-EtTAZ), bathophenanthroline (abbreviated: BPhen), bathocuproin (abbreviated: BCP), and the like can be used as well. However, other than the substances described in this embodiment mode, and the substances described in the aforementioned embodiment modes and other substances may be used as well.

A light emitting element is formed by appropriately combining a layer containing a light emitting substance and the aforementioned mixed layer. For example, such a structure can be employed that a hole injecting/transporting layer or an electron injecting/transporting layer is arranged on one side of the layer containing a light emitting substance. Further, such a structure can be employed that a hole injecting/transporting layer is arranged on one side while an electron injecting/transporting layer is arranged on the other side with the layer containing a light emitting substance interposed therebetween.

At least one of or both of electrodes between the pair of electrodes is/are formed of indium oxide, tin oxide, zinc oxide, or a transparent conductive substance in which at least a plurality of the aforementioned oxide are mixed. For example, there are a mixture of indium oxide and tin oxide (also referred to as ITO), a mixture of indium oxide, indium oxide and zinc oxide and the like. Further, a transparent conductive substance containing an appropriate amount of oxide such as silicon oxide, titanium oxide, molybdenum oxide for controlling crystallization of these oxides and maintaining the smoothness of the surface may be as well. Further, at least one electrode between the pair of electrodes may be formed of a metal substance containing as a main component aluminum, silver, titanium, tantalum, molybdenum, chromium, tungsten and the like.

The display device in FIG. 24 is a top emission type display device in which light is extracted from the sealing substrate 710 side, and the sealing substrate 710 has a polarizing plate 716 and a protective film 716 on the element substrate side. The polarizing plate 716 is covered with the sealing substrate 710 and the protective film 716 to be protected from contamination, damage and the like. Further, a retardation plate ($\lambda/4$ plate and $\lambda/2$ plate) or an anti-reflection film may be provided as well as the polarizing plate. When using the retardation plate and the polarizing plate, reflection light of external incident light can be blocked, thereby a higher resolution and finer image can be displayed.

FIG. 35 shows a dual emission type display device having a polarizing plate and a protective film. The display device in FIG. 35 corresponds to a dual emission type of the display device in FIG. 24, and the same reference numeral is used in common for the same portion or a portion having a similar function as that in a different drawing of FIG. 24 and the repetitive description thereof is omitted. In FIG. 35, a protective film is provided over a sealing substrate as a protective film 726 on the opposite side to an element substrate. Moreover, in the display device in FIG. 35, light is emitted from the sealing substrate 710 side and the element substrate 700 side as shown by arrows. Therefore, a polarizing plate 728 and a protective film 729 are provided on a side having an element of the element substrate 700 and the opposite side thereto. The protective film 726 and the protective film 729 protect the display device and the polarizing plate from contamination, damage, and the like to improve the reliability of the display device. Further, a retardation plate ($\lambda/4$ plate and $\lambda/2$ plate) or an anti-reflection film may be provided as well as the polarizing plate. When using the retardation plate and the polarizing plate, reflection light of external incident light can be blocked, thereby a higher resolution and finer image can be displayed.

The protective film 716 can be formed of a material selected from silicon oxide, silicon nitride, silicon oxynitride, silicon nitride oxide, aluminum nitride (AlN), aluminum oxynitride (AlON), aluminum nitride oxide (AlNO) in which nitrogen content is more than oxygen content, aluminum oxide, diamond-like carbon (DLC), a nitrogen-containing carbon film (CN) and other substances containing an inorganic insulating material. Further, a siloxane resin may be used as well. Moreover, an organic insulating material may be used as well, and as an organic material, polyimide, acrylic, polyamide, polyimide amide, resist, benzocyclobutene, or polysilazane can be used. A coated film with high planarity by a coating method may be used as well. Further, a conductive material may also be used in the case of a design by which a defect of electrical characteristics such as a short-circuit does not occur. In the display devices in FIGS. 24 and 35, aluminum nitride oxide ($AlN_XO_Y$) is used as the protective film 716, the protective film 726, and the protective film 729, and the proportion of O in the composition of $AlN_XO_Y$ is 0.1 to 30 atomic %. Since an $AlN_XO_Y$ film has a heat diffusion effect which diffuses heat, heat generated from a light emitting element can be diffused, and thereby the deterioration of the light emitting element and display device can be prevented to improve the reliability. As in FIG. 24, when the protective film 716 is provided on the light emitting element side, the protective film 716 is closer to the light emitting element, thereby the heat diffusion effect can be largely achieved.

In this embodiment mode, a liquid drying material is injected by dropping and solidified to be used as the filling material 711. Therefore, the substance has a moisture absorbing property, thereby a moisture absorbing effect can be obtained to prevent deterioration of the element. Further, as in this embodiment mode, when a projection portion is formed by the spacer 198 to obtain a structure in which the sealing substrate 195 is supported by the projection portion, a space between the element substrate and the sealing substrate can be controlled to be uniform. When the space is uniform, the space can be filled with the filling material 711 uniformly. Therefore, a display defect such that light emitted from a light emitting element is interfered and the like are not generated so that good and high image quality display can be performed.

Embodiment Mode 10

This embodiment mode is described with reference to FIG. 21. This embodiment mode shows an example of a module using a panel having the display device manufactured in Embodiment Modes 1 to 9.

In an information terminal module shown in FIG. 21(A), a controller 901, a central processing unit (CPU) 902, a memory 911, a power source circuit 903, an audio processing circuit 929, a transmission/reception circuit 904, and other elements such as a resistor, a buffer, and a capacitor are mounted onto a printed wiring board 946. Further, a panel 900 is connected to the printed wiring board 946 through a flexible wiring board (FPC) 908.

The panel 900 is provided with a pixel portion 905 in which a light emitting element is provided in each pixel, a first scan line driver circuit 906a and a second scan line driver circuit 906b which select the pixel included in the pixel portion 905, and a signal line driver circuit 907 which supplies a video signal to the selected pixel.

Various control signals are inputted and outputted through an interface (I/F) portion 909 provided over the printed wiring board 946. Further, an antenna port 910 for transmitting and receiving signals to an antenna is provided over the printed wiring board 946.

Note that the printed wiring hoard 946 is connected to the panel 900 through the FPC 908 in this embodiment mode, however, the invention is not necessarily limited to this structure. The controller 901, the audio praising circuit 929, the memory 911, the CPU 902 or the power source circuit 903 may be directly mounted onto the panel 900 using the COG (Chip on Glass) method. Further, various elements such as a capacitor and a buffer are provided over the printed wiring board 946, thereby it can be prevented that a noise occurs in the power source voltage and signals and the dull rise of the signal is prevented.

FIG. 21(B) shows a block diagram of the module shown in FIG. 21(A). This module 999 includes a VRAM 932, a DRAM 925, a flash memory 926 and the like as the memory 911. Image data displayed on the panel is stored in the VRAM 932, image data or audio data is stored in the DRAM 925, and various programs are stored in the flash memory.

The power source circuit 903 generates a power source voltage applied to the panel 900, the controller 901, the CPU 902, the audio processing circuit 929, the memory 911, and the transmission/reception circuit 931. Moreover, there is a case where a current source is provided in the power source circuit 903 depending on the specification of the panel.

The CPU 902 has a control signal generating circuit 920, a decoder 921, a register 922, an arithmetic circuit 923, a RAM 924, an interface 935 for the CPU and the like. Various signals inputted to the CPU 902 through the interface 935 are once held in the register 922 and then inputted to the arithmetic circuit 923, the decoder 921 and the like. In the arithmetic circuit 923, an arithmetic operation is performed based on the inputted signals to specify the address of various instructions. Meanwhile, the signals inputted to the decoder 921 are decoded and inputted to the control signal generating circuit 920. The control signal generating circuit 920 generates signals containing various instructions based on the inputted signals, and then transmits the signals to the address specified by the arithmetic circuit 923, specifically the memory 911, the transmission/reception circuit 931, the audio processing circuit 929, the controller 901 and the like.

Each of the memory 911, the transmission/reception circuit 931, the audio processing circuit 929, and the controller 901 operates in accordance with the received instruction. The operation thereof is briefly described as follows.

Signals inputted from an input means 934 are transmitted to the CPU 902 which is mounted onto the printed wiring board 946 through the interface 909. The control signal generating circuit 920 converts the image data stored in the VRAM 932 into a predetermined format in accordance with the signals transmitted from the input means 934 such as a pointing device and a keyboard, and transmits it to the controller 901.

The controller 901 conducts data processing on the signals containing image data transmitted from the CPU 902 in accordance with the specification of the panel, and supplies it to the panel 900. Further, the controller 901 generates an Hsync signal, a Vsync signal, a clock signal CLK, an alternating current voltage (AC Cont), and a switching signal L/R based on the power source voltage inputted from the power source voltage 903 and the various signals inputted from the CPU 902, and supplies them to the panel 900.

Signals transmitted and received as electromagnetic waves are processed by an antenna 933 in the transmission/reception circuit 904. Specifically, included is a high frequency circuit such as an isolator, a band pass filter, a VCO (Voltage Controlled Oscillator), an LPF (Low Pass Filter), a coupler, and a balun. Signals containing audio data among the signals transmitted and received by the transmission/reception circuit 904 are transmitted to the audio processing circuit 929 in accordance with the instruction of the CPU 902.

The signals containing audio data transmitted in accordance with the instruction of the CPU 902 are demodulated into audio signals by the audio processing circuit 929 to be transmitted to a speaker 928. Further, audio signals transmitted from a microphone 927 are modulated by the audio processing circuit 929 to be transmitted to the transmission/reception circuit 904 in accordance with the instruction of the CPU 902.

The controller 901, the CPU 902, the power source circuit 903, the audio processing circuit 929, and the memory 911 can be mounted as a package of this embodiment mode. This embodiment mode can be applied to any circuits but a high frequency circuit such as an isolator, a band pass filter, a VCO (Voltage Controlled Oscillator), an LPF (Low Pass Filter), a coupler, and a balun.

The display panel 900 is provided with a spacer over a pixel electrode or over an insulator covering the periphery of the pixel electrode. Accordingly, a module provided with this display panel 900 supports a mask used for forming an electroluminescent layer so that the mask does not contact the pixel electrode, therefore, damage of the pixel electrode can be prevented, thereby an effect of high image quality display and high reliability can be obtained.

Embodiment Mode 11

This embodiment mode is described with reference to FIGS. 21 and 22. FIG. 22 shows one mode of a portable compact phone device (portable phone) using wireless including the module manufactured in accordance with Embodiment Mode 10. The display panel 900 can be detachably incorporated in a housing 1001 and so that it can easily be integrated with the module 999. The shape and size of the housing 1001 can be appropriately changed in accordance with an incorporated electronic apparatus.

The housing 1001 to which the display panel 900 is fixed is fitted into the printed wiring board 946 to be completed as a module. A controller, a CPU, a memory, a power source circuit, and other elements such as a resistor, a buffer, and a capacitor are mounted onto the printed wiring board 946. Furthermore, an audio processing circuit including a microphone 995 and a speaker 995, and a signal processing circuit 993 such as a transmission/reception circuit are provided. The panel 900 is connected to the printed wiring board 946 through the FPC 908.

Such a module 999, an input means 998, and a battery 997 are put inside a housing 996. A pixel portion of the display panel 900 is arranged to be visible from an opening window formed in the housing 996.

The display panel 900 is provided with a spacer over a pixel electrode or over an insulator coveting the periphery of the pixel electrode. Accordingly, a module provided with this display panel 900 supports a mask used for forming an electroluminescent layer so that the mask does not contact the pixel electrode, therefore, damage of the pixel electrode can be prevented, thereby an effect of high image quality display and high reliability can be obtained.

The housing 996 shown in FIG. 22 shows an example of an external appearance of a phone device. However, an electronic apparatus in accordance with this embodiment mode may be changed into various modes in accordance with the function and application. An example of the modes is described in the following embodiment mode.

Embodiment Mode 12

By applying the invention, various display devices can be manufactured. That is, the invention can be applied to various electronic apparatuses in which these display devices are incorporated in a display portion thereof.

As examples of such electronic apparatuses, there are a camera such as a video camera and a digital camera, a projector, a head mounted display (a goggle type display), a car navigation, a car stereo, a personal computer, a game machine, a portable information terminal (a mobile computer, a portable phone, an electronic book or the like), an image reproducing device provided with a recording medium (specifically, a device which reproduces a recording medium such as a Digital Versatile Disc (DVD) and has a display which can display the image) and the like. Examples of these are shown in FIG. 23.

FIG. 23(A) is a computer including a main body 2101, a housing 2102, a display portion 2103, a keyboard 2104, an external connecting port 2105, a pointing mouse 2106 and the like. When using the invention, a computer which displays a high quality image with high reliability can be completed even when the computer is downsized and pixels become finer.

FIG. 23(B) is an image reproducing device provided with a recording medium (specifically a DVD reproducing device) including a main body 2201, a housing 2202, a display portion A 2203, a display portion B 2204, a recording medium (such as a DVD) reading portion 2205, an operating key 2206, a speaker portion 2207 and the like. The display portion A 2203 mainly displays image data while the display portion B 2204 mainly displays text data. When using the invention, an image reproducing device which displays a high quality image with high reliability can be completed even when the image reproducing device is downsized and pixels become finer.

FIG. 23(C) is a portable phone including a main body 2301, an audio output portion 2302, an audio input portion 2303, a display portion 2304, operating switches 2305, an antenna 2306 and the like. When using the invention, a portable phone which displays a high quality image with high reliability can be completed even when the portable phone is downsized and pixels become finer.

FIG. 23(D) is a video camera including a main body 2401, a display portion 2402, a housing 2403, an external connecting port 2404, a remote control receiving portion 2405, an image receiving portion 2406, a battery 2407, an audio input portion 2408, an eyepiece portion 2409, operating keys 2410 and the like. When using the invention, a video camera which displays a high quality image with high reliability can be completed even when the video camera is downsized and pixels become finer. This embodiment mode can be freely combined with the aforementioned embodiment modes.

What is claimed is:

1. A display device comprising:
   a wiring layer over a substrate;
   a transistor over the substrate;
   a first insulating film comprising a region covering the wiring layer and a region covering the transistor, the first insulating film comprising silicon;
   a second insulating film over the first insulating film, the second insulating film comprising silicon;
   a third insulating film over the second insulating film, the third insulating film comprising an organic material; and
   an electrode layer of a display element over the third insulating film,
   wherein the first insulating film and the second insulating film comprises a first opening,
   wherein the third insulating film comprises a second opening,
   wherein the electrode layer of the display element is electrically connected to the wiring layer through the second opening and the first opening,
   wherein a width of the first opening is larger than a width of the second opening in a cross sectional view of the display device,
   wherein the second opening and the first opening overlap each other in the cross sectional view of the display device, and
   wherein the third insulating film comprises a region in contact with a side surface of the first insulating film, a region in contact with a side surface of the second insulating film, and a region in contact with a top surface of the wiring layer in the cross sectional view of the display device.

2. The display device according to claim 1, wherein the second opening is provided inside the first opening.

3. The display device according to claim 1, wherein the substrate is a flexible substrate.

4. The display device according to claim 1, wherein the display element is an electroluminescence element.

5. An electronic apparatus comprising:
   a housing; and
   a display portion in the housing,
   wherein the display portion comprises the display device according to claim 1.

6. A display device comprising:
   a wiring layer over a substrate;
   a transistor over the substrate;
   a first insulating film comprising a region covering the wiring layer and a region covering the transistor, the first insulating film comprising silicon;
   a second insulating film over the first insulating film, the second insulating film comprising silicon;
   a third insulating film over the second insulating film, the third insulating film comprising an organic material; and
   an electrode layer of a display element over the third insulating film,
   wherein the first insulating film and the second insulating film comprises an opening,
   wherein the electrode layer of the display element is electrically connected to the wiring layer through the opening, and
   wherein the third insulating film comprises a region covering a step at an end of the second insulating film.

7. The display device according to claim 6, wherein the third insulating film comprises a region in contact with a top surface of the wiring layer.

8. The display device according to claim 6, wherein the substrate is a flexible substrate.

9. The display device according to claim 6, wherein the display element is an electroluminescence element.

10. An electronic apparatus comprising:
a housing; and
a display portion in the housing,
wherein the display portion comprises the display device according to claim 6.

11. A display device comprising:
a wiring layer over a substrate;
a transistor over the substrate;
a first insulating film comprising a region covering the wiring layer and a region covering the transistor, the first insulating film comprising silicon;
a second insulating film over the first insulating film, the second insulating film comprising silicon;
a third insulating film over the second insulating film, the third insulating film comprising an organic material; and
an electrode layer of a display element over the third insulating film,
wherein the first insulating film and the second insulating film comprises an opening,
wherein the electrode layer of the display element is electrically connected to the wiring layer through the opening,
wherein the electrode layer of the display element comprises a region overlapping with the third insulating film, and
wherein the third insulating film comprises a region covering a step at an end of the second insulating film.

12. The display device according to claim 11, wherein the third insulating film comprises a region in contact with a top surface of the wiring layer.

13. The display device according to claim 11, wherein the substrate is a flexible substrate.

14. The display device according to claim 11, wherein the display element is an electroluminescence element.

15. An electronic apparatus comprising:
a housing; and
a display portion in the housing,
wherein the display portion comprises the display device according to claim 11.

* * * * *